United States Patent
Takahashi et al.

(10) Patent No.: US 11,256,361 B2
(45) Date of Patent: Feb. 22, 2022

(54) DISPLAY DEVICE AND OPERATING METHOD THEREOF

(71) Applicant: Semiconductor Energy Laboratory Co., Ltd., Atsugi (JP)

(72) Inventors: Kei Takahashi, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/889,877

(22) Filed: Jun. 2, 2020

(65) Prior Publication Data

US 2021/0055847 A1 Feb. 25, 2021

Related U.S. Application Data

(63) Continuation of application No. 15/786,100, filed on Oct. 17, 2017, now Pat. No. 10,678,375.

(30) Foreign Application Priority Data

Oct. 21, 2016 (JP) .................. 2016-207318
Oct. 21, 2016 (JP) .................. 2016-207335
Oct. 27, 2016 (JP) .................. 2016-210464

(51) Int. Cl.
*G09G 3/32* (2016.01)
*G09G 3/36* (2006.01)
(Continued)

(52) U.S. Cl.
CPC ........ *G06F 3/04166* (2019.05); *G06F 3/0412* (2013.01); *G06F 3/0443* (2019.05);
(Continued)

(58) Field of Classification Search
CPC .......... G02F 1/13338; G02F 1/133553; G02F 1/133555; G02F 1/133603;
(Continued)

(56) References Cited

U.S. PATENT DOCUMENTS 5,717,420 A 2/1998 Matsuzaki et al.
6,067,645 A 5/2000 Yamamoto et al.
(Continued)

FOREIGN PATENT DOCUMENTS

CN 101273396 A 9/2008
CN 103907085 A 7/2014
(Continued)

OTHER PUBLICATIONS

International Search Report (Application No. PCT/IB2017/056338) dated Dec. 12, 2017.
(Continued)

*Primary Examiner* — Michael J Eunice
(74) *Attorney, Agent, or Firm* — Fish & Richardson P.C.

(57) ABSTRACT

A display device that achieves both high detection sensitivity of the touch sensor unit and smooth input on the touch sensor unit is provided. A method for driving a display device includes a first period and a second period. The display device includes pixels, a gate driver, and a touch sensor unit. The touch sensor unit detects a touch in the first period and stops detecting a touch in the second period. The
(Continued)

gate driver supplies signals to some of the pixels and does not supply signals to the other pixels in the second period.

13 Claims, 46 Drawing Sheets

(51) Int. Cl.
*G06F 3/041* (2006.01)
*G06F 3/044* (2006.01)
*G09G 3/3266* (2016.01)
*G09G 3/3225* (2016.01)
*G02F 1/1362* (2006.01)
*G02F 1/1333* (2006.01)
*H01L 27/32* (2006.01)
*H01L 27/12* (2006.01)
*H01L 29/786* (2006.01)
*G02F 1/1368* (2006.01)
*G02F 1/1343* (2006.01)
*G02F 1/1335* (2006.01)
*G09G 3/20* (2006.01)
*G09G 3/3291* (2016.01)

(52) U.S. Cl.
CPC .......... *G06F 3/0445* (2019.05); *G06F 3/0446* (2019.05); *G09G 3/3225* (2013.01); *G09G 3/3266* (2013.01); *G09G 3/3677* (2013.01); *G02F 1/1368* (2013.01); *G02F 1/13338* (2013.01); *G02F 1/13439* (2013.01); *G02F 1/133553* (2013.01); *G02F 1/133565* (2021.01); *G02F 1/136286* (2013.01); *G02F 2201/44* (2013.01); *G09G 3/204* (2013.01); *G09G 3/2029* (2013.01); *G09G 3/2033* (2013.01); *G09G 3/2037* (2013.01); *G09G 3/3291* (2013.01); *G09G 3/3688* (2013.01); *G09G 2300/046* (2013.01); *G09G 2300/0426* (2013.01); *G09G 2310/0286* (2013.01); *G09G 2310/04* (2013.01); *G09G 2330/023* (2013.01); *G09G 2330/12* (2013.01); *G09G 2360/18* (2013.01); *G09G 2380/14* (2013.01); *H01L 27/1225* (2013.01); *H01L 27/323* (2013.01); *H01L 27/3232* (2013.01); *H01L 27/3262* (2013.01); *H01L 29/7869* (2013.01)

(58) Field of Classification Search
CPC ........... G02F 1/133605; G02F 1/13439; G02F 1/136286; G02F 1/1368; G02F 2001/133565; G02F 2001/13756; G02F 2201/44; G02F 2203/09; G06F 3/041; G06F 3/0412; G06F 3/0416; G06F 3/0418; G06F 3/044; G09G 3/2022; G09G 3/2029; G09G 3/2033; G09G 3/2037; G09G 3/204; G09G 3/3208; G09G 3/3225; G09G 3/3266; G09G 3/3291; G09G 3/3677; G09G 3/3688; G09G 2300/0426; G09G 2300/0456; G09G 2300/046; G09G 2310/0286; G09G 2310/04; G09G 2310/12; G09G 2310/023; G09G 2360/18; G09G 2380/14; H01L 27/1225; H01L 27/323; H01L 27/3232; H01L 27/3262; H01L 29/7869

See application file for complete search history.

(56) References Cited

U.S. PATENT DOCUMENTS

| | | | |
|---|---|---|---|
| 8,866,783 B2 | 10/2014 | Saitoh et al. | |
| 9,007,336 B2 | 4/2015 | Shepelev et al. | |
| 9,041,685 B2 | 5/2015 | Lillie et al. | |
| 9,292,117 B2 | 3/2016 | Kim et al. | |
| 9,324,301 B2 | 4/2016 | Shepelev et al. | |
| 9,330,632 B2 | 5/2016 | Shepelev et al. | |
| 9,563,310 B2 | 2/2017 | Kim et al. | |
| 9,576,557 B2 | 2/2017 | Lillie et al. | |
| 9,576,558 B2 | 2/2017 | Shepelev et al. | |
| 9,799,277 B1 | 10/2017 | Derckx et al. | |
| 9,933,872 B2 | 4/2018 | Watanabe et al. | |
| 9,958,975 B2 | 5/2018 | Kim et al. | |
| 9,977,527 B2 | 5/2018 | Kim et al. | |
| 10,175,803 B2 | 1/2019 | Kim et al. | |
| 2003/0052869 A1 | 3/2003 | Fujii et al. | |
| 2003/0193457 A1 | 10/2003 | Wang et al. | |
| 2006/0038758 A1 | 2/2006 | Routley et al. | |
| 2007/0075935 A1 | 4/2007 | Mesmer et al. | |
| 2007/0242014 A1 | 10/2007 | Lee et al. | |
| 2008/0024472 A1 | 1/2008 | Nose et al. | |
| 2008/0068359 A1 | 3/2008 | Yoshida et al. | |
| 2008/0284719 A1 | 11/2008 | Yoshida | |
| 2008/0284768 A1 | 11/2008 | Yoshida et al. | |
| 2009/0009455 A1 | 1/2009 | Kimura | |
| 2010/0110623 A1 | 5/2010 | Koyama et al. | |
| 2011/0090183 A1 | 4/2011 | Yamazaki et al. | |
| 2011/0090207 A1 | 4/2011 | Yamazaki et al. | |
| 2011/0128461 A1 | 6/2011 | Koyama et al. | |
| 2011/0254826 A1* | 10/2011 | Umezaki | G09G 3/344 345/212 |
| 2012/0056662 A1 | 3/2012 | Wilson et al. | |
| 2012/0056822 A1 | 3/2012 | Wilson et al. | |
| 2012/0162133 A1 | 6/2012 | Chen et al. | |
| 2012/0162134 A1 | 6/2012 | Chen et al. | |
| 2012/0182251 A1* | 7/2012 | Krah | G06F 3/04182 345/174 |
| 2012/0262384 A1 | 10/2012 | Kim et al. | |
| 2012/0268396 A1 | 10/2012 | Kim et al. | |
| 2013/0002729 A1 | 1/2013 | Lee et al. | |
| 2013/0057511 A1 | 3/2013 | Shepelev et al. | |
| 2013/0147724 A1 | 6/2013 | Hwang et al. | |
| 2013/0314361 A1 | 11/2013 | Saitoh et al. | |
| 2014/0118378 A1 | 5/2014 | Koyama et al. | |
| 2015/0097792 A1 | 4/2015 | Yoshida | |
| 2015/0109355 A1 | 4/2015 | Wang et al. | |
| 2015/0220194 A1 | 8/2015 | Lin et al. | |
| 2016/0291746 A1 | 10/2016 | Kim | |
| 2016/0320882 A1 | 11/2016 | Kim et al. | |
| 2017/0090630 A1 | 3/2017 | Kim et al. | |
| 2017/0102825 A1 | 4/2017 | Kim et al. | |
| 2017/0115779 A1 | 4/2017 | Shepelev et al. | |
| 2017/0115807 A1 | 4/2017 | Cho et al. | |
| 2017/0186365 A1 | 6/2017 | Yoneda | |
| 2017/0270882 A1 | 9/2017 | Mori et al. | |
| 2018/0031758 A1 | 2/2018 | Mizuno et al. | |
| 2018/0033391 A1 | 2/2018 | So et al. | |
| 2018/0046316 A1 | 2/2018 | Liu | |
| 2018/0081248 A1 | 3/2018 | Kitamura | |
| 2019/0279553 A1* | 9/2019 | Vahid Far | G09G 3/3225 |

FOREIGN PATENT DOCUMENTS

| | | |
|---|---|---|
| JP | 2009-510527 | 3/2009 |
| JP | 2010-135762 A | 6/2010 |
| JP | 2011-141522 A | 7/2011 |
| JP | 2011-141524 A | 7/2011 |
| JP | 2013-097469 A | 5/2013 |
| JP | 2014-529835 | 11/2014 |
| JP | 2016-110643 A | 6/2016 |
| KR | 2008-0039530 A | 5/2008 |
| KR | 2011-0093822 A | 8/2011 |
| KR | 2013-0132197 A | 12/2013 |
| KR | 2014-0069103 A | 6/2014 |
| TW | 201027754 | 7/2010 |

(56) References Cited

FOREIGN PATENT DOCUMENTS

| | | |
|---|---|---|
| WO | WO-2007/041150 | 4/2007 |
| WO | WO-2012/137800 | 10/2012 |
| WO | WO-2013/036672 | 3/2013 |
| WO | WO-2013/047456 | 4/2013 |
| WO | WO-2013/062099 | 5/2013 |

OTHER PUBLICATIONS

Written Opinion (Application No. PCT/IB2017/056338) dated Dec. 12, 2017.

\* cited by examiner

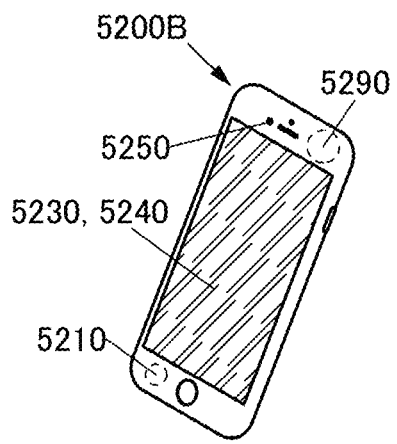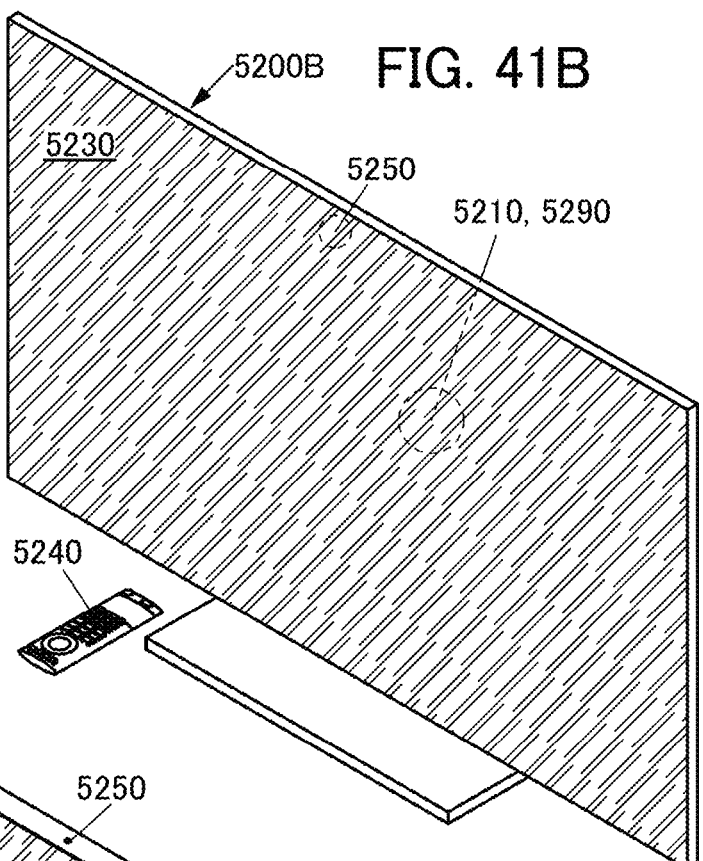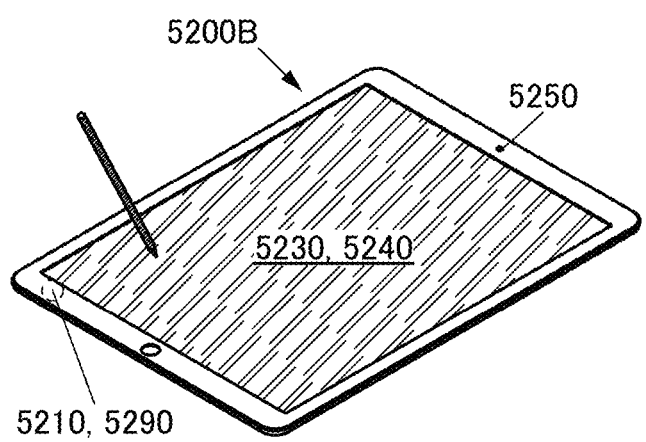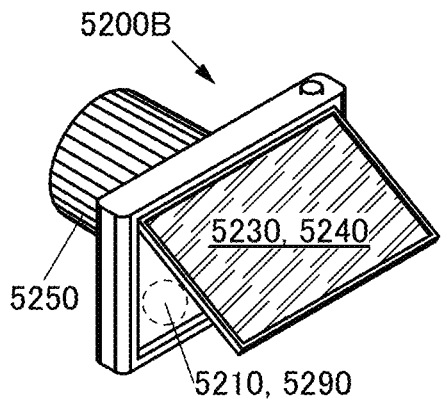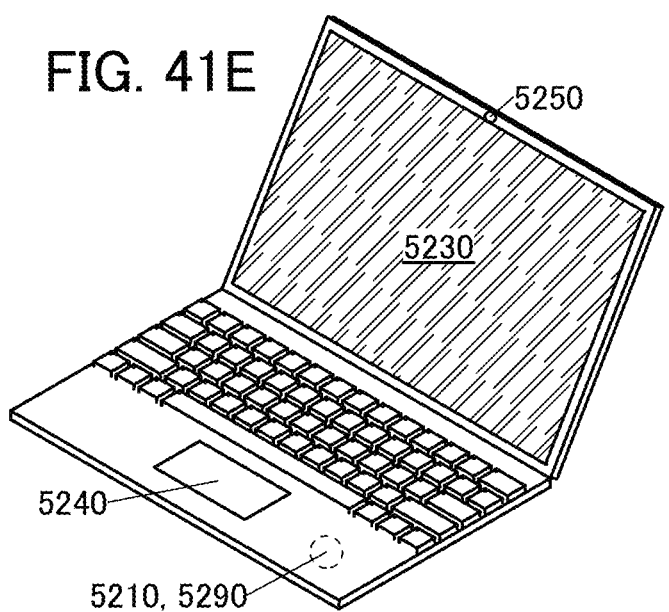

Black

White 1.3 cd/m²

White 10.5 cd/m²

White 28.2 cd/m²

White 56.3 cd/m²

White 92.4 cd/m²

Butterfly

Flower

Text

Text and Highlight 1

Text and Highlight 2

DISPLAY DEVICE AND OPERATING METHOD THEREOF

CROSS-REFERENCE TO RELATED APPLICATIONS

This application is a continuation of U.S. application Ser. No. 15/786,100, filed Oct. 17, 2017, now allowed, which claims the benefit of foreign priority applications filed in Japan as Serial No. 2016-207318 on Oct. 21, 2016, Serial No. 2016-207335 on Oct. 21, 2016, and Serial No. 2016-210464 on Oct. 27, 2016, all of which are incorporated by reference.

TECHNICAL FIELD

One embodiment of the present invention relates to a display device and a method for operating the display device. Furthermore, one embodiment of the present invention relates to a semiconductor device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter.

Specifically, examples of the technical field of one embodiment of the present invention disclosed in this specification and the like include a display device, a semiconductor device, an electronic device, a method for driving any of them, and a method for manufacturing any of them. In this specification and the like, a semiconductor device generally means a device that can function by utilizing semiconductor characteristics. For example, an integrated circuit, a chip including an integrated circuit, an electronic component including a packaged chip, and an electronic device including an integrated circuit are examples of a semiconductor device.

BACKGROUND ART

A display device in which a display unit and a touch sensor unit are combined is used. A detection region of the touch sensor unit overlaps with a display region of the display unit, so that the display device displays an image in the display region and can obtain information of the position in the display region indicated by a user. The user performs input with a finger, a stylus, or the like.

A transistor including an oxide semiconductor can be used for a pixel of the display unit. A transistor including an oxide semiconductor exhibits an extremely low off-state current; hence, the frequency of refresh operations when a still image is displayed by the display unit can be reduced. In this specification and the like, the technique for reducing the frequency of refresh operations is referred to as idling stop or IDS driving (Patent Document 1 and Patent Document 2). The IDS driving can reduce power consumption of the display unit.

Patent Document

[Patent Document 1] Japanese Published Patent Application No. 2011-141522
[Patent Document 2] Japanese Published Patent Application No. 2011-141524

DISCLOSURE OF INVENTION

Although the frequency of image rewriting by the display unit is generally about 60 times per second (in other words, the frame frequency is 60 Hz), detection operation by the touch sensor unit needs to be performed 80 times or more per second, preferably 100 times or more per second because smooth input such as handwriting input is required for the touch sensor unit.

In the case where the touch sensor unit performs detection operation at timing when the display unit rewrites an image, the detection sensitivity of the touch sensor unit deteriorates by the influence of noise. An object of one embodiment of the present invention is to provide a display device that achieves both the detection sensitivity of the touch sensor unit and smooth input on the touch sensor unit.

An object of one embodiment of the present invention is to provide a novel display device. Another object of one embodiment of the present invention is to provide a novel driving method that achieves both the detection sensitivity of the touch sensor unit and smooth input on the touch sensor unit. Another object of one embodiment of the present invention is to provide an electronic device using the novel display device.

Note that one embodiment of the present invention does not necessarily achieve all the objects listed above and only needs to achieve at least one of the objects. The description of the above objects does not preclude the existence of other objects. Other objects will be apparent from and can be derived from the description of the specification, the drawings, the claims, and the like.

One embodiment of the present invention is a method for driving a display device including pixels, a gate driver, and a touch sensor unit. The display device includes a first period and a second period. The touch sensor unit detects a touch in the first period and stops detecting a touch in the second period. The gate driver supplies signals to some of the pixels and does not supply signals to the other pixels in the second period.

In the above embodiment, the first period and the second period are in one frame.

In the above embodiment, the pixels each include a transistor including a metal oxide in a channel formation region.

One embodiment of the present invention is a method for driving a display device including pixels, a gate driver, and a touch sensor unit. The display device includes a first period and a second period. The touch sensor unit detects a touch in the first period and stops detecting a touch in the second period. The pixel includes a reflective element and a light-emitting element. The gate driver supplies signals to some of the pixels and does not supply signals to the other pixels in the second period.

In the above embodiment, the first period and the second period are in one frame.

In the above embodiment, the pixels each include a transistor including a metal oxide in a channel formation region.

One embodiment of the present invention is a display device including an application processor, a display unit, and a touch sensor unit. The application processor is configured to control the display unit and the touch sensor unit in a first period and a second period. The first period is a period in which the display unit rewrites an image and the second period is a period in which the touch sensor unit performs detection. The display unit includes a first mode in which an image in an entire display region is rewritten, a second mode in which an image in part of a display region is rewritten, and a third mode in which an image in an entire display region is not rewritten. The second period of the second mode and the third mode is longer than the second period of the first mode.

One embodiment of the present invention can provide a novel display device. Another embodiment of the present invention can provide a display device that achieves both the detection sensitivity of a touch sensor unit and smooth input on the touch sensor unit.

Another embodiment of the present invention can provide a novel driving method that achieves both the detection sensitivity of a touch sensor unit and smooth input on the touch sensor unit. Another embodiment of the present invention can provide an electronic device using the novel display device.

Note that the effects of one embodiment of the present invention are not limited to the effects listed above. The effects listed above do not preclude the existence of other effects. The other effects are the ones that are not described above and will be described below. The other effects will be apparent from and can be derived from the description of the specification, the drawings, and the like by those skilled in the art. One embodiment of the present invention has at least one of the effects listed above and the other effects. Accordingly, one embodiment of the present invention does not have the effects listed above in some cases.

BRIEF DESCRIPTION OF DRAWINGS

In the accompanying drawings:

FIGS. 41A to 41E each illustrate a structure of a data processing device;

BEST MODE FOR CARRYING OUT THE INVENTION

Figure 1:
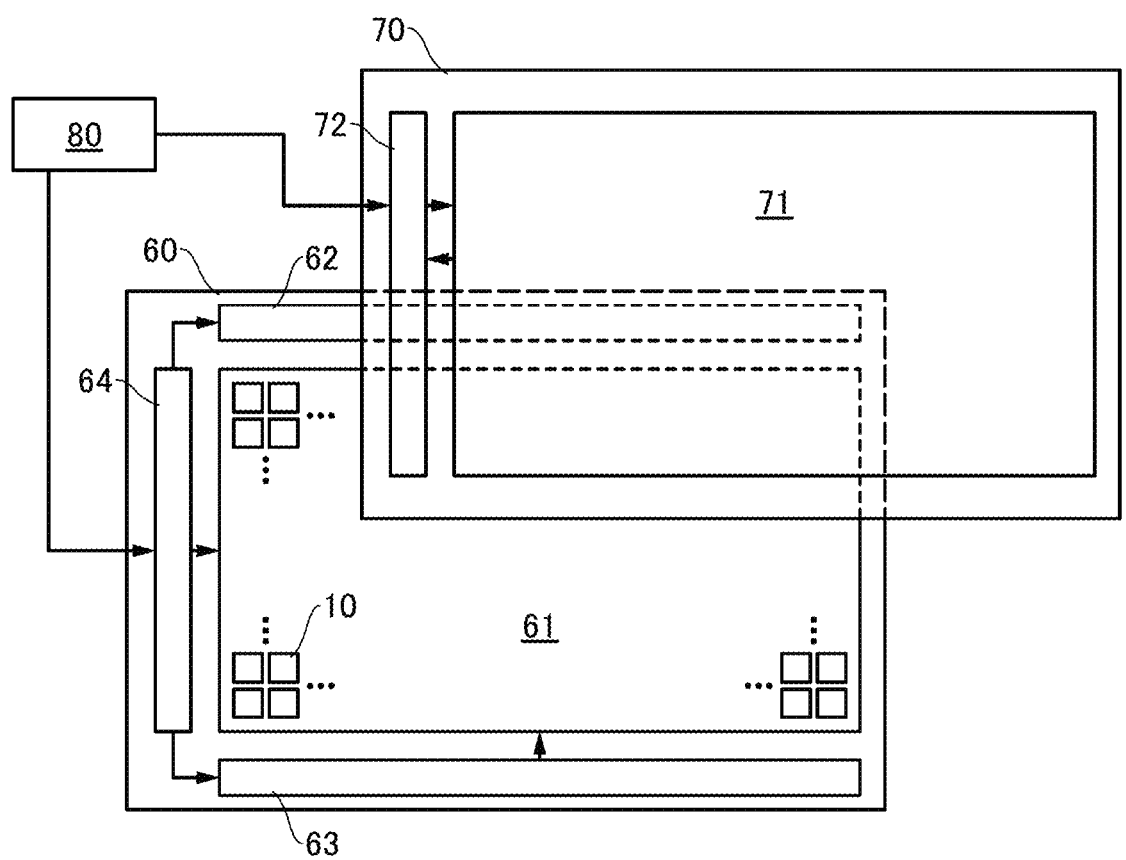
FIG. 1 is a block diagram illustrating a structure example of a display device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Any of the embodiments described below can be combined as appropriate.

A display device described in an embodiment is composed of a display unit, a touch sensor unit, and the like. Therefore, the display device is also referred to as a semiconductor device, an electronic device, or the like in some cases.

In the drawings and the like, the size, the layer thickness, the region, or the like is sometimes exaggerated for clarity, and thus is not limited to the illustrated scale. Note that drawings are schematic views of ideal examples, and the embodiments of the present invention are not limited to the shape, the value, or the like illustrated in the drawings.

In the drawings and the like, the same elements, elements having similar functions, elements formed of the same material, elements formed at the same time, and the like are sometimes denoted by the same reference numerals, and the description thereof is not repeated in some cases.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, the terms for describing arrangement such as "above" and "below" do not necessarily mean "directly above" and "directly below", respectively, in the description of a physical relationship between components. For example, the expression "a gate electrode over a gate insulating layer" can mean the case where there is an additional component between the gate insulating layer and the gate electrode.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, ordinal numbers such as "first", "second", and "third" are used in order to avoid confusion among components, and the terms do not limit the components numerically.

In this specification and the like, the term "electrically connected" includes the case where components are connected through an object having any electric function. There is no particular limitation on the "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "voltage" often refers to a difference between a given potential and a reference potential (e.g., a ground potential). Accordingly, voltage, potential, and potential difference can also be referred to as potential, voltage, and voltage difference, respectively.

In this specification and the like, a transistor is an element having at least three terminals: a gate, a drain, and a source. The transistor has a channel region between a drain (a drain terminal, a drain region, or a drain electrode) and a source (a source terminal, a source region, or a source electrode), and current can flow between the source and the drain through the channel region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Unless otherwise specified, off-state current in this specification and the like refers to drain current of a transistor in an off state (also referred to as a non-conducting state and a cutoff state). Unless otherwise specified, the off state of an n-channel transistor means that a gate voltage with respect to a source voltage ($V_{gs}$) is lower than the threshold voltage ($V_{th}$), and the off state of a p-channel transistor means that $V_{gs}$ is higher than $V_{th}$. That is, the off-state current of an n-channel transistor sometimes refers to a drain current that flows when the gate voltage with respect to the source voltage $V_{gs}$ is lower than the threshold voltage $V_{th}$.

In the above description of off-state current, a drain may be replaced with a source. That is, the off-state current sometimes refers to current that flows through a source of a transistor in the off state.

In this specification and the like, the term "leakage current" sometimes expresses the same meaning as "off-state current". In this specification and the like, the off-state current sometimes refers to a current that flows between a source and a drain when a transistor is in the off state.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is to say, a metal oxide that has at least one of an amplifying function, a rectifying function, and a switching function can be called a metal oxide semiconductor, or OS for short. An OS transistor or an OS FET refers to a transistor including a metal oxide or an oxide semiconductor.

Embodiment 1

In this embodiment, a display device including a display unit and a touch sensor unit is described. In particular, the relation between image rewriting operation by the display unit and detection operation by the touch sensor unit is described.

<<Display Device>>

FIG. 1 is a block diagram illustrating a structure example of a display device. A display device 50 includes a display unit 60, a touch sensor unit 70, and an application processor 80.

<Display Unit>

The display unit 60 includes a pixel array 61, a gate driver 62, a gate driver 63, and a source driver IC 64.

The pixel array 61 includes a plurality of pixels 10, and each pixel 10 is an active element driven by a transistor. The pixel array 61 has a function of forming a display region of the display unit 60 and displaying an image. A more specific structure example of the pixel array 61 is described later.

The gate driver 62 and the gate driver 63 have a function of driving a gate line for selecting the pixel 10. Only one of the gate driver 62 and the gate driver 63 may be provided. Although FIG. 1 illustrates an example in which the gate driver 62 and the gate driver 63 are provided together with the pixel array 61 over the same substrate, the gate driver 62 and the gate driver 63 can be dedicated ICs.

The source driver IC 64 has a function of driving a source line supplying a data signal to the pixel 10. Although the source driver IC 64 is mounted by a chip on glass (COG) method here, there is no particular limitation on the mounting method, and a chip on flexible (COF) method, a tape automated bonding (TAB) method, or the like may be employed. The same applies to a method for mounting the IC on the touch sensor unit 70 described later.

A transistor used for the pixel 10 is an OS transistor, which has a lower off-state current than a Si transistor.

The OS transistor preferably includes a metal oxide in a channel formation region. The metal oxide used for the OS transistor preferably contains at least one of indium (In) and zinc (Zn).

Typical examples of such oxide include In-M-Zn oxide, In-M oxide, Zn-M oxide, and In—Zn oxide (the element M is aluminum (Al), gallium (Ga), yttrium (Y), tin (Sn), boron (B), silicon (Si), titanium (Ti), iron (Fe), nickel (Ni), germanium (Ge), zirconium (Zr), molybdenum (Mo), lanthanum (La), cerium (Ce), neodymium (Nd), vanadium (V), beryllium (Be), hafnium (Hf), tantalum (Ta), or tungsten (W), for example).

The off-state current per channel width of 1 µm of an OS transistor can be low and approximately from 1 yA/µm (y: yocto, $10^{-24}$) to 1 zA/µm (z: zepto, $10^{-21}$).

It is preferable to use cloud-aligned composite (CAC) OS for the OS transistor. Note that the details of the CAC-OS will be described later in Embodiment 8.

The transistor used for the pixel 10 is not necessarily an OS transistor as long as its off-state current is low. For example, a transistor including a wide-bandgap semiconductor may be used. In some cases, the wide-bandgap semiconductor refers to a semiconductor with a bandgap of 2.2 eV or greater. Examples of the wide-bandgap semiconductor include silicon carbide, gallium nitride, and diamond.

By using the transistor having a low off-state current for the pixel 10, the gate driver 62, the gate driver 63, and the source driver IC 64 can be temporarily stopped (the temporary stop is referred to as idling stop or IDS driving, as described above) in the case where the display unit 60 does not necessarily rewrite an image, that is, a still image is displayed.

<Touch Sensor Unit>

The touch sensor unit 70 illustrated in FIG. 1 includes a sensor array 71 and a touch sensor IC 72.

The sensor array 71 forms a region where the touch sensor unit 70 can perform detection operation and a user of the display device 50 performs input on this region with a finger, a stylus, or the like. The sensor array 71 is provided in a region overlapping with the pixel array 61. The display device 50 displays an image in the display region of the display unit 60 and can obtain information of the position in the display region indicated by the user.

Figure 2:
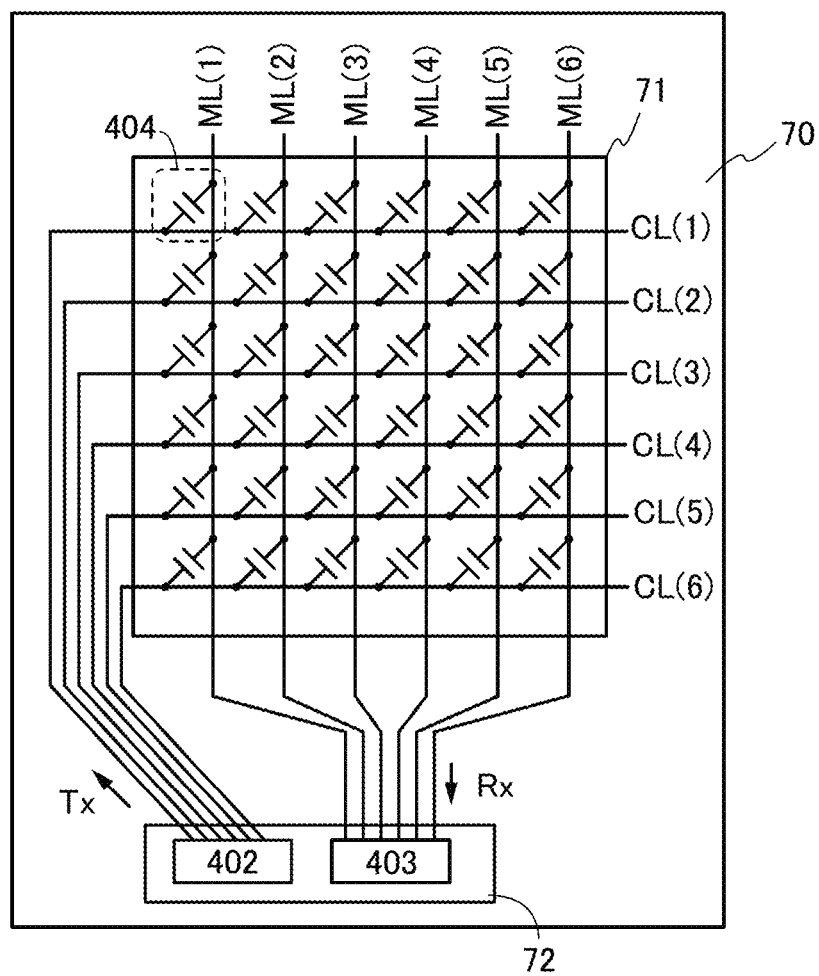
FIG. 2 is a block diagram illustrating a structure example of a touch sensor unit.

FIG. 2 is a block diagram illustrating a structure example of the touch sensor unit 70. Here, an example in which the touch sensor unit 70 is a projected capacitive (mutual capacitive) touch sensor unit.

The sensor array 71 includes wirings CL, wirings ML, and a plurality of capacitors 404. The capacitors 404 are formed by the wirings CL and ML overlapping with each other or the wirings CL and ML provided close to each other.

In FIG. 2, as an example, six wirings CL(1) to CL(6) represent the wirings CL, and six wirings ML(1) to ML(6) represent the wirings ML; however, the number of wirings is not limited to those. The wirings CL are each a wiring to which a pulse voltage is supplied and the wirings ML are each a wiring that detects changes in current.

When proximity or contact of an object (a finger, a stylus, or the like) to the sensor array 71 is detected, the capacitance value of the capacitor 404 is changed and the touch sensor unit 70 detects a touch.

The sensor array 71 is electrically connected to the touch sensor IC 72 through the wirings CL and ML. The touch sensor IC 72 includes a driver circuit 402 and a detection circuit 403.

The driver circuit 402 is electrically connected to the sensor array 71 through the wiring CL. The driver circuit 402 has a function of outputting a signal Tx. As the driver circuit 402, a shift register circuit and a buffer circuit can be used in combination, for example.

The detection circuit 403 is electrically connected to the sensor array 71 through the wiring ML. The detection circuit 403 detects a touch on the touch sensor unit 70 by detecting a signal Rx. The detection circuit 403 can include an amplifier circuit and an analog-digital converter circuit (ADC), for example. The detection circuit 403 has a function of converting an analog signal output from the sensor array 71 into a digital signal and outputting the digital signal to the application processor 80.

Note that a more specific structure example of the touch sensor unit 70 is described in Embodiment 2.

<Application Processor>

The application processor 80 is electrically connected to the source driver IC 64 and the touch sensor IC 72.

The application processor 80 has a function of supplying image data to be displayed on the display unit 60 to the source driver IC 64. The application processor 80 has a function of calculating a difference between image data displayed on the display unit 60 at present and image data displayed next.

The application processor 80 has a function of transmitting the data of the timing when the display unit 60 rewrites an image and the data of the timing when the touch sensor unit 70 performs detection operation. The data of the timing when the display unit 60 rewrites an image is transmitted from the application processor 80 to the source driver IC 64, and the source driver IC 64 has a function of controlling operation of the gate driver 62 and the gate driver 63. The data of the timing when the touch sensor unit 70 performs detection operation is transmitted from the application processor 80 to the touch sensor IC 72.

In the block diagram illustrated in FIG. 1, signals for driving the gate drivers 62 and 63 are not necessarily supplied through the source driver IC 64. A block diagram in that case is shown in FIG. 18.

Figure 18:
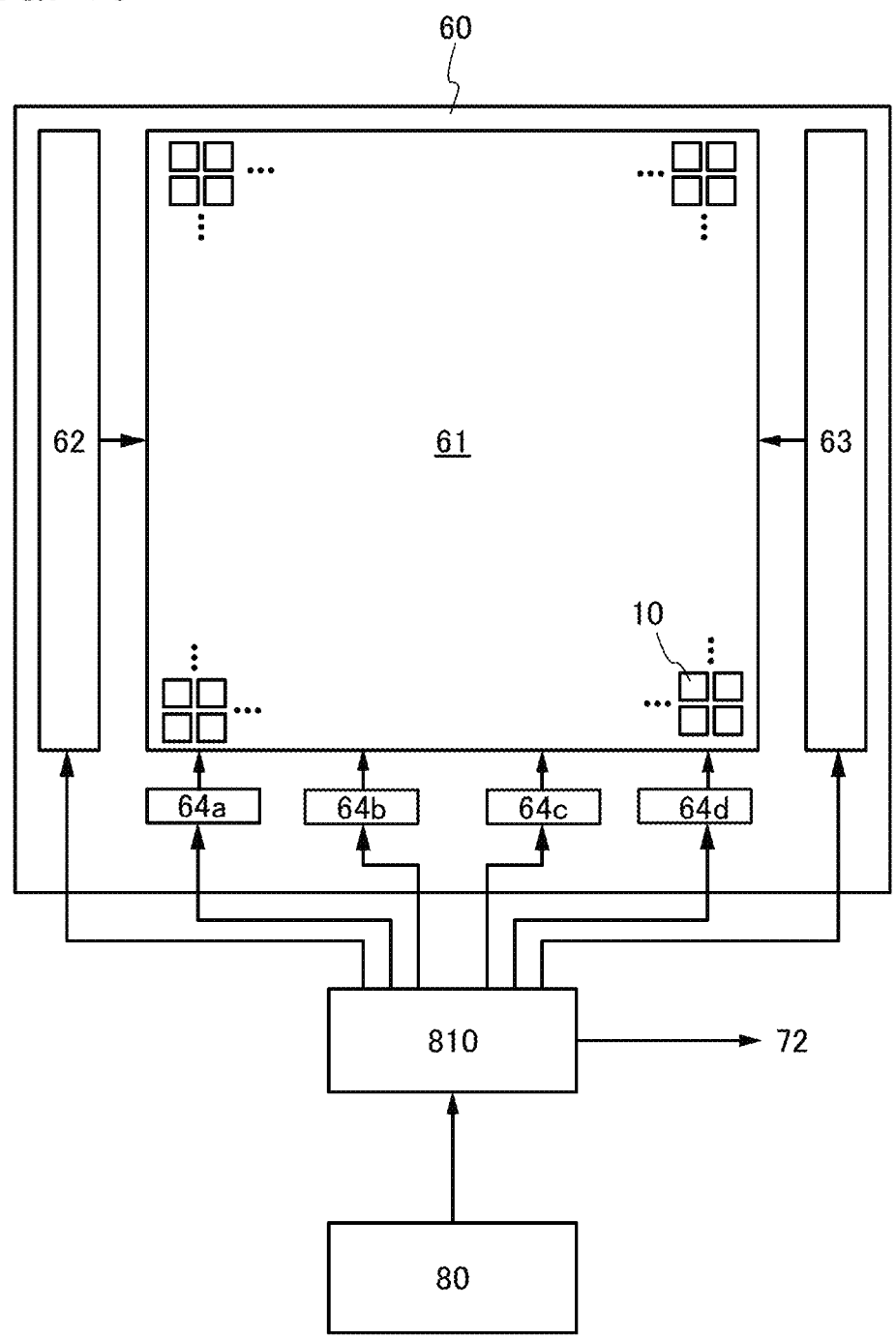
FIG. 18 is a block diagram illustrating a structure example of a display device.

In FIG. 18, the application processor 80 supplies signals to source driver ICs 64*a* to 64*d*, the gate driver 62, and the gate driver 63 through a timing controller 810. The timing controller 810 may be included in the application processor 80.

The structure illustrated in FIG. 18 includes a plurality of source driver ICs. The number of source driver ICs may be set according to the number of pixels of the pixel array 61.

In the structure illustrated in FIG. 18, the number of pixels of the pixel array 61 is preferably larger, for example, 4K (3840×2160) or 8K (7680×4320). A plurality of source driver ICs are provided and a circuit provided outside the source driver ICs has a function of controlling a gate driver, so that the number of terminals of the source driver ICs can be reduced. In the case where the number of the terminals of the source driver ICs is large, a large amount of force is applied to the source driver ICs when the source driver ICs are crimped to a substrate, which leads to damage to the source driver ICs. Accordingly, the structure illustrated in FIG. 18 can prevent the source driver ICs from being damaged.

<Pixel Array>

Figure 3:
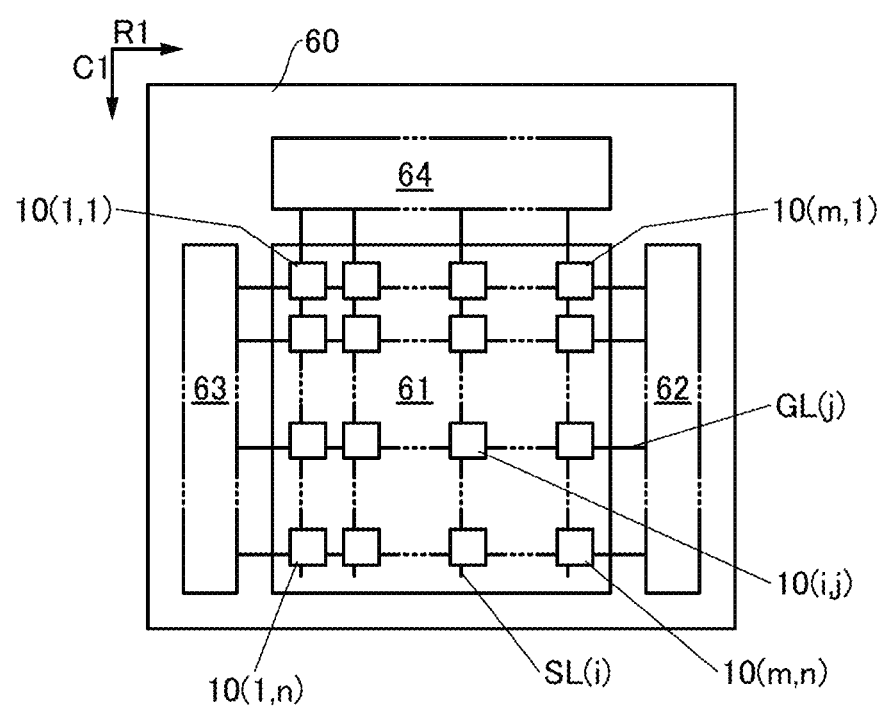
FIG. 3 is a block diagram illustrating a structure example of a display unit.

FIG. 3 is a block diagram illustrating a structure example of the display unit 60.

The pixel array 61 includes pixels 10(1,1) to 10(m,n), source lines SL(1) to SL(m), and gate lines GL(1) to GL(n). Here, m and n are each an integer greater than or equal to 1, i is an integer greater than or equal to 1 and less than or equal to m, and j is an integer greater than or equal to 1 and less than or equal to n. In FIG. 3, a constant potential line and the like for forming a power source line or a capacitor are omitted.

The gate drivers 62 and 63 are electrically connected to the pixel array 61 through the gate lines GL(1) to GL(n) and the source driver IC 64 is electrically connected to the pixel array 61 through the source lines SL(1) to SL(m).

A group of pixels 10(i,1) to 10(i,n) arranged in a direction shown by an arrow C1 are electrically connected to a source line SL(i) and a group of pixels 10(1,j) to 10(m,j) arranged in a direction shown by an arrow R1 are electrically connected to a gate line GL(j).

The gate drivers 62 and 63 drive the gate line GL(j) and select the pixels 10(1,j) to 10(m,j). The source driver IC 64 supplies image data supplied from the application processor 80 as a data signal to the pixels 10(1,j) to 10(m,j) through the source lines SL(1) to SL(m). By repeating this operation from the gate line GL(1) to the gate line GL(n), the display unit 60 can display an image on the pixel array 61.

Various display elements such as a liquid crystal, electronic paper, an organic electroluminescence (EL), or a quantum-dot light emitting diode (QLED) can be applied to the pixel 10. Alternatively, for example, a hybrid element in which a liquid crystal element that can be applied as a reflective element and an organic EL element that can be applied as a light-emitting element are combined can be applied to the pixel 10.

Alternatively, for example, a hybrid element in which a liquid crystal element that can be applied as a reflective element and a transmissive liquid crystal in which a light source (e.g., LED) and a liquid crystal are combined are combined can be applied to the pixel 10.

<Gate Driver>

Figure 4A:
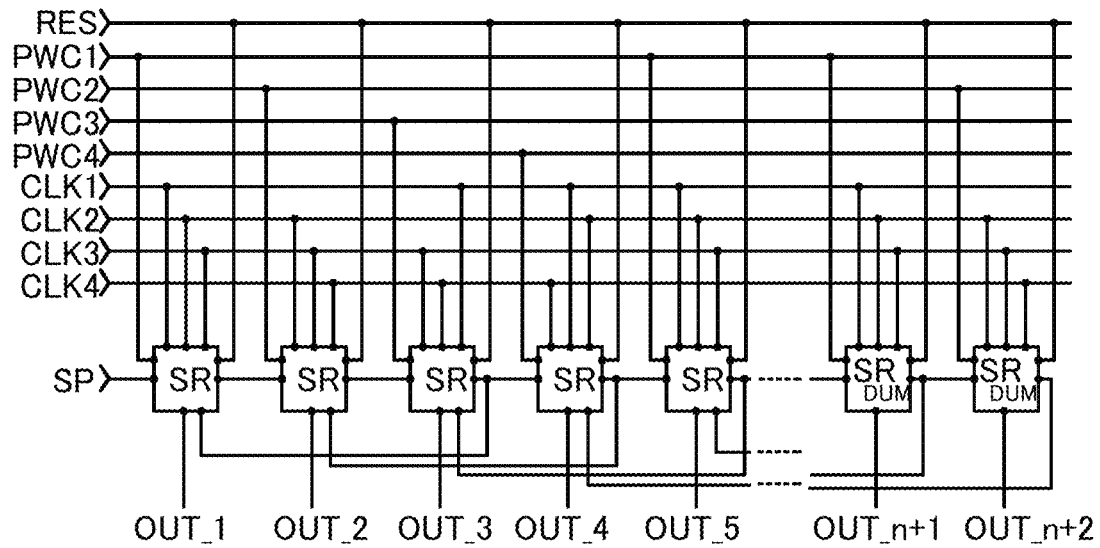
FIGS. 4A to 4C are circuit diagrams illustrating a configuration example of a gate driver.
Figure 4B:
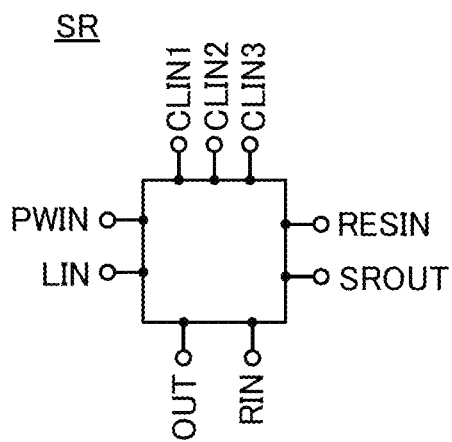
Figure 4C:
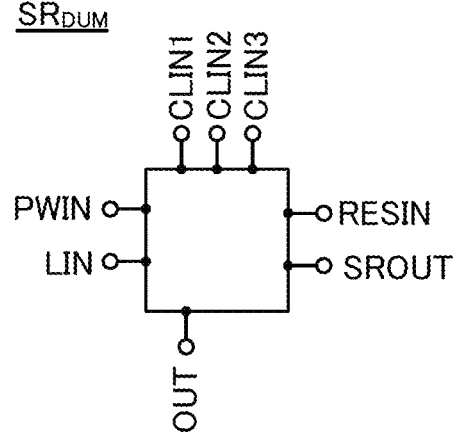

FIGS. 4A to 4C are circuit diagrams illustrating a structure example of the gate driver that can be applied to the gate driver 62 and the gate driver 63.

A gate driver illustrated in FIG. 4A includes n shift registers SR and two shift registers $SR_{DUM}$ and a start pulse SP, clock signals CLK1 to CLK4, pulse-width control signals PWC1 to PWC4, and a reset signal RES are input to the gate driver from outside. The gate driver illustrated in FIG. 4A includes output terminals OUT_1 to OUT_n+2 and the output terminals OUT_1 to OUT_n are electrically connected to the gate lines GL(1) to GL(n), respectively.

The shift register SR illustrated in FIG. 4B includes input terminals CLIN1 to CLIN3, PWIN, LIN, RIN, and RESIN and output terminals SROUT and OUT. As illustrated in FIG. 4A, one of the clock signals CLK1 to CLK4 is input to each of the input terminals CLIN1 to CLIN3, one of the pulse-width control signals PWC1 to PWC4 is input to the input terminal PWIN, and the reset signal RES is input to the input terminal RESIN.

The output terminals OUT of the shift registers SR are electrically connected to the output terminals OUT_1 to OUT_n of the gate driver. When the shift register SR electrically connected to an output terminal OUT_j of the gate driver is called the j-th shift register SR (j is an integer greater than or equal to 1 and less than or equal to n), the input terminal LIN of the j-th shift register SR and the input terminal RIN of the j-th shift register SR are electrically connected to the output terminal SROUT of the (j−1)-th shift register SR and the output terminal SROUT of the (j+2)-th shift register SR, respectively. However, the start pulse SP is input to the input terminal LIN of the first shift register SR and the input terminal RIN of the (n−1)-th shift register SR and the input terminal RIN of the n-th shift register SR are electrically connected to the output terminal SROUT of the (n+1)-th shift register $SR_{DUM}$ and the output terminal SROUT of the (n+2)-th shift register $SR_{DUM}$, respectively.

The shift register $SR_{DUM}$ illustrated in FIG. 4C has a structure similar to that of the shift register SR except that the input terminal RIN is not provided. Therefore, the description of the shift register SR is referred to for the description of the shift register $SR_{DUM}$.

Figure 5A:
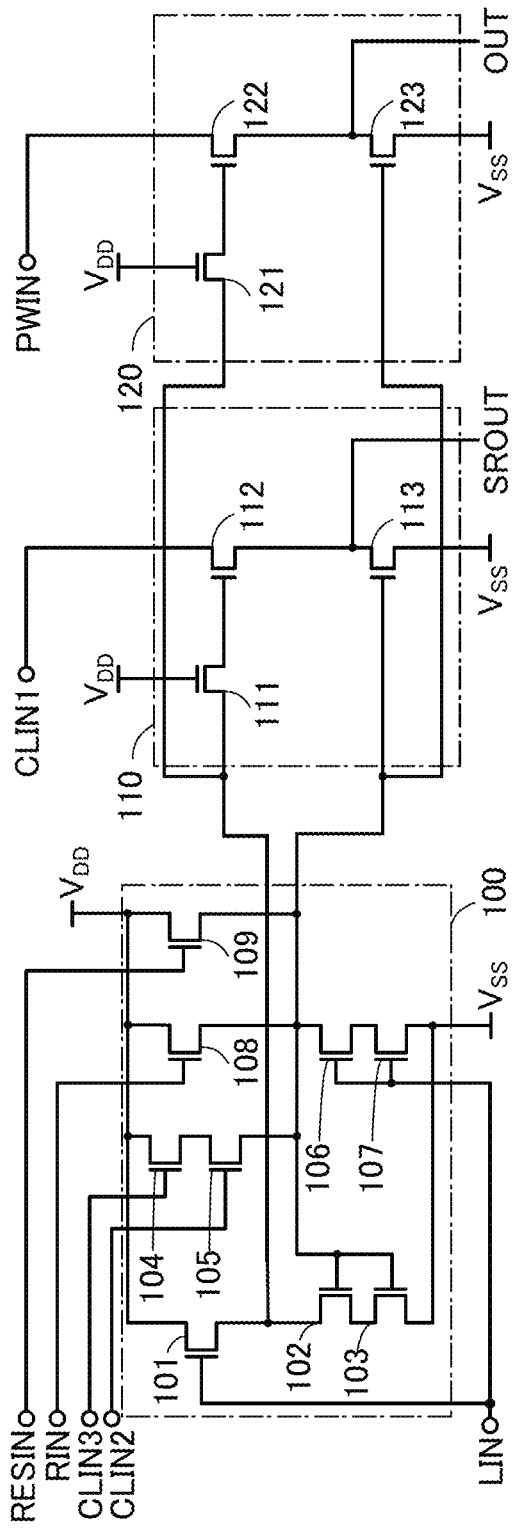
FIGS. 5A and 5B are circuit diagrams each illustrating a configuration example of a shift register.

FIG. 5A is a circuit diagram illustrating a structure example of the shift register SR. In FIG. 5A, a circuit 100 includes transistors 101 to 109, a circuit 110 includes transistors 111 to 113, and a circuit 120 includes transistors 121 to 123.

Although the transistors 101 to 109, the transistors 111 to 113, and the transistors 121 to 123, which are OS transistors, are illustrated as single-gate transistors in FIG. 5A, they may be dual-gate transistors including back gates. Since the transistors 101 to 109, the transistors 111 to 113, and the transistors 121 to 123 are OS transistors, the off-state current of the transistor is reduced, and power consumption of the gate driver can be reduced.

Figure 5B:
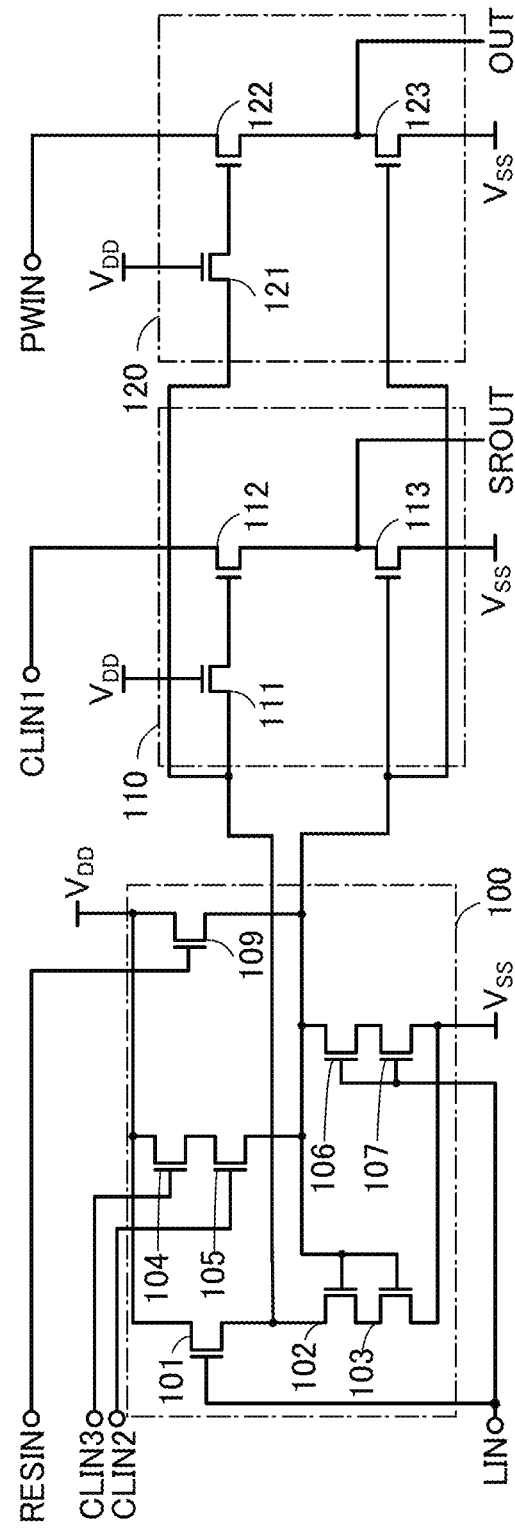

Similarly, a circuit diagram illustrating a structure example of the shift register $SR_{DUM}$ is illustrated in FIG. 5B.

Figure 6:
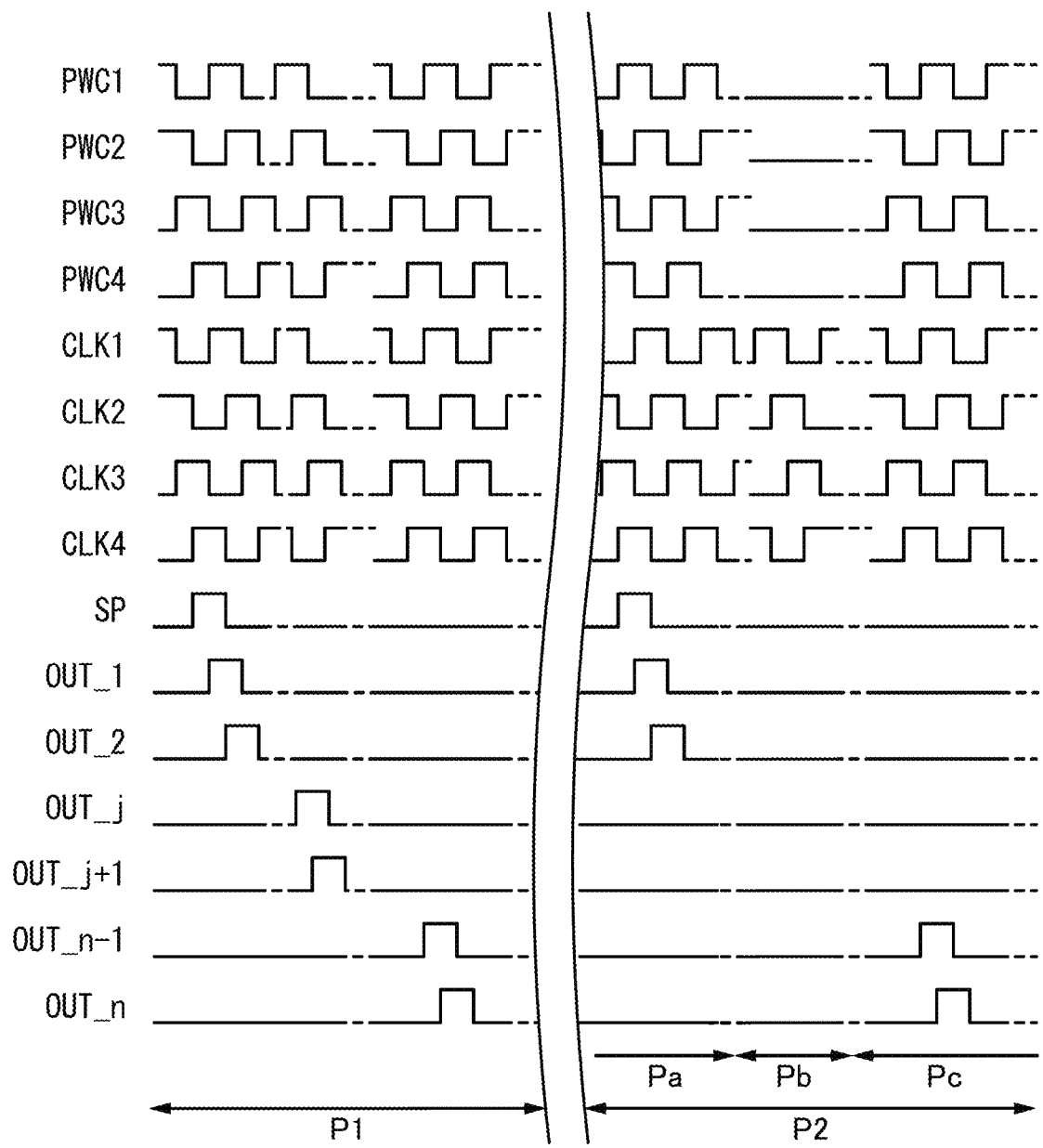
FIG. 6 is a timing chart showing an operation example of a gate driver.

FIG. 6 is a timing chart showing waveforms of the start pulse SP, the clock signals CLK1 to CLK4, the pulse-width control signals PWC1 to PWC4, and the output terminals OUT_1 to OUT_n.

In a period P1, pulses are sequentially output from the output terminals OUT_1 to OUT_n in accordance with the start pulse SP, the clock signals CLK1 to CLK4, and the pulse-width control signals PWC1 to PWC4.

On the contrary, in a period P2, the pulse-width control signals PWC1 to PWC4 are kept at L level for a certain period. In the example of FIG. 6, pulses are output from the output terminals OUT_1, OUT_2, OUT_n−1, and OUT_n, and pulses are not output from the output terminals OUT_j and OUT_j+1.

In a period Pa and a period Pc, as in the period P1, toggle operation by the pulse-width control signals PWC1 to PWC4 is performed. In a period Pb, the pulse-width control signals PWC1 to PWC4 are set at L level, so that the gate driver can output pulses only to the predetermined output terminals (partial IDS driving described later).

As described above, the gate driver illustrated in FIG. 4A can output pulses to the output terminals OUT_1 to OUT_n sequentially and can output pulses only to the predetermined output terminals by controlling the pulse-width control signals PWC1 to PWC4.

<<Timing Chart>>

Next, the relation between image rewriting operation by the display unit 60 and detection operation by the touch sensor unit 70 is described. In the description of the image rewriting operation by the display unit 60, the operation is divided into the following three modes: the first mode in which an image in an entire display region is rewritten (hereinafter, referred to as "normal display"), the second mode in which an image in part of the display region is rewritten (hereinafter, referred to as "partial IDS driving"), and the third mode in which an image in the entire display region is not rewritten (hereinafter, referred to as "IDS driving").

<Normal Display>

Normal display is performed when an image in an entire display region needs to be rewritten, for example, when a moving image is displayed in the entire display region. Here, for easy understanding, the frequency of image rewriting by the display unit 60 is about 60 times per second (the frame frequency is 60 Hz). In addition, n is 18 in the description of the pixels 10(1,1) to 10(m,n) of the pixel array 61.

Figure 7:
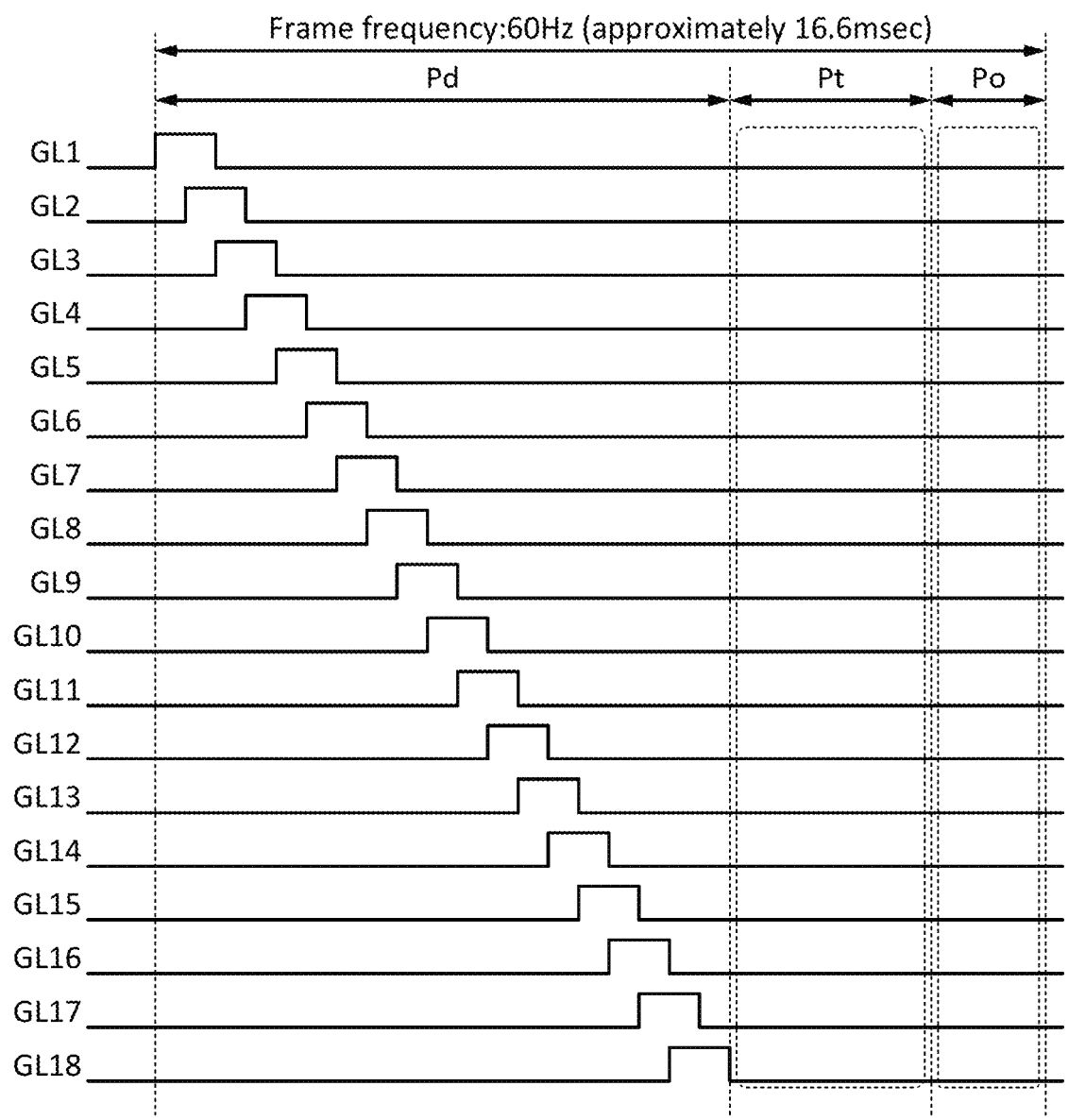
FIG. 7 is a timing chart showing an operation example of normal display.

When a period in which the display unit 60 rewrites an image is a period Pd, as illustrated in FIG. 7, the gate drivers 62 and 63 drive the gate lines GL(1) to GL(18) and output pulses sequentially. Since image rewriting is performed in the period Pd, noise such as noise caused by driving of the gate lines GL(1) to GL(18), noise caused by supply of data signals to the source lines SL(1) to SL(m), and noise caused by operation of the gate drivers 62 and 63 is caused. Therefore, detection operation by the touch sensor unit 70 is not preferably performed in the period Pd.

In view of this, another period Pt different from the period Pd is provided and detection operation by the touch sensor unit 70 is performed in the period Pt. A period Po is a period in which neither image rewriting by the display unit 60 nor detection operation by the touch sensor unit 70 is performed. The period Po is needed for matching timing of operation of the display device 50 and operation of a device other than the application processor 80 and the display device 50 in some cases; however, the period Po is not necessarily provided unless needed.

The display device 50 is designed so that the total time of the period Pd, the period Pt, and the period Po is 1/60 seconds (approximately 16.6 ms).

<Partial IDS Driving>

Partial IDS driving is employed when an image in part of a display region needs to be rewritten, for example, when a moving image is displayed in part of the display region. For example, FIG. 8 is an example of the application of the display device 50 to a tablet information terminal 90.

Figure 8:
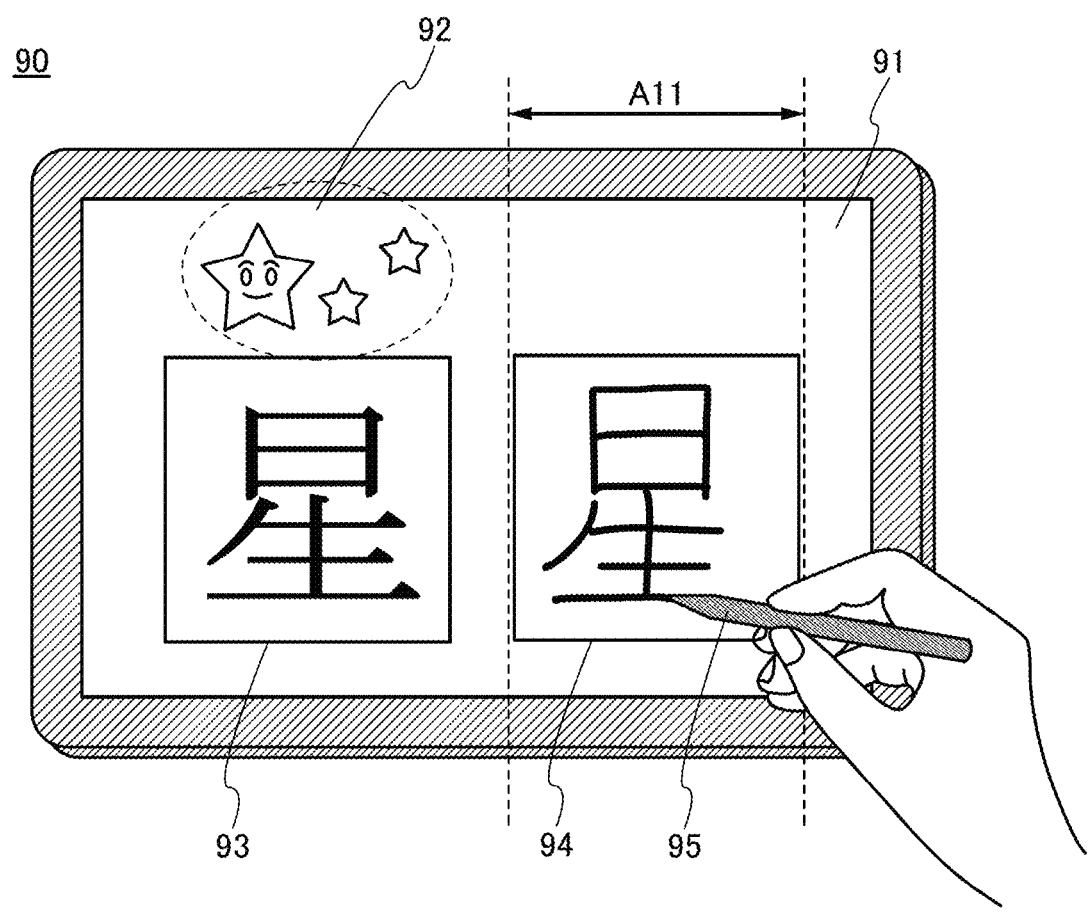
FIG. 8 is an external view illustrating an embodiment and a usage example of a tablet information terminal.

FIG. 8 is an external view illustrating an embodiment and a usage example of the tablet information terminal 90. The tablet information terminal 90 includes a display region 91 that also serves as an input region and letters, pictures, and the like can be input thereto with a finger, a stylus, or the like. The display device 50 of one embodiment of the present invention is applied to the display region 91.

FIG. 8 illustrates an example in which a user of the tablet information terminal 90 learns a letter. The tablet information terminal 90 displays an illustration 92, a frame 93, and a frame 94. A good example of a letter is displayed within the frame 93. The user writes the same letter as that displayed within the frame 93, in the frame 94 with a stylus 95. The tablet information terminal 90 displays the illustration 92 that is related to the letter within the frame 93.

In this case, only an image in the frame 94 needs to be rewritten. The gate drivers 62 and 63 may drive only the gate lines GL in a region related to the frame 94 (a region A11 shown by a dotted line in FIG. 8). The timing chart shown in FIG. 7 changes into a timing chart shown in FIG. 9, for example.

Figure 9:
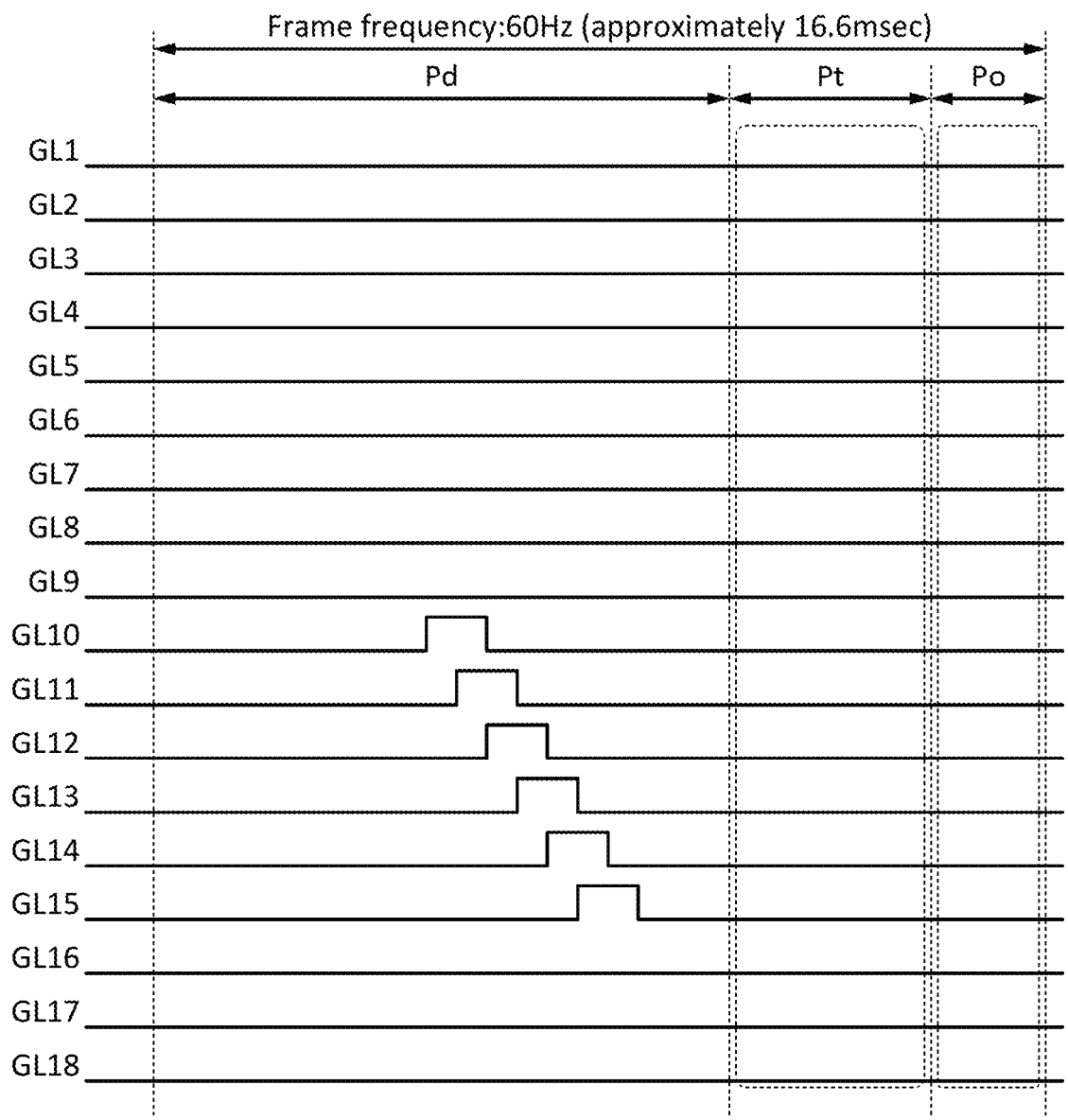
FIG. 9 is a timing chart showing an operation example of partial IDS driving.

In FIG. 9, output of pulses to the gate lines GL(1) to GL(9) and the gate lines GL(16) to GL(18) is prevented by controlling the pulse-width control signals PWC1 to PWC4. The pulses similar to those in normal display are output only to the gate lines GL(10) to GL(15). Such driving method is called partial IDS driving.

Figure 10:
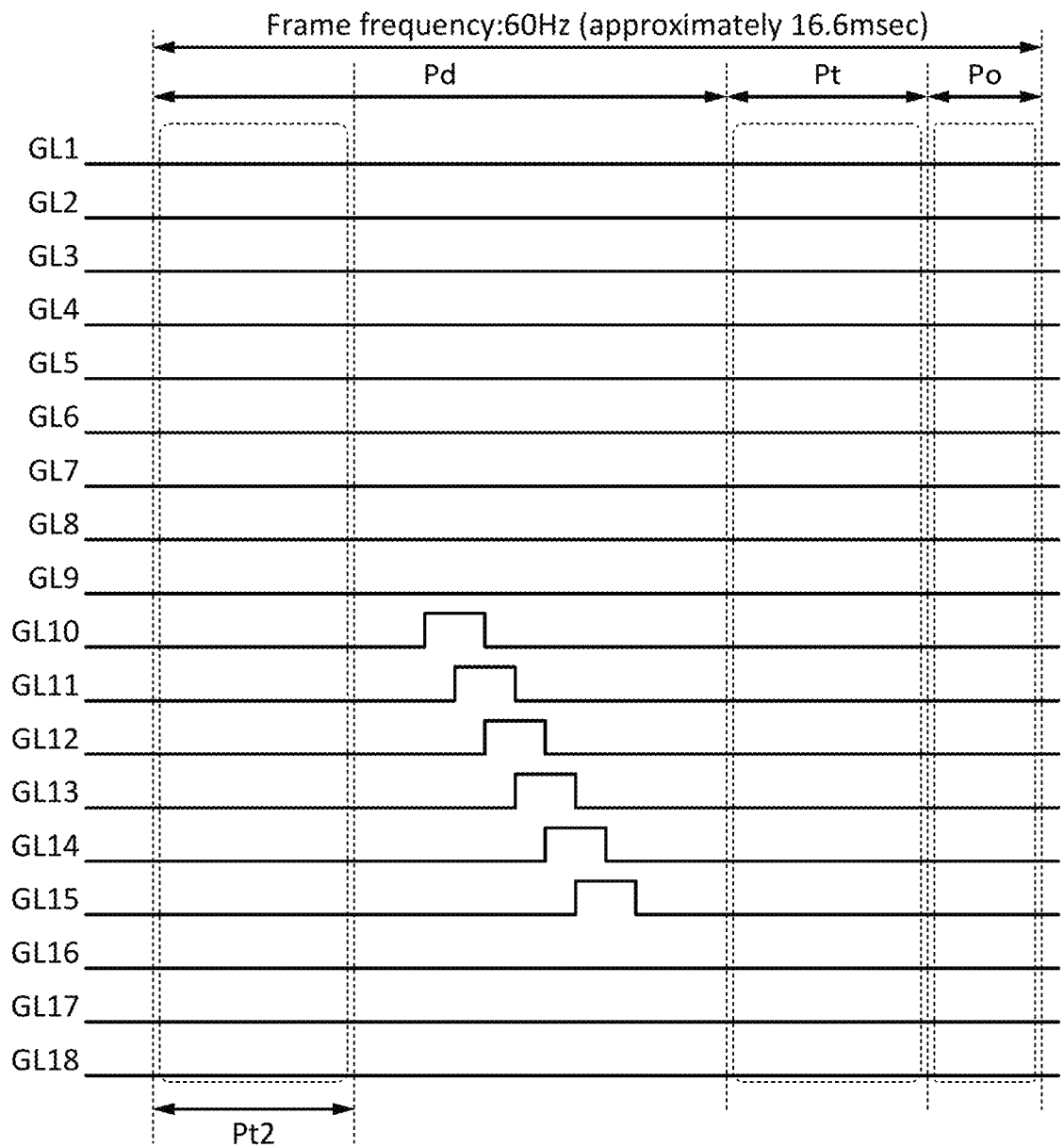
FIG. 10 is a timing chart showing an operation example of partial IDS driving.

In FIG. 9, pulses are not output to the gate lines GL(1) to GL(9); thus, the period Pt in which the touch sensor unit 70 performs detection operation can be added. FIG. 10 is an example in which a period Pt2 having the same period of time as the period Pt is provided. In this case, the touch sensor unit 70 can perform detection operation twice in 1/60 seconds (approximately 16.6 ms), so that detection operation can be performed 120 times per second. Accordingly, input can be smoothly performed; thus, the display device 50 is favorable for handwriting input or the like.

In FIG. 9, pulses are not output to the gate lines GL(16) to GL(18) as well as the gate lines GL(1) to GL(9), so that the period Pt2 can be separately provided.

Since image rewriting is unnecessary in the period Pt2, noise caused by driving of the gate lines GL(1) to GL(18) and noise caused by supply of data signals to the source lines SL(1) to SL(m) are not caused. Therefore, detection operation by the touch sensor unit 70 is preferably performed in the period Pt2.

Also in the period Pt2, the clock signals CLK1 to CLK4 are supplied to the gate drivers 62 and 63; thus, in the case where higher detection sensitivity is needed, each of the shift register SR and the shift register $SR_{DUM}$ of each of the gate driver 62 and the gate driver 63 can be a decoder circuit not using a clock signal.

<Ids Driving>

IDS driving is employed when an image in an entire display region does not need to be rewritten, for example, when a still image is displayed in an entire display region. In that case, the period Pd in which the display unit 60 rewrites an image becomes unnecessary in the timing chart shown in FIG. 7; therefore, a timing chart is shown as in FIG. 11.

Figure 11:
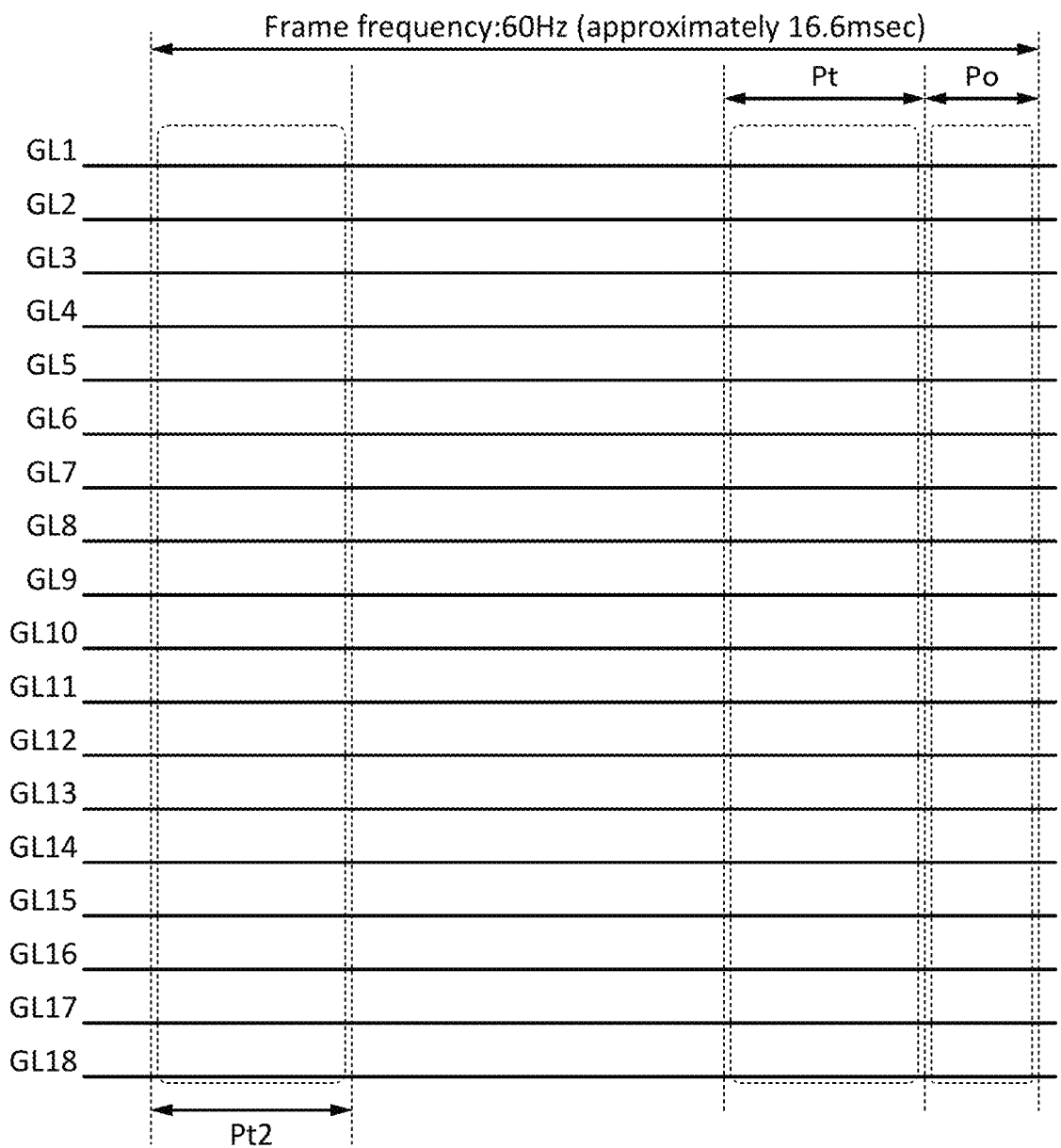
FIG. 11 is a timing chart showing an operation example of IDS driving.

In FIG. 11, the gate drivers 62 and 63 are stopped and pulses are not output to the gate lines GL(1) to GL(18). In this case, the period Pt and the period Pt2 can be freely provided in a period of 1/60 seconds (approximately 16.6 ms) other than the period Po; therefore, input can be smoothly performed. If necessary, a period in which the touch sensor unit 70 performs detection operation can be further added.

In the IDS driving, an image does not need to be rewritten as long as a still image is displayed; however, in practice, a time during which the pixel 10 using a transistor having a low off-state current can hold a charge, inversion driving occurring when a display element of the pixel 10 is a liquid crystal element, or the like needs to be taken into consideration.

Furthermore, the IDS driving and the partial IDS driving are favorable for a portable information terminal because power consumption of a display unit can be reduced.

<<Flow Chart>>

Figure 12:
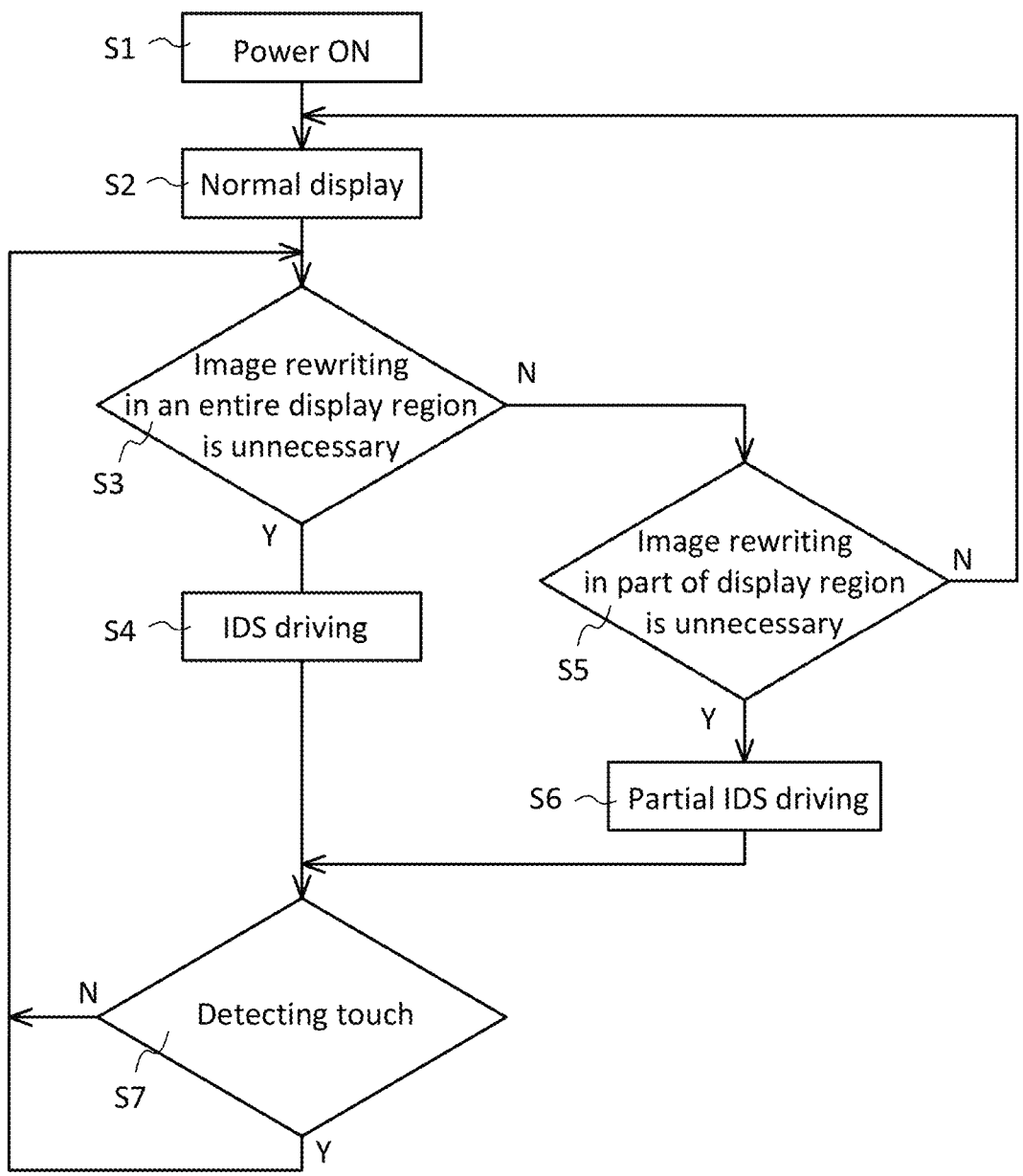
FIG. 12 is a flow chart showing an operation example of an electronic device.

Then, a state in which three operation modes (normal display, partial IDS driving, and IDS driving) are switched after an electronic device to which the display device 50 is applied is turned on is described using a flow chart in FIG. 12.

When the electronic device to which the display device 50 is applied is turned on (Step S1), first, normal display with a frame frequency of 60 Hz is performed (Step S2). After a while, startup operation is terminated and it is determined whether image rewriting in an entire display region is unnecessary or not (Step S3). The determination can be made by calculating a difference between image data displayed at present and image data displayed next by the application processor 80.

When image rewriting in the entire display region is unnecessary, the IDS driving is performed (Step S4). When image rewriting in the entire display region is not unnecessary, it is determined whether image rewriting in part of the display region is unnecessary or not (Step S5). The determination whether image rewriting in part of the display region is unnecessary or not is made by the application processor 80 as in the Step S3. When image rewriting in part of the display region is unnecessary, the partial IDS driving is performed (Step S6). When a touch is detected in the IDS driving or the partial IDS driving (Step S7), it is determined again whether image rewriting in the entire display region is unnecessary or not (Step S3).

When it is determined in Step S3 that image rewriting in the entire display region is not unnecessary and it is determined in Step S5 that image rewriting in part of the display region is not unnecessary, normal display is performed (Step S2).

Next, operation that still text (letters) is displayed on an information terminal that is an electronic device to which the display device 50 is applied, and a user marks a part on which the user focuses is described using FIGS. 13A to 13D and FIG. 14.

FIGS. 13A to 13D illustrate a usage example of the information terminal to which the display device 50 is applied and the states of signals input to the gate drivers 62 and 63. The signals are the clock signal CLK, which is one of the clock signals CLK1 to CLK4, and the pulse-width control signals PWC1 and PWC2. FIG. 14 is a flow chart showing operation of the information terminal illustrated in FIGS. 13A to 13D.

Figure 13A:
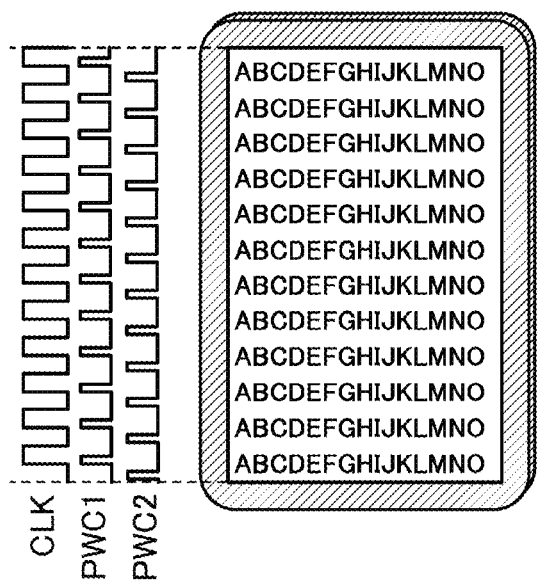
FIGS. 13A to 13D illustrate a usage example of an information terminal and states of signals input to a gate driver.
Figure 14:
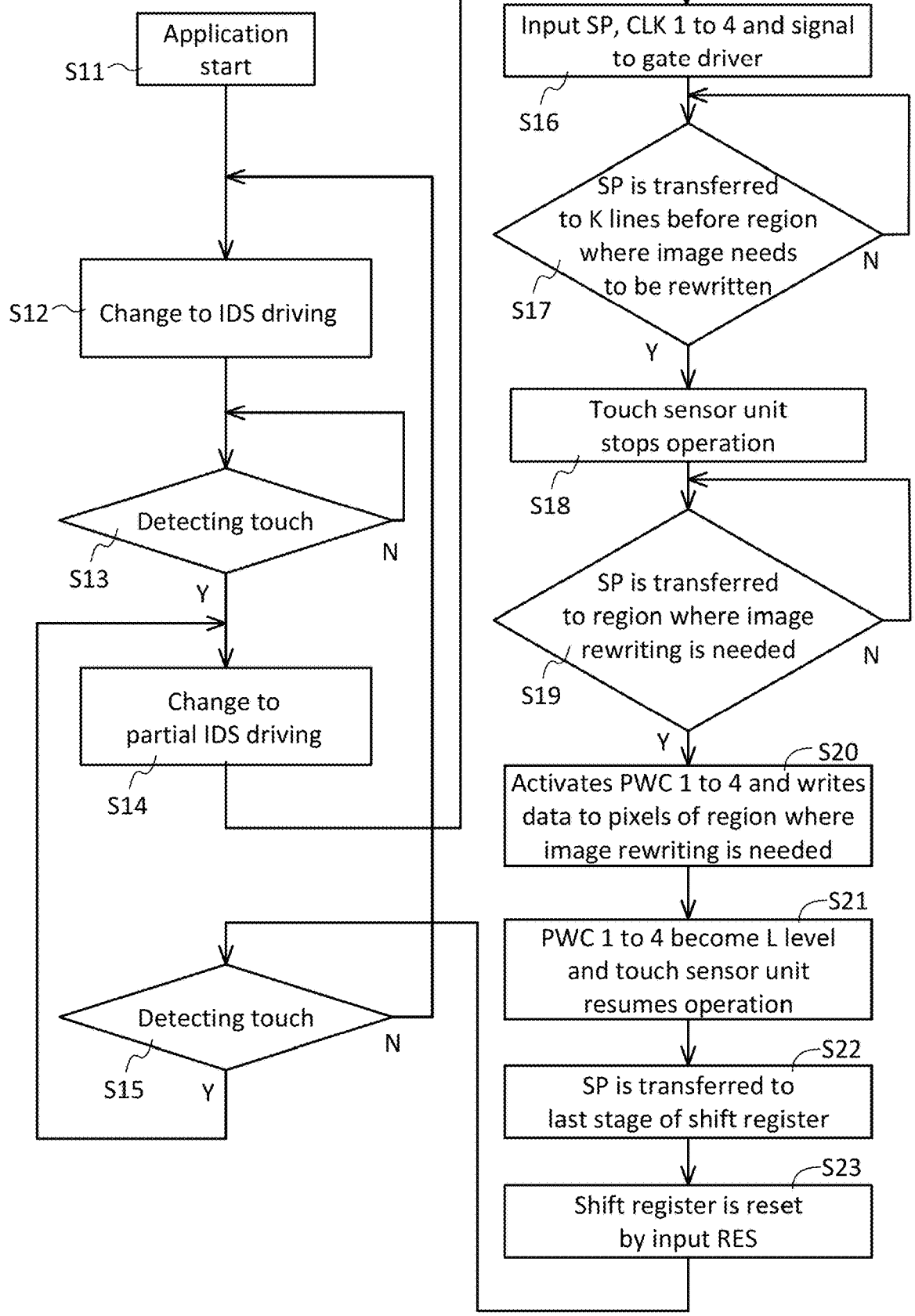
FIG. 14 is a flow chart showing an operation example of an information terminal.
Figure 15A:
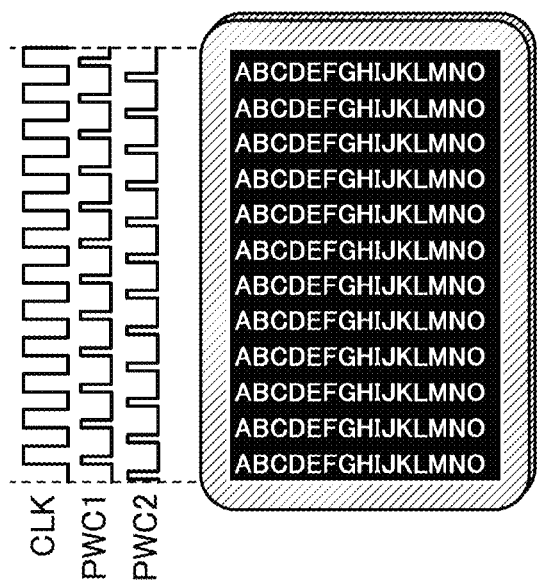
FIGS. 15A to 15D illustrate a usage example of an information terminal and states of signals input to a gate driver (in the case of a light-emitting element)
Figure 15B:
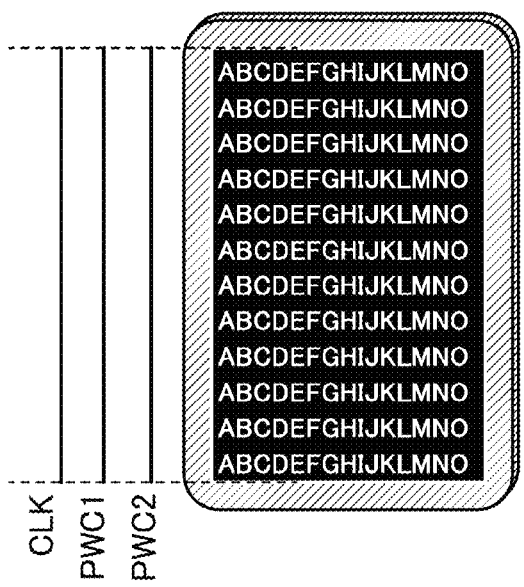
Figure 15C:
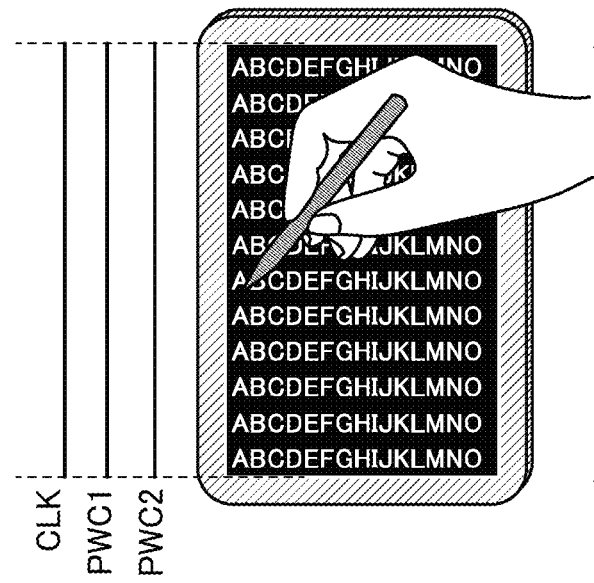
Figure 15D:
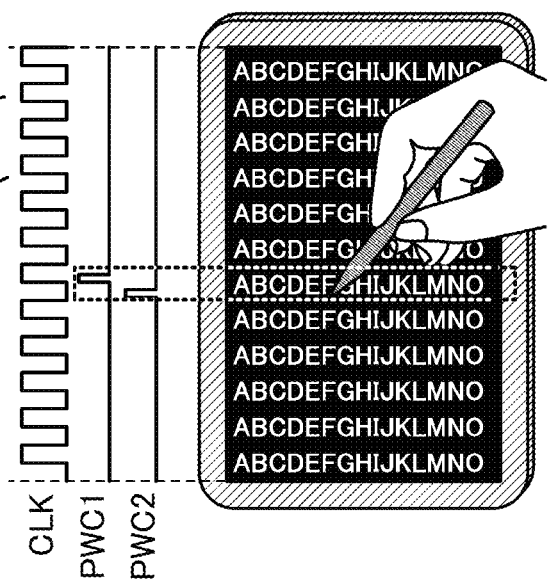

FIG. 13A illustrates a state immediately after an application is started up (Step S11 in FIG. 14). Normal display is performed and the clock signal CLK and the pulse-width control signals PWC1 and PWC2 perform toggle operation.

Figure 13B:
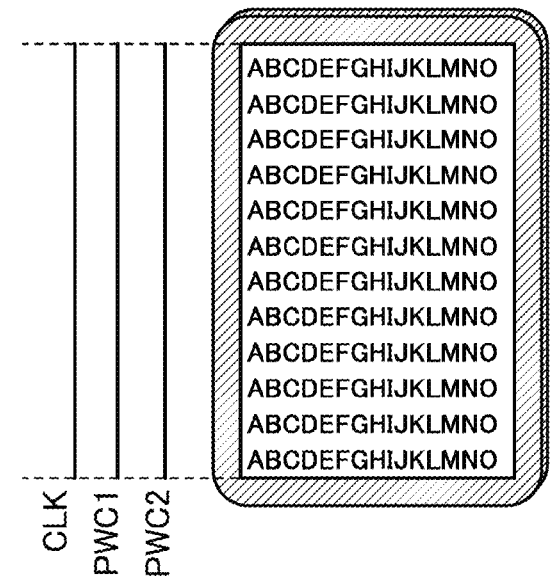

In FIG. 13B, still text is displayed; thus, the IDS driving is performed (Step S12 in FIG. 14). In the IDS driving, the clock signal CLK and the pulse-width control signals PWC1 and PWC2 are kept at L level and the gate drivers 62 and 63 are stopped.

Figure 13C:
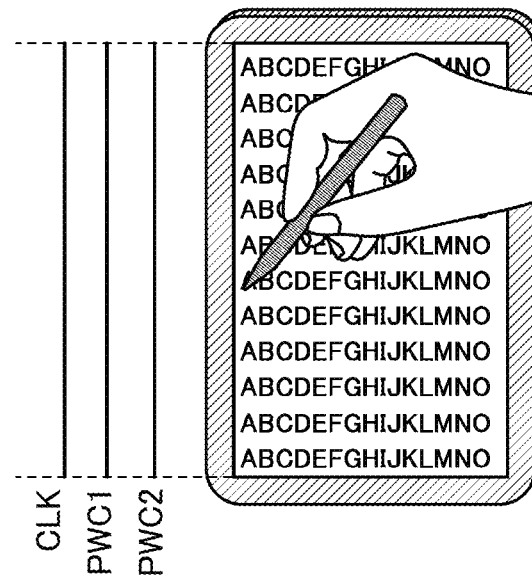
Figure 13D:
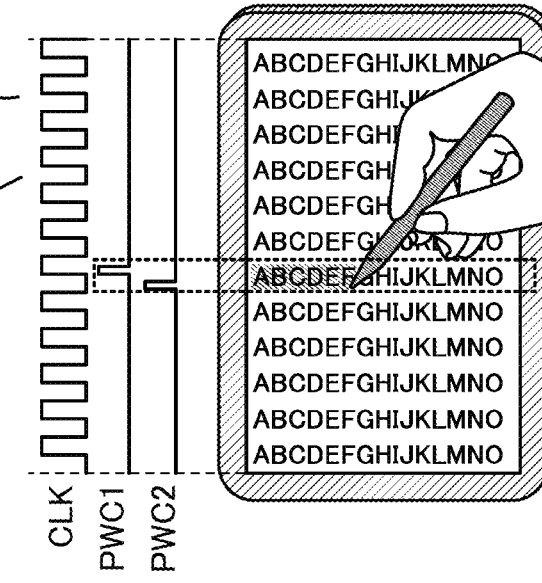

In FIG. 13C, a touch by a stylus is detected (Step S13 in FIG. 14). The partial IDS driving is performed (Step S14 in FIG. 14) and the clock signal CLK performs toggle operation (FIG. 13D). The start pulse SP is also input to the gate drivers 62 and 63 so that the gate drivers 62 and 63 start operation; however, the pulse-width control signals PWC1 and PWC2 are at L level for a while (Steps S16 and S17 in FIG. 14). When the input start pulse SP shifts the shift register and is transferred to K lines before a region where an image needs to be rewritten, the touch sensor unit 70 stops operation (Steps S17 and S18 in FIG. 14). Although it depends on the circuit configuration, K is an integer at least 1 or more.

When the start pulse SP is transferred to the region where image rewriting is needed, the pulse-width control signals PWC1 and PWC2 also perform toggle operation and the gate drivers 62 and 63 output pulses to the gate line GL. Then, image data is written to the pixel 10 as a data signal (Steps S19 and S20 in FIG. 14).

After image rewriting in the region where image rewriting is needed is terminated, the pulse-width control signals PWC1 and PWC2 become L level and the touch sensor unit 70 resumes operation. When the start pulse SP is transferred to the last stage of the shift register, the shift register is reset by an RES signal (Steps S21, S22, and S23 in FIG. 14).

When next touch is detected (Step S15 in FIG. 14), the operation of Step S14 and the operation after Step S15 in FIG. 14 are repeated. When next touch is not detected, the IDS driving is performed again (Step S12 in FIG. 14).

As described above, in the electronic device to which the display device 50 is applied, three operation modes (normal display, partial IDS driving, and IDS driving) can be switched appropriately. The display device 50 performs accurate detection operation by the touch sensor unit 70 at the timing when an effect of noise is small, and the display device 50 enables smooth input when the partial IDS driving or the IDS driving is performed. Furthermore, when the partial IDS driving or the IDS driving is performed, power consumption of image rewriting operation can be reduced.

In the usage example of FIGS. 13A to 13D, a display example of the display device 50 is an example in which a transmissive or reflective liquid crystal element is applied to the pixel 10, for example.

Alternatively, in the usage example of FIGS. 13A to 13D, a hybrid element in which a reflective element and a light-emitting element are combined may be applied to the pixel 10. In this case, still text and a mark may be displayed using the reflective element and the light-emitting element, respectively. The reflective element displaying the still text can perform the IDS driving.

An operation similar to that can be performed when a light-emitting element such as an organic EL is applied to the pixel 10 and above-described accurate detection, smooth input, and reduction in power consumption of image rewriting operation can be achieved. In this case, the light-emitting area of the light-emitting element influences power consumption of light emission. Therefore, in the structure of the usage example of FIGS. 13A to 13D, it is preferable that a background is black (light is not emitted) and only a necessary portion emits light as illustrated in FIGS. 15A to 15D.

This embodiment can be implemented in combination with any other embodiment as appropriate.

Embodiment 2

In this embodiment, a structure example of the touch sensor unit 70 mentioned in the above embodiment is described with reference to FIGS. 16A to 16C and FIGS. 17A and 17B.

A specific structure example of the touch sensor unit 70 is described with reference to FIGS. 16A to 16C and FIGS. 17A and 17B.

Figure 16A:
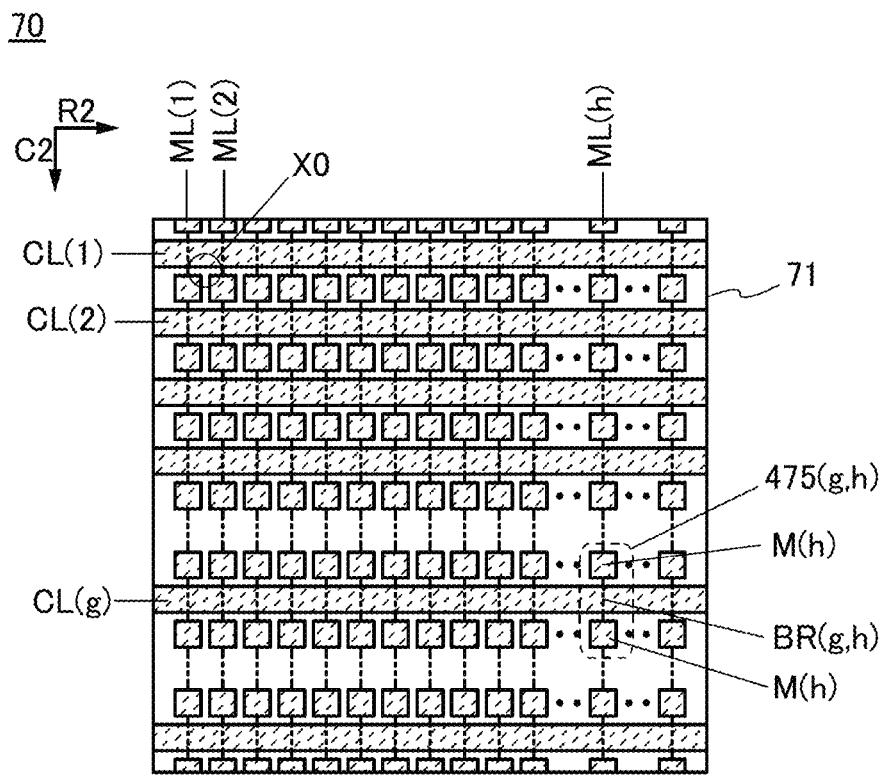
FIGS. 16A to 16C are a top view and projection views illustrating a structure example of a touch sensor unit.
Figure 16B:
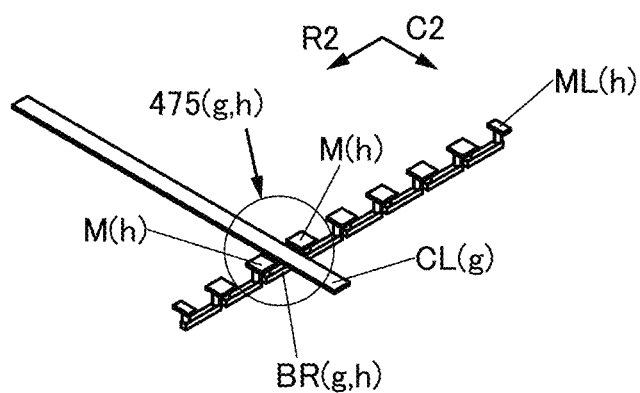
Figure 16C:
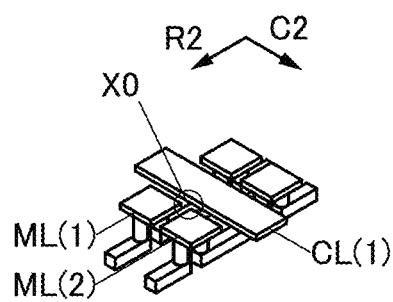

FIG. 16A is a top view of the touch sensor unit 70. FIGS. 16B and 16C are each a projection view illustrating part of FIG. 16A.

Figure 17A:
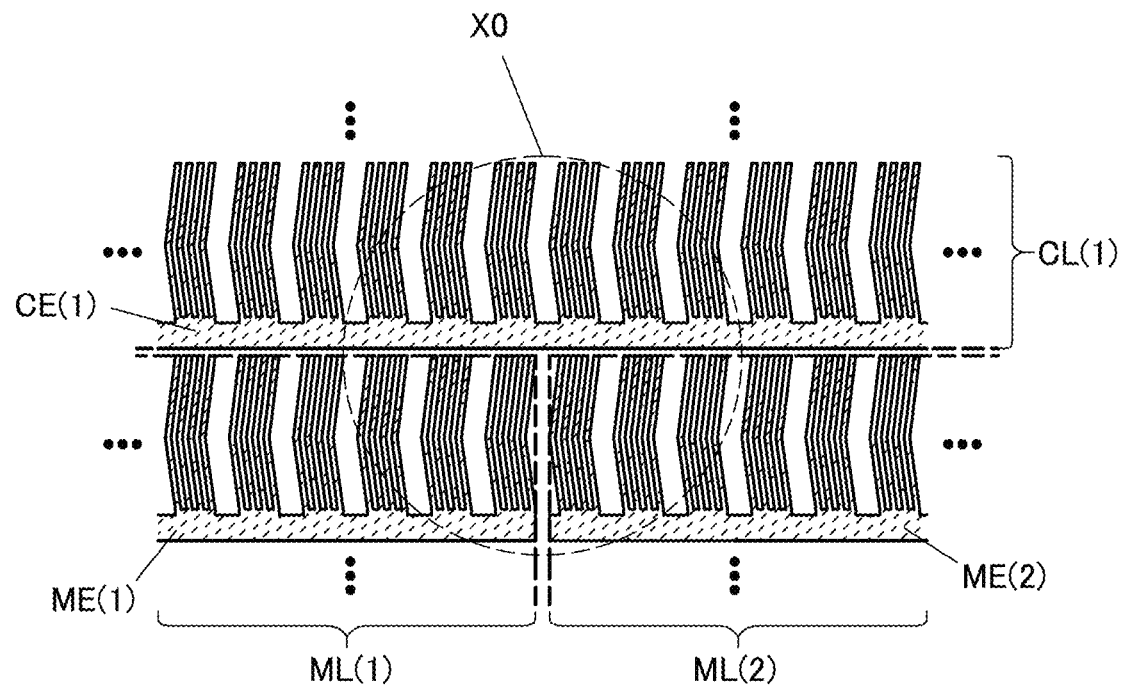
FIGS. 17A and 17B are a top view and a projection view illustrating a structure example of a touch sensor unit.
Figure 17B:
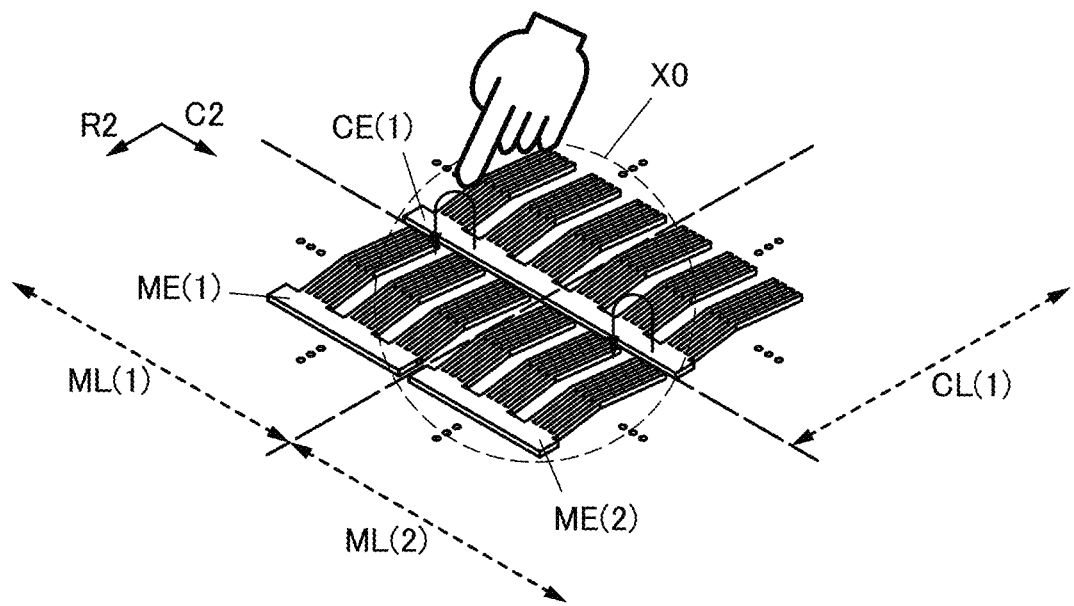

FIG. 17A is a top view of a portion in which a control line and a sensing signal line are adjacent to each other. FIG. 17B is a projection view that schematically illustrates an electric field generated in the adjoining portion.

The touch sensor unit 70 includes the sensor array 71. The sensor array 71 includes a wiring CL(g), a wiring ML(h), and a conductive film (see FIG. 16A). Note that g and h are each an integer of 2 or more.

For example, a conductive film divided into a plurality of regions can be used for the sensor array 71 (see FIG. 16A). This enables the same potential or different potentials to be supplied to the plurality of regions.

Specifically, a conductive film divided into a conductive film that can be used as the wiring CL(g) and a conductive film that can be used as the wiring ML(h) can be used for the sensor array 71. The conductive films obtained by dividing a conductive film into a plurality of regions can each have a comb-like shape, for example (see an electrode CE(1), an electrode ME(1), and an electrode ME(2) in FIGS. 17A and 17B). In this manner, the divided conductive films can be used as electrodes of sensing elements.

For example, a conductive film that can be used as the wiring CL(1), a conductive film that can be used as the wiring ML(1), and a conductive film that can be used as the wiring ML(2), which are obtained by dividing a conductive film, are adjacent to each other in an adjoining portion X0 (see FIG. 16A, FIG. 16C or FIGS. 17A and 17B).

A sensing element 475(g,h) is electrically connected to the wiring CL(g) and the wiring ML(h) (see FIG. 16A).

The wiring CL(g) has a function of supplying the signal Tx, and the wiring ML(h) has a function of receiving the signal Rx.

The wiring ML(h) includes a conductive film BR(g,h) (see FIG. 16B). The conductive film BR(g,h) includes a region overlapping with the wiring CL(g).

Note that the sensing element 475(g,h) includes an insulating film. The insulating film includes a region positioned between the wiring ML(h) and the conductive film BR(g,h). Thus, a short circuit between the wiring ML(h) and the conductive film BR(g,h) can be prevented.

The electrode CE(1) is electrically connected to the wiring CL(1), and the electrode ME(1) is electrically connected to the wiring ML(1) (see FIGS. 17A and 17B).

In a similar manner, an electrode CE(g) is electrically connected to the wiring CL(g), and an electrode ME(h) is electrically connected to the wiring ML(h).

A sensing element 475(1,1) detects a touch by detecting a change in the value of the capacitance formed between the electrode CE(1) and the electrode ME(1) (see FIGS. 17A and 17B).

In a similar manner, the sensing element 475(g,h) detects a touch by detecting a change in the value of the capacitance formed between the electrode CE(g) and the electrode ME(h).

Conductive films which can be formed in the same process can be used as the wiring CL(1) and the electrode CE(1). Conductive films which can be formed in the same process can be used as the wiring ML(1) and the electrode ME(1) (see FIGS. 17A and 17B).

In a similar manner, conductive films which can be formed in the same process can be used as the wiring CL(g) and the electrode CE(g). Conductive films which can be formed in the same process can be used as the wiring ML(h) and the electrode ME(h).

For example, a light-transmitting conductive film can be used as each of the electrodes CE(g) and ME(h). Alternatively, a conductive film having an opening or a comb-like shape in a region overlapping with the pixel can be used as each of the electrodes CE(g) and ME(h). Accordingly, an object that approaches the region overlapping with the display panel can be sensed without disturbing display on the display panel.

Note that this embodiment can be combined with any of the other embodiments in this specification as appropriate.

Embodiment 3

In this embodiment, a circuit configuration example of the pixel 10 described in the above embodiment is described with reference to FIG. 19, FIG. 20, and FIGS. 21A and 21B.

<Pixel 10*a*>

Figure 19:
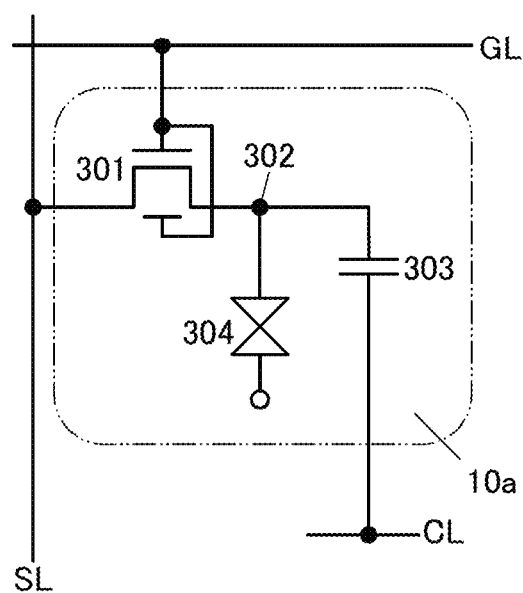
FIG. 19 is a circuit diagram illustrating a structure example of a pixel.

FIG. 19 illustrates an example of a pixel circuit that can be used for a panel including a liquid crystal element. A pixel 10*a* illustrated in FIG. 19 includes a transistor 301, a capacitor 303, and a liquid crystal element 304 functioning as a display element.

A gate (first gate) of the transistor 301 is electrically connected to the gate line GL, a back gate (second gate) of the transistor 301 is electrically connected to the gate, a first terminal of the transistor 301 is electrically connected to the source line SL, and a second terminal of the transistor 301 is electrically connected to a first terminal of the capacitor 303 and a first terminal of the liquid crystal element 304. A node of the second terminal of the transistor 301, the first terminal of the capacitor 303, and the first terminal of the liquid crystal element 304 is referred to as a node 302. The transistor 301 has a function of controlling whether to write a data signal to the node 302.

A second terminal of the capacitor 303 is electrically connected to a wiring (also referred to as a capacitor line CL) to which a particular potential is supplied. The value of the potential of the capacitor line CL is set in accordance with the specifications of the pixel 10*a* as appropriate. The capacitor 303 has a function as a storage capacitor for storing data written to the node 302.

The potential of a second terminal of the liquid crystal element 304 is set in accordance with the specifications of the pixel 10*a* as appropriate. The alignment state of a liquid crystal in the liquid crystal element 304 depends on data written to the node 302. A common potential may be supplied to the second terminal of the liquid crystal element 304 included in each of the pixels 10*a*.

A liquid crystal element that can be driven by any of the following driving methods can be used as the liquid crystal element 304: an IPS mode, a TN mode, an FFS mode, an ASM mode, an OCB mode, a ferroelectric liquid crystal (FLC) mode, an antiferroelectric liquid crystal (AFLC) mode, a VA mode, an MVA mode, a patterned vertical alignment (PVA) mode, an electrically controlled birefringence (ECB) mode, a continuous pinwheel alignment (CPA) mode, and an advanced super-view (ASV) mode.

For example, a liquid crystal material having a resistivity of greater than or equal to $1.0 \times 10^{13}$ Ω·cm, preferably greater than or equal to $1.0 \times 10^{14}$ Ω·cm, more preferably greater than or equal to $1.0 \times 10^{15}$ Ω·cm, is used for the liquid crystal element 304. This can suppress a variation in the transmittance of the liquid crystal element 304. Alternatively, flickering of the liquid crystal element 304 can be suppressed. Alternatively, the rewriting frequency of the liquid crystal element 304 can be reduced.

For example, a liquid crystal material containing a nematic liquid crystal, a thermotropic liquid crystal, a low-molecular liquid crystal, a high-molecular liquid crystal, a polymer dispersed liquid crystal, or the like can be used for the liquid crystal element 304. Alternatively, a liquid crystal material which exhibits a cholesteric phase or the like can be used. Alternatively, a liquid crystal material which exhibits a blue phase can be used.

Alternatively, for example, a liquid crystal material containing a dichroic dye can be used for the liquid crystal element 304. Note that a liquid crystal material containing a dichroic dye is called a guest-host liquid crystal.

Specifically, a material that has high absorbance in the major axis direction of molecules and a material that has low absorbance in the minor-axis direction orthogonal to the major axis direction can be used for the dichroic dye. It is preferable to use a material with a dichroic ratio of 10 or higher, further preferably 20 or higher for the dichroic dye.

An azo dye, an anthraquinone dye, a dioxazine dye, or the like can be used as a dichroic dye, for example.

Two liquid crystal layers including a dichroic dye having homogeneous alignment that are stacked to be orthogonally aligned with each other can be used as a layer containing a liquid crystal material. With the structure, light can be easily absorbed in all directions and contrast can be increased.

A phase transition guest-host liquid crystal or a liquid crystal in which a droplet containing a guest-host liquid crystal dispersed in a polymer may be used for the liquid crystal element 304.

Next, an operation example of the pixel 10a is described.

First, the pixels 10a are sequentially selected row by row by the gate drivers 62 and 63, whereby the transistors 301 are turned on and data is written to the node 302.

Then, the transistor 301 is turned off and the data written to the node 302 is held. The amount of light transmitted through the liquid crystal element 304 is determined in accordance with the data written to the node 302. This operation is sequentially performed row by row; thus, an image is displayed on the display region.

When the transistor 301 includes a back gate, the current driving capability of the transistor 301 can be increased. Note that the back gate is not necessarily provided in the transistor 301 according to circumstances. The transistor 301 not including the back gate can be fabricated by a simplified process.

A transistor including a metal oxide in a channel formation region (OS transistor) is preferably used as the transistor 301. In the case where an OS transistor is used as the transistor 301, the pixel 10a can hold data written to the node 302 for a long time; thus, the frequency of refreshing image data can be reduced while a still image is displayed. That is, the pixel 10a can perform the IDS driving. Consequently, power consumption of the display device 50 can be low.

<Pixel 10b>

Figure 20:
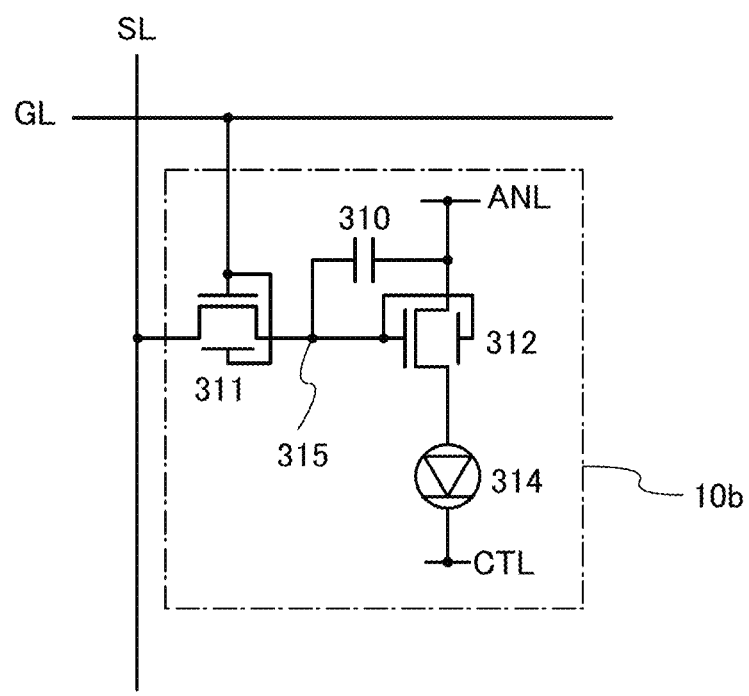
FIG. 20 is a circuit diagram illustrating a structure example of a pixel.

FIG. 20 illustrates an example of a pixel 10b that can be used for a panel including a light-emitting element.

The pixel 10b is electrically connected to the gate line GL, the source line SL, a wiring CTL, and a wiring ANL. The pixel 10b includes a transistor 311, a transistor 312, a capacitor 310, and a light-emitting element 314.

The light-emitting element 314 includes a pair of terminals (an anode and a cathode). As the light-emitting element 314, an element which can control the luminance with current or voltage can be used. As the light-emitting element 314, for example, a light-emitting element utilizing electroluminescence (also referred to as an EL element) can be used. An EL element includes a light-emitting layer (also referred to as an EL layer) between a pair of electrodes.

Although the transistors 311 and 312 are n-channel transistors in FIG. 20, one or both of the transistors 311 and 312 may be p-channel transistors. The transistors 311 and 312 each include a back gate (second gate) electrically connected to a gate (first gate). With such a device structure, the current drive capability of the transistors 311 and 312 can be improved.

The transistor 311 is a pass transistor which connects the gate of the transistor 312 (a node 315) and the source line SL. The transistor 312 is a driving transistor and functions as a current source of current supplied to the light-emitting element 314. In accordance with the amount of drain current of the transistor 312, the luminance of the light-emitting element 314 is adjusted. The capacitor 310 is a storage capacitor which stores voltage between the node 315 and the wiring ANL.

The pixels 10b are sequentially selected row by row by the gate drivers 62 and 63, whereby the transistors 311 are turned on and data is written to the node 315.

Then, the transistor 311 is turned off and the data written to the node 315 is held. The luminance of the light-emitting element 314 is determined in accordance with the data written to the node 315. This operation is sequentially performed row by row; thus, an image is displayed on the display region.

An OS transistor is preferably used as the transistor 311. In the case where an OS transistor is used as the transistor 311, the pixel 10b can hold data written to the node 315 for a long time; thus, the frequency of refreshing image data can be reduced while a still image is displayed. That is, the pixel 10b can perform the IDS driving. Consequently, power consumption of the display device 50 can be low.

<Pixel 10c>

Figure 21A:
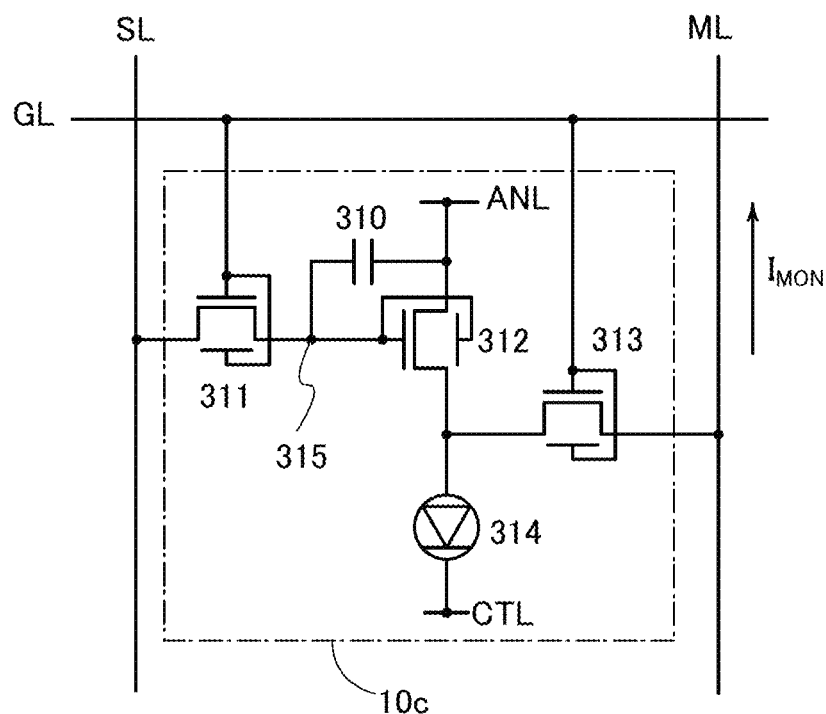
FIGS. 21A and 21B are a circuit diagram illustrating a structure example of a pixel and a timing chart.

FIG. 21A illustrates an example of a pixel 10c that can be used for a panel including a light-emitting element.

In the pixel 10c, the wiring ML and a transistor 313 are added to the pixel 10b illustrated in FIG. 20. The transistor 313 is a pass transistor which connects the wiring ML and the anode of the light-emitting element 314.

Variation in the drive capability of the transistor 312 causes variation in the luminance of the light-emitting element 314, which results in decrease in display quality. The pixel 10c has a function of correcting variation in the luminance of the light-emitting element 314 by monitoring a drain current of the transistor 312.

Figure 21B:
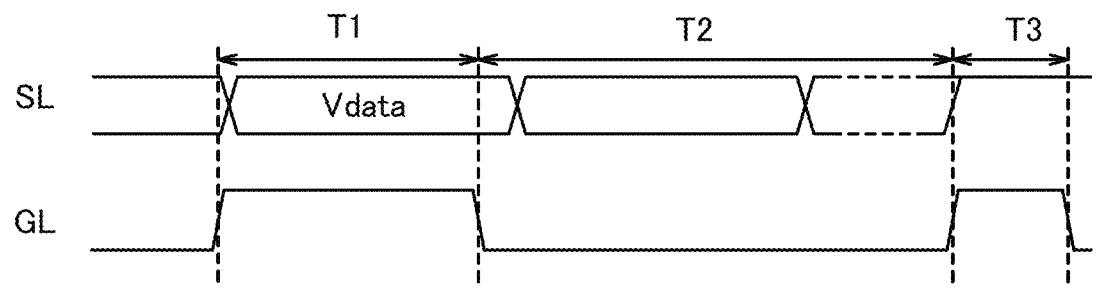

FIG. 21B shows an example of a timing chart of the potential of the gate line GL illustrated in FIG. 21A and an image signal supplied to the source line SL. Note that in the timing chart in FIG. 21B, all the transistors included in the pixel 10c are n-channel transistors.

A period T1 is a writing operation period and the light-emitting element 314 does not emit light during the period. A high-level potential is supplied to the gate line GL, and the transistors 311 and 313 are turned on. A potential $V_{data}$ is supplied to the source line SL as an image signal. The potential $V_{data}$ is supplied to the gate of the transistor 312 through the transistor 311.

It is preferable that, in the period T1, the potential of the wiring ML be lower than the sum of the potential of the wiring CTL and the threshold voltage $V_{the}$ of the light-emitting element 314, and that the potential of the wiring ANL be higher than the potential of the wiring ML. With the above configuration, the drain current of the transistor 312 can be made to flow preferentially through the wiring ML instead of the light-emitting element 314.

A period T2 is a light emission period and the light-emitting element 314 emits light during the period. A low-level potential is supplied to the gate line GL, and the transistors 311 and 313 are turned off. Since the transistor 311 is turned off, the potential $V_{data}$ is held at the gate of the transistor 312. A potential $V_{ano}$ is supplied to the wiring ANL, and a potential $V_{cat}$ is supplied to the wiring CTL. The potential $V_{ano}$ is preferably higher than the sum of the potential $V_{cat}$ and the threshold voltage $V_{the}$ of the light-emitting element 314. The potential difference between the wiring ANL and the wiring CTL allows the drain current of the transistor 312 to flow into the light-emitting element 314; thus, the light-emitting element 314 emits light.

A period T3 is a monitor period in which the drain current of the transistor 312 is obtained. A high-level potential is supplied to the gate line GL, and the transistors 311 and 313 are turned on. A potential that the gate voltage of the transistor 312 is higher than the threshold voltage $V_{th}$ thereof is applied to the source line SL. It is preferable that the potential of the wiring ML be lower than the sum of the potential of the wiring CTL and the threshold voltage $V_{the}$ of the light-emitting element 314, and that the potential of the wiring ANL be higher than the potential of the wiring ML. With the above configuration, the drain current of the transistor 312 can be made to flow preferentially through the wiring ML instead of the light-emitting element 314.

A current $I_{MON}$ output from the pixel 10c to the wiring ML in the period T3 corresponds to the drain current flowing into the transistor 312 during the light emission period. The current $I_{MON}$ is supplied to a monitor circuit. The monitor circuit analyzes the current $I_{MON}$ and generates a correction signal on the basis of the analysis result. Through the operation, deviation of the luminance of the pixels 10c can be corrected.

The monitor operation is not necessarily performed after the light-emitting operation. For example, in the pixel 10c, the monitor operation can be performed after the cycle of data writing operation and light-emitting operation is repeated plural times. Alternatively, after the monitor operation, the light-emitting element 314 may be brought into a non-light-emitting state by writing a data signal corresponding to the lowest grayscale level [0] to the pixel 10c.

As in the pixel 10b, an OS transistor is preferably used as the transistor 311 in the pixel 10c. In the case where an OS transistor is used as the transistor 311, the pixel 10c can perform the IDS driving. Consequently, power consumption of the display device 50 can be low.

The back gate is not necessarily provided in each of the transistors 311, 312, and 313 illustrated in FIG. 20 and FIG. 21A according to circumstances. The transistors 311, 312, and 313 not including the back gates can be fabricated by a simplified process.

Note that this embodiment can be combined with any of the other embodiments in this specification as appropriate.

Embodiment 4

In this embodiment, structure examples of the display device 50 described in the above embodiment is described with reference to FIGS. 22A to 22D, FIGS. 23A and 23B, FIGS. 24A and 24B, FIGS. 25A and 25B, FIGS. 26A to 26C, FIG. 27, and FIG. 28.

FIGS. 22A to 22D, FIGS. 23A and 23B, and FIGS. 24A and 24B are schematic cross-sectional views each illustrating the display device 50. Note that in the schematic cross-sectional views in FIGS. 22A to 22D, FIGS. 23A and 23B, and FIGS. 24A and 24B, only components necessary for describing the operation of a touch sensor are illustrated. For example, an element such as a transistor is provided over a substrate 411 in some cases but is not illustrated in these drawings.

<FIGS. 22A to 22D>

Figure 22A:
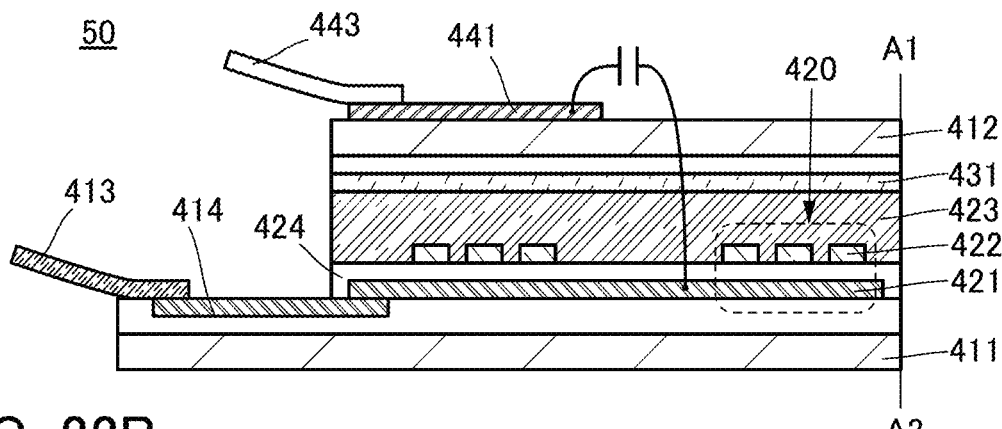
FIGS. 22A to 22D are schematic cross-sectional views each illustrating a structure example of a display device.

The display device 50 illustrated in FIG. 22A includes the substrate 411, a substrate 412, an FPC 413, a wiring 414, a liquid crystal element 420, a coloring film 431, an electrode 441, and the like.

The liquid crystal element 420 includes an electrode 421, an electrode 422, and a liquid crystal 423. The electrode 422 is positioned over the electrode 421 with an insulating film 424 provided therebetween. The electrode 421 functions as a common electrode of the liquid crystal element 420, and the electrode 422 functions as a pixel electrode.

The electrode 421 and the electrode 422 are provided so as to form an electric field that intersects the thickness direction of the liquid crystal 423 (the A1-A2 direction in the drawing). As the liquid crystal 423, a liquid crystal material that operates in an in-plane-switching (IPS) mode, a fringe field switching (FFS) mode, or a vertical alignment in-plane-switching (VA-IPS) mode can be used.

A touch sensor can perform detection by utilizing the capacitance formed between the electrode 441 provided on the substrate 412 side and the electrode 421 functioning as one of a pair of electrodes of the liquid crystal element 420.

The electrode 441 is formed over a surface of the substrate 412 on the display surface side (the side opposite to the substrate 411). The electrode 441 is electrically connected to an FPC 443 provided on the substrate 412 side. The electrode 421 is electrically connected to the FPC 413 provided on the substrate 411 side via the wiring 414.

Figure 22B:
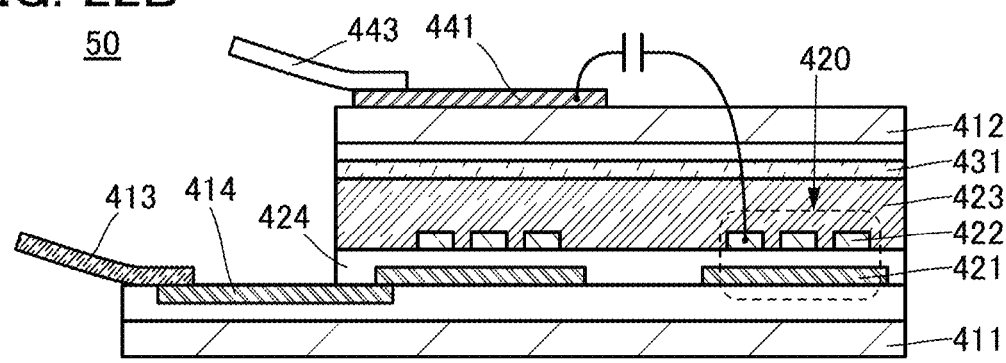

In the display device 50 illustrated in FIG. 22A, the electrode 421 and the electrode 422 may function as a pixel electrode and a common electrode, respectively, and a touch may be detected by utilizing the capacitance formed between the electrode 441 and the electrode 422. FIG. 22B is a schematic view illustrating the case.

Figure 22C:
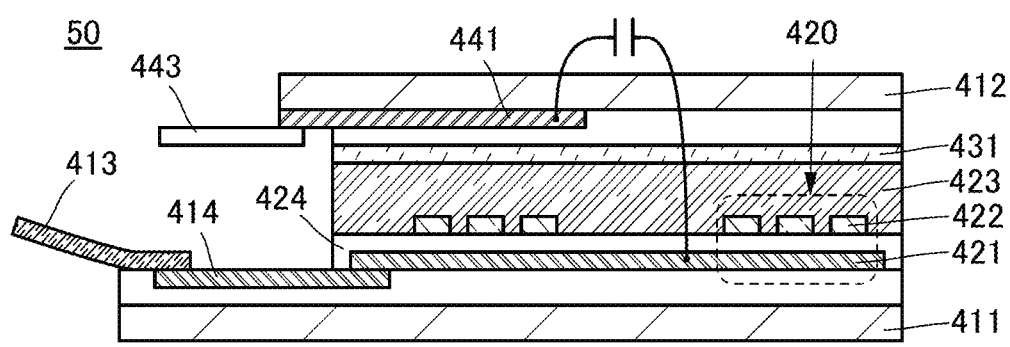

In the display device 50 illustrated in FIG. 22A, the electrode 441 may be provided between the substrate 412 and the liquid crystal 423. FIG. 22C is a schematic view illustrating the case.

Figure 22D:
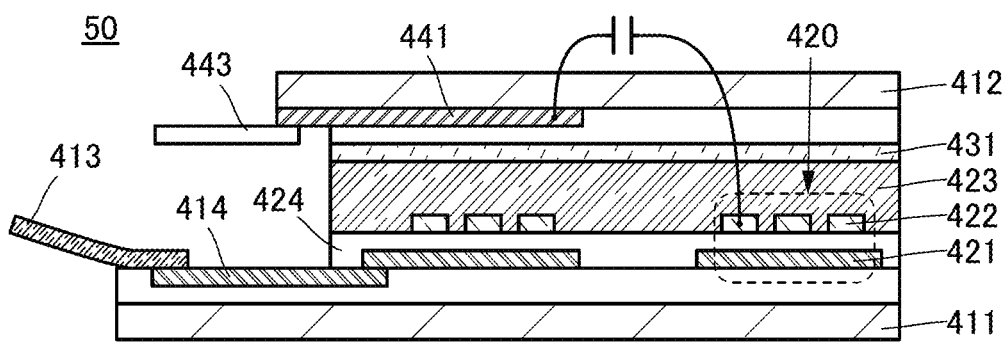

In the display device 50 illustrated in FIG. 22B, the electrode 441 may be provided between the substrate 412 and the liquid crystal 423. FIG. 22D is a schematic view illustrating the case.

In the structures illustrated in FIGS. 22A to 22D, the one electrode of the liquid crystal element 420 can also serve as one of a pair of electrodes of the touch sensor. Consequently, the manufacturing process can be simplified and the manufacturing costs can be reduced.

Figure 23A:
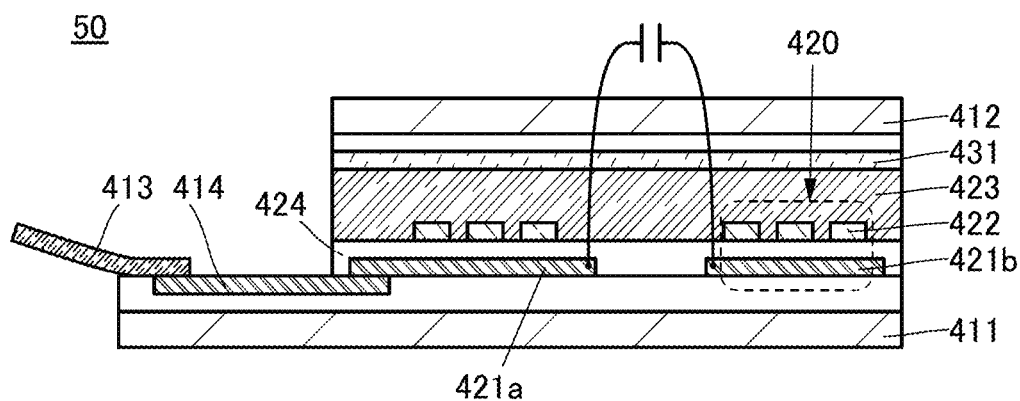
FIGS. 23A and 23B are schematic cross-sectional views each illustrating a structure example of a display device.
Figure 23B:
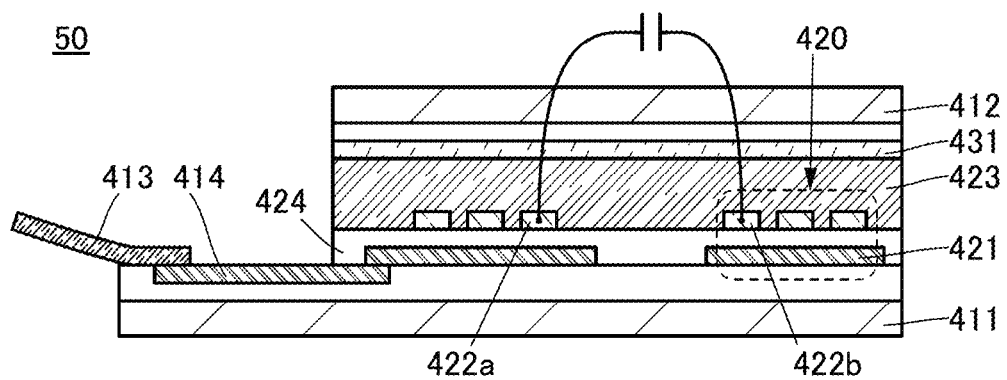

<FIGS. 23A and 23B>

In the display device 50 illustrated in FIG. 22A, the electrode 441 and the FPC 443 are not necessarily provided. FIG. 23A is a schematic view illustrating the case.

In FIG. 23A, electrodes 421a and 421b functioning as the common electrodes of the liquid crystal element 420 also function as the pair of electrodes of the touch sensor.

In the display device 50 illustrated in FIG. 23A, the electrode 422 may be used as a common electrode. FIG. 23B is a schematic cross-sectional view illustrating the case. In FIG. 23B, an electrode 422a and an electrode 422b function as the pair of electrodes of the touch sensor.

In the structure illustrated in FIG. 23A or FIG. 23B, the one electrode of the liquid crystal element 420 can serve as both of the pair of electrodes of the touch sensor. Thus, the manufacturing process can be simplified as compared with the cases illustrated in FIGS. 22A and 22B.

Figure 24A:
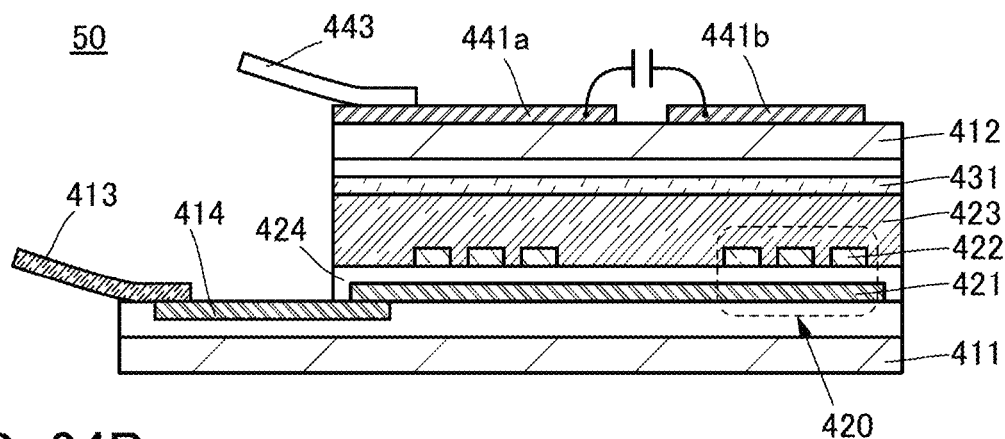
FIGS. 24A and 24B are schematic cross-sectional views each illustrating a structure example of a display device.
Figure 24B:
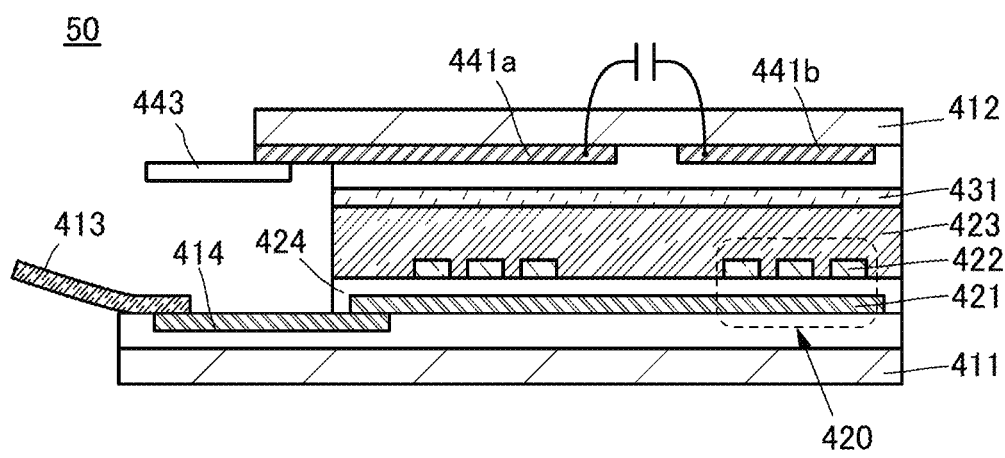

<FIGS. 24A and 24B>

In the display device 50 illustrated in FIG. 22A, the pair of electrodes of the touch sensor may be formed of only the electrode 441. FIG. 24A is a schematic cross-sectional view illustrating the case.

In FIG. 24A, an electrode 441a and an electrode 441b over the substrate 412 function as the pair of electrodes of the touch sensor.

In the display device 50 illustrated in FIG. 24A, the electrode 441a and the electrode 441b may be provided between the substrate 412 and the liquid crystal 423. FIG. 24B is a schematic cross-sectional view illustrating the case.

In FIG. 24A or FIG. 24B, the electrode 441a and the electrode 441b are spaced apart from the electrodes of the liquid crystal element 420 (the electrode 421 and the electrode 422). Therefore, an electric field formed by the electrode 441*a* and the electrode 441*b* does not interfere with an electric field formed by the liquid crystal element 420. Furthermore, the electrode 441*a* and the electrode 441*b* are spaced apart from a wiring, a transistor, and the like which are formed over the substrate 411 and might serve as noise generation sources. Therefore, the display device 50 illustrated in FIG. 24A or FIG. 24B can have a high touch sensitivity.

Figure 25A:
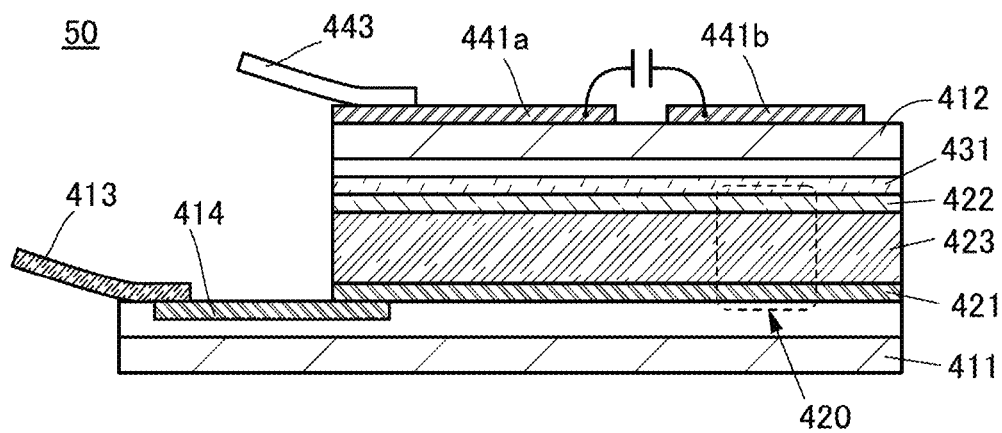
FIGS. 25A and 25B are schematic cross-sectional views each illustrating a structure example of a display device.
Figure 25B:
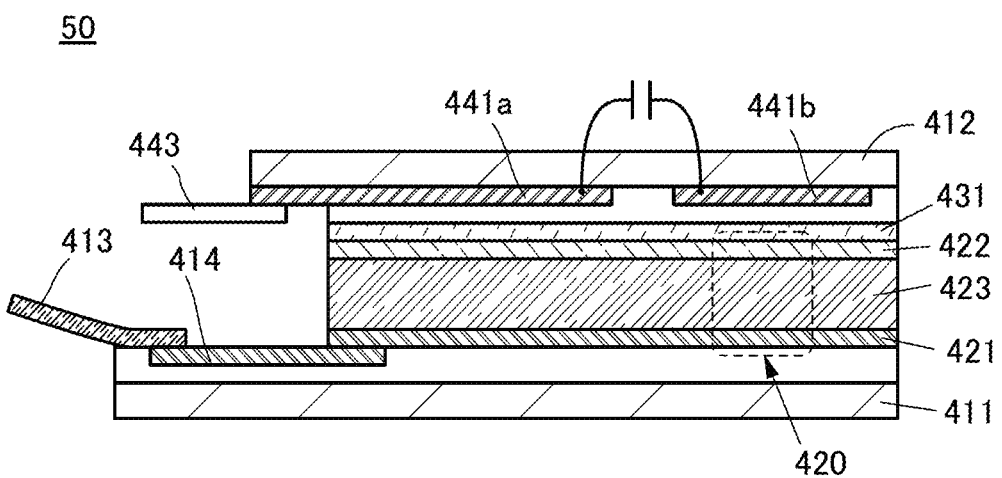

<FIGS. 25A and 25B>

In the case where the electrodes of the touch sensor are arranged as in FIG. 24A or FIG. 24B, a liquid crystal that enables display by application of an electric field perpendicular to the substrate 411 can be used as the liquid crystal 423. FIGS. 25A and 25B are schematic cross-sectional views illustrating the case.

In FIGS. 25A and 25B, the electrode 421 and the electrode 422 are vertically stacked with the liquid crystal 423 positioned therebetween. Also in this case, an electric field formed by the electrode 441*a* and the electrode 441*b* does not interfere with an electric field formed by the liquid crystal element 420. The liquid crystal 423 can employ a twisted nematic (TN) mode, a vertical alignment (VA) mode, a multi-domain vertical alignment (MVA) mode, an optically compensated birefringence (OCB) mode, or the like.

Figure 26A:
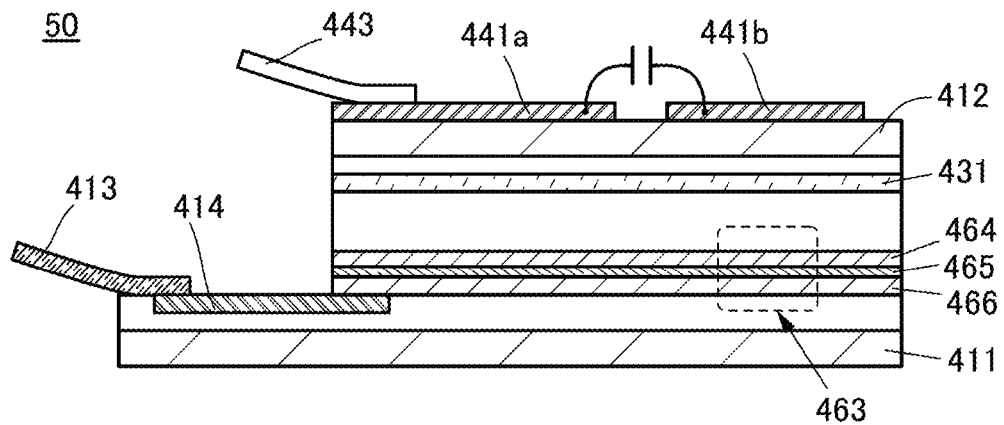
FIGS. 26A to 26C are schematic cross-sectional views each illustrating a structure example of a display device.
Figure 26B:
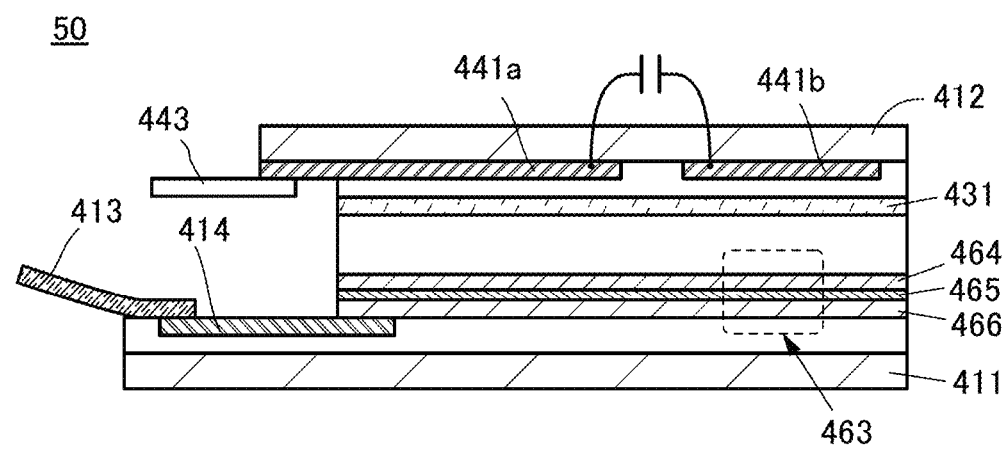
Figure 26C:
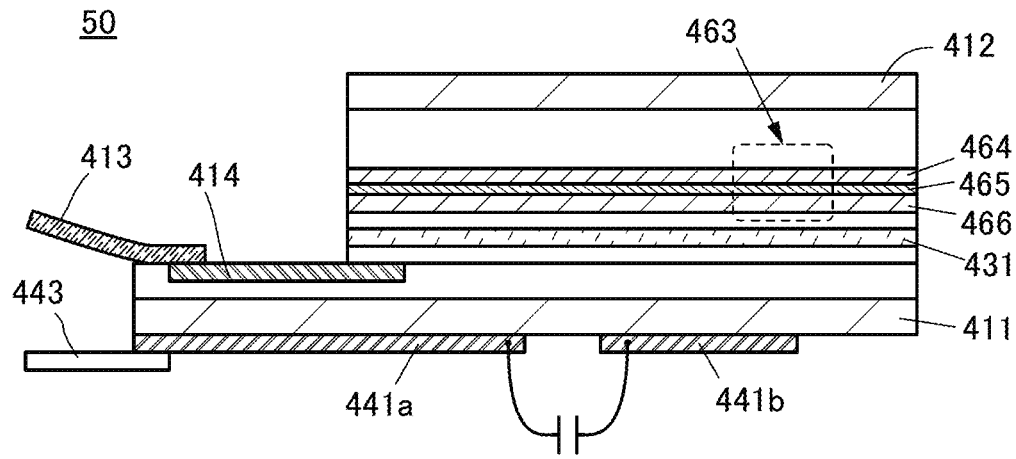

<FIGS. 26A to 26C>

In the case where the electrodes of the touch sensor are provided as in FIG. 24A or FIG. 24B, an EL element can be used as the display element. FIGS. 26A to 26C are schematic cross-sectional views illustrating the case.

In the display device 50 illustrated in FIG. 26A, the liquid crystal element 420 illustrated in FIG. 24A is replaced with an EL element 463. Similarly, in the display device 50 illustrated in FIG. 26B, the liquid crystal element 420 illustrated in FIG. 24B is replaced with the EL element 463.

In FIGS. 26A and 26B, the EL element 463 includes an electrode 464, an EL layer 465, and an electrode 466. The electrode 464 functions as one of an anode and a cathode of the EL element 463, and the electrode 466 functions as the other of the anode and the cathode of the EL element 463. The electrode 466 functions as a reflective film, and the electrode 464 has a function of transmitting visible light. The EL layer 465 includes a light-emitting layer, and, when voltage is applied between the electrode 464 and the electrode 466, current flows through the EL layer 465, so that the EL layer 465 emits light. The light emitted from the EL layer 465 is extracted to the outside through the coloring film 431 and the substrate 412.

In each of the display devices 50 illustrated in FIGS. 26A and 26B, the electrodes 441*a* and 441*b* may be provided on the substrate 411. FIG. 26C is a schematic cross-sectional view illustrating the case. In this case, the electrode 464 functions as a reflective film, and the electrode 466 has a function of transmitting visible light. The light emitted from the EL layer 465 is extracted to the outside through the coloring film 431 and the substrate 411. In FIG. 26C, the electrode 441*a* and the electrode 441*b* may be provided between the substrate 411 and the EL element 463.

In FIGS. 26A to 26C, an electric field formed by the electrode 441*a* and the electrode 441*b* is not blocked by the EL element 463. Thus, the touch sensor can have a high touch sensitivity.

More specific examples of the structure of the display device 50 are described with reference to FIG. 27 and FIG. 28.

<FIG. 27>

Figure 27:
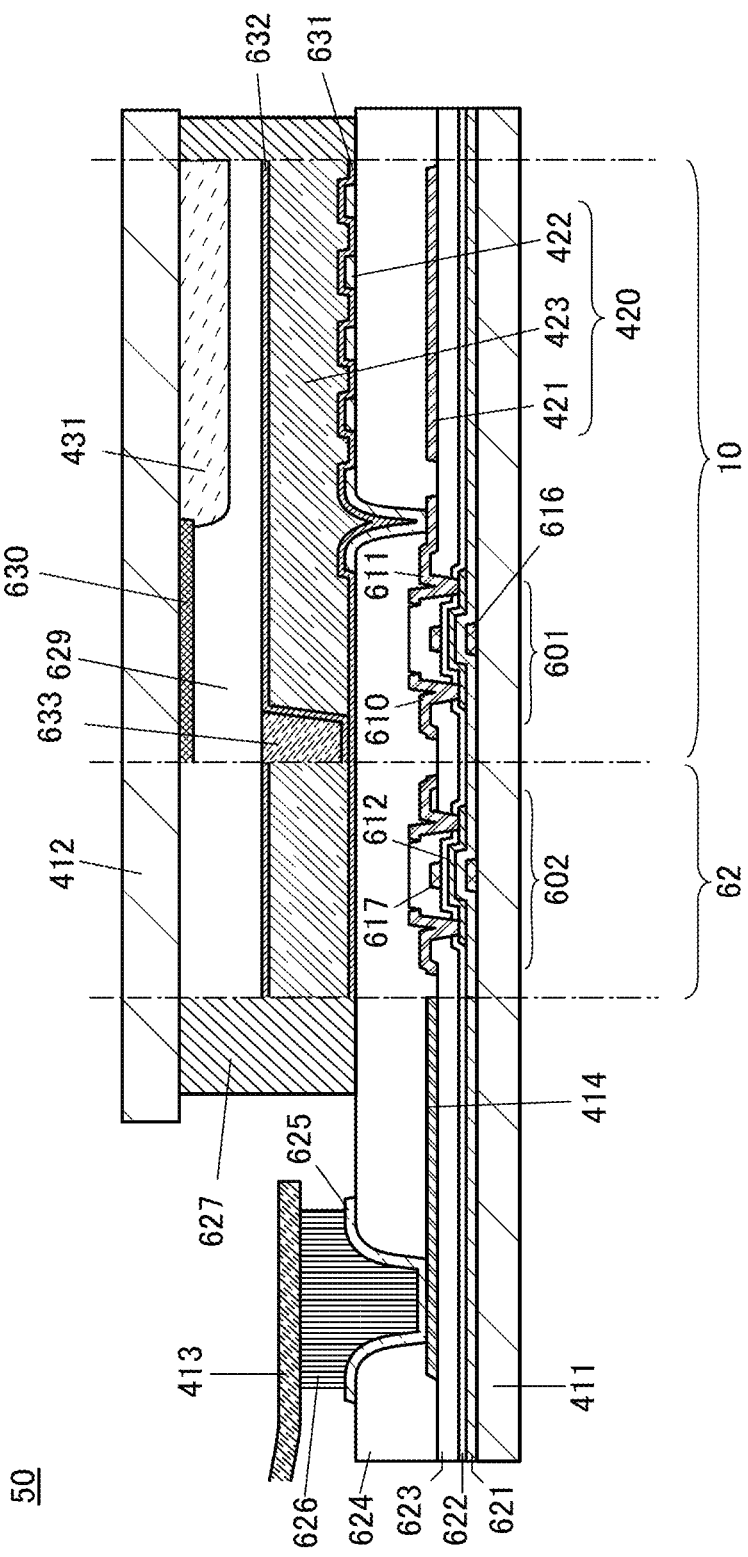
FIG. 27 is a cross-sectional view illustrating a structure example of a display device.

FIG. 27 is a cross-sectional view showing details of the schematic cross-sectional view of the display device 50 illustrated in FIG. 23A.

The display device illustrated in FIG. 27 includes an electrode 625, and the electrode 625 is electrically connected to a terminal of the FPC 413 via an anisotropic conductive layer 626. The electrode 625 is electrically connected to the wiring 414 in an opening formed in an insulating layer 624. The electrode 625 is formed of the same conductive layer as a first electrode 422.

The pixel 10 and the gate driver 62 provided over the first substrate 411 include a plurality of transistors. In FIG. 27, a transistor 601 included in the pixel 10 and a transistor 602 included in the gate driver 62 are illustrated as an example In FIG. 27, the insulating layer 624 is provided over the transistor 601 and the transistor 602.

<<Transistors 601 and 602>>

In the transistor 601 and the transistor 602, an electrode 616 is provided over the substrate 411, an insulating layer 621 is provided over the electrode 616, a semiconductor layer 612 is provided over the insulating layer 621, an insulating layer 622 is provided over the semiconductor layer 612, and an electrode 617 is provided over the insulating layer 622. An electrode 610 and an electrode 611 are in contact with the semiconductor layer 612. The electrode 610 and the electrode 611 are formed of the same conductive layer as the wiring 414.

In each of the transistors 601 and 602, the electrode 617 functions as a first gate electrode (top gate), the electrode 616 functions as a second gate electrode (back gate), the electrode 610 functions as one of a source electrode and a drain electrode, and the electrode 611 functions as the other of the source electrode and the drain electrode.

In the case where the transistor 601 and the transistor 602 each include the top gate and the back gate, the on-state current of the transistors can be increased. Moreover, the threshold voltage of the transistors can be controlled.

In each of the transistor 601 and the transistor 602, the semiconductor layer 612 functions as a channel formation region. The semiconductor layer 612 may be formed using a metal oxide, for example.

When a metal oxide is used for each of the semiconductor layer 612, the metal oxide preferably includes at least one of indium (In) and zinc (Zn). Typical examples of such oxide include In oxide, Zn oxide, In—Zn oxide, In-M-Zn oxide, In-M oxide, and Zn-M oxide (the element M is aluminum (Al), gallium (Ga), yttrium (Y), tin (Sn), boron (B), silicon (Si), titanium (T1), iron (Fe), nickel (Ni), germanium (Ge), zirconium (Zr), molybdenum (Mo), lanthanum (La), cerium (Ce), neodymium (Nd), vanadium (V), beryllium (Be), hafnium (Hf), tantalum (Ta), or tungsten (W), for example).

In the case where OS transistors are used as the transistors 601 and 602, the current in an off state (the off-state current) can be decreased. Accordingly, an electrical signal such as an image signal can be held for a longer period, and a writing interval can be set longer in an on state. Accordingly, the frequency of refresh operation can be reduced, which leads to an effect of suppressing power consumption.

<<Liquid Crystal Element 420>>

An example of a liquid crystal display panel using a liquid crystal element as a display element is illustrated in FIG. 27. In FIG. 27, the liquid crystal element 420 as a display element includes the first electrode 422, the second electrode 421, and the liquid crystal 423. Note that an alignment film 631 and an alignment film 632 are provided so that the liquid crystal 423 is interposed therebetween. The second electrode 421 is provided such that an electric field in the direction intersecting the thickness direction of the layer containing a liquid crystal material is formed between the second electrode 421 and the first electrode 422.

For example, a liquid crystal material that operates in an FFS mode, a VA-IPS mode, or an IPS mode can be used as the liquid crystal 423.

<<Substrate 411>>

For the substrate 411 or the like, an organic material, an inorganic material, a composite material of an organic material and an inorganic material, or the like can be used. For example, an inorganic material, such as glass, ceramic, or a metal, can be used for the substrate 411 or the like.

Specifically, non-alkali glass, soda-lime glass, potash glass, crystal glass, aluminosilicate glass, tempered glass, chemically tempered glass, quartz, sapphire, or the like can be used for the substrate 411 or the like. Specifically, an inorganic oxide film, an inorganic nitride film, an inorganic oxynitride film, or the like can be used for the substrate 411 or the like. For example, a silicon oxide film, a silicon nitride film, a silicon oxynitride film, an aluminum oxide film, or the like can be used for the substrate 411 or the like. Stainless steel, aluminum, or the like can be used for the substrate 411 or the like.

For example, a single crystal semiconductor substrate or a polycrystalline semiconductor substrate of silicon or silicon carbide, a compound semiconductor substrate of silicon germanium or the like, or an SOI substrate can be used for the substrate 411 or the like. Thus, a semiconductor element can be provided over the substrate 411 or the like.

For example, an organic material such as a resin, a resin film, or plastic can be used for the substrate 411 or the like. Specifically, a resin film or a resin plate of polyester, polyolefin, polyamide, polyimide, polycarbonate, an acrylic resin, or the like can be used for the substrate 411 or the like.

For example, a composite material formed by attaching a metal plate, a thin glass plate, or a film of an inorganic material to a resin film or the like can be used for the substrate 411 or the like. For example, a composite material formed by dispersing a fibrous or particulate metal, glass, inorganic material, or the like into a resin film can be used for the substrate 411 or the like. For example, a composite material formed by dispersing a fibrous or particulate resin, organic material, or the like into an inorganic material can be used for the substrate 411 or the like.

A single-layer material or a material obtained by stacking a plurality of layers can be used for the substrate 411 or the like. For example, a layered material in which a base, an insulating film that prevents diffusion of impurities contained in the base, and the like are stacked can be used for the substrate 411 or the like. Specifically, a material obtained by stacking glass and one or a plurality of films that are selected from a silicon oxide layer, a silicon nitride layer, a silicon oxynitride layer, and the like and that prevent diffusion of impurities contained in the glass can be used for the substrate 411 or the like. Alternatively, a material obtained by stacking a resin and a film that prevents diffusion of impurities that penetrate the resin, such as a silicon oxide film, a silicon nitride film, or a silicon oxynitride film, can be used for the substrate 411 or the like.

Specifically, a resin film, a resin plate, a layered material, or the like of polyester, polyolefin, polyamide, polyimide, polycarbonate, an acrylic resin, or the like can be used for the substrate 411 or the like.

Specifically, a material including polyester, polyolefin, polyamide (e.g., nylon or aramid), polyimide, polycarbonate, polyurethane, an acrylic resin, an epoxy resin, or a resin having a siloxane bond, such as silicone, can be used for the substrate 411 or the like.

Specifically, polyethylene terephthalate (PET), polyethylene naphthalate (PEN), polyethersulfone (PES), an acrylic resin, or the like can be used for the substrate 411 or the like. Alternatively, a cycloolefin polymer (COP), a cycloolefin copolymer (COC), or the like can be used.

Alternatively, paper, wood, or the like can be used for the substrate 411 or the like.

For example, a flexible substrate can be used for the substrate 411 or the like.

Note that a transistor, a capacitor, or the like can be directly formed on the substrate. Alternatively, a transistor, a capacitor, or the like can be formed over a substrate which is for use in the manufacturing process and can withstand heat applied in the manufacturing process, and then the transistor, the capacitor, or the like can be transferred to the substrate 411 or the like. Thus, a transistor, a capacitor, or the like can be formed over a flexible substrate, for example <<Substrate 412>>

For example, a material that can be used for the substrate 411 can be used for the substrate 412. For example, a light-transmitting material that can be used for the substrate 411 can be used for the substrate 412. Alternatively, a material having a surface provided with an antireflective film with a thickness of 1 μm or less can be used for the substrate 412. Specifically, a stack including three or more, preferably five or more, further preferably 15 or more dielectrics can be used for the substrate 412. This allows reflectivity to be as low as 0.5% or less, preferably 0.08% or less. Alternatively, a material with low birefringence that can be used for the substrate 411 can be used for the substrate 412.

For example, aluminosilicate glass, tempered glass, chemically tempered glass, sapphire, or the like can be favorably used for the substrate 412 that is on the side closer to a user of the display panel. This can prevent breakage or damage of the display panel caused by the use.

For example, a resin film of a cycloolefin polymer (COP), a cycloolefin copolymer (COC), or triacetyl cellulose (TAC) can be favorably used for the substrate 412. As a result, the weight can be reduced. Alternatively, for example, the display panel can be made less likely to suffer from damage by dropping or the like.

<<Coloring Film 431, Light-Blocking Film 630, and Insulating Layer 629>>

The coloring film 431, a light-blocking film 630, an insulating layer 629, and the like are provided on a surface of the substrate 412 on the substrate 411 side.

The coloring film 431 has a function of transmitting light of a predetermined color. That is, the coloring film 431 functions as a color filter.

The light-blocking film 630 has a function of suppressing light transmission. That is, the light-blocking film 630 functions as a black matrix. Specifically, a resin containing a pigment or dye can be used for the light-blocking film 630. For example, a resin in which carbon black is dispersed can be used for the light-blocking film 630. Alternatively, an inorganic compound, an inorganic oxide, a composite oxide containing a solution of a plurality of inorganic oxides, or the like can be used for the light-blocking film 630. Specifically, a black chromium film, a film containing cupric oxide, or a film containing copper chloride or tellurium chloride can be used for the light-blocking film 630.

The insulating layer 629 functions as an overcoat preventing impurities contained in the coloring film 431, the light-blocking film 630, and the like from diffusing into the liquid crystal 423. The insulating layer 629 also has a function of reducing unevenness caused by the coloring film 431 and the light-blocking film 630.

<<Other Components>>

A spacer 633 is a columnar spacer obtained by selective etching of an insulating layer and is provided in order to control the distance (a cell gap) between the insulating layer 629 and the insulating layer 624. Alternatively, a spherical spacer may be used.

A glass material such as a glass frit, or a resin material such as a resin that is curable at room temperature such as a two-component-mixture-type resin, a light curable resin, and a thermosetting resin can be used for a sealant 627. A drying agent may be contained in the sealant 627.

If needed, the substrate 412 may be provided with an optical film such as a polarizing plate, a circularly polarizing plate (including an elliptically polarizing plate), or a retardation plate as appropriate. Furthermore, the polarizing plate or the circularly polarizing plate may be provided with an anti-reflection film. For example, anti-glare treatment by which reflected light can be diffused by projections and depressions on a surface so as to reduce the glare can be performed.

<FIG. 28>

Figure 28:
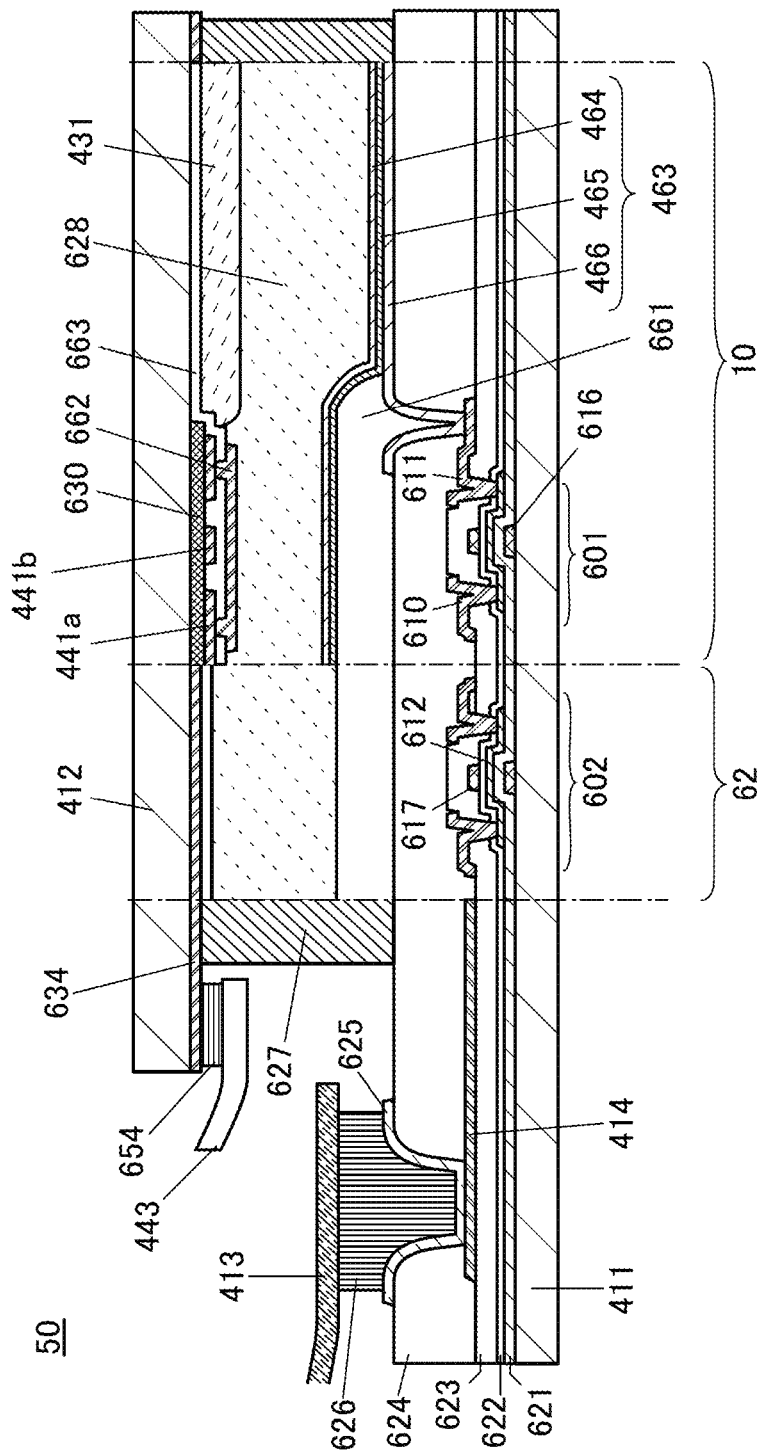
FIG. 28 is a cross-sectional view illustrating a structure example of a display device.

FIG. 28 is a cross-sectional view showing details of the schematic cross-sectional view of the display device 50 illustrated in FIG. 26B. Note that the same portions in FIG. 27 and FIG. 28 are denoted by the same reference numeral and description thereof is omitted.

FIG. 28 illustrates an example of a display panel including, as a display element, a light-emitting element such as an EL element. In the description given below, the EL element 463 is an organic EL element.

<<EL Element 463>>

In FIG. 28, the EL element 463 is electrically connected to the transistor 601 provided in the pixel 10. Note that the structure of the EL element 463 is not limited to the structure in which the first electrode 466, the EL layer 465, and the second electrode 464 are stacked. The structure of the EL element 463 can be changed as appropriate depending on the direction in which light is extracted from the EL element 463, or the like.

A partition wall 661 is formed using an organic insulating material or an inorganic insulating material. It is particularly preferable that the partition wall 661 be formed using a photosensitive resin material to have an opening over the first electrode 466 so that a side surface of the opening slopes with continuous curvature.

The EL layer 465 may be formed as a single layer or a plurality of layers stacked.

When the EL element 463 has a microcavity structure, light with high color purity can be extracted. Furthermore, when a microcavity structure and a color filter are used in combination, the glare can be reduced and visibility of a display image can be increased.

The first electrode 466 and the second electrode 464 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode 466 and the second electrode 464 can be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and nitrides thereof.

The first electrode 466 and the second electrode 464 can be formed using a conductive composition including a conductive macromolecule (also referred to as a conductive polymer). As the conductive macromolecule, a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

In order to extract light emitted from the EL element 463 to the outside, at least one of the first electrode 466 and the second electrode 464 is transparent. In FIG. 28, the second electrode 464 is preferably transparent in order to extract light through the substrate 412.

A protective layer may be formed over the second electrode 464 and the partition wall 661 in order to prevent entry of oxygen, hydrogen, moisture, carbon dioxide, or the like into the EL element 463. For the protective layer, silicon nitride, silicon nitride oxide, aluminum oxide, aluminum nitride, aluminum oxynitride, aluminum nitride oxide, diamond like carbon (DLC), or the like can be formed. A filler 628 is provided in a space sealed with the first substrate 411, the second substrate 412, and the sealant 627. It is preferable that the display panel be packaged (sealed) with a protective film (such as a laminate film or an ultraviolet curable resin film) or a cover member with high air-tightness and little degasification so that the EL element 463 is not exposed to the outside air, in this manner.

As the filler 628, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 628.

<<Other Components>>

The coloring film 431, the light-blocking film 630, a wiring 634, a wiring 662, the electrode 441a, the electrode 441b, an insulating layer 663, and the like are provided on the surface of the substrate 412 on the substrate 411 side. The wiring 634 is electrically connected to a terminal of the FPC 443 via an anisotropic conductive layer 654.

The wiring 634 and the electrodes 441a and 441b are concurrently formed using the same conductive material.

If needed, the substrate 412 may be provided with an optical film such as a polarizing plate, a circularly polarizing plate (including an elliptically polarizing plate), or a retardation plate as appropriate as in the description of FIG. 27. Furthermore, the polarizing plate or the circularly polarizing plate may be provided with an anti-reflection film. For example, anti-glare treatment by which reflected light can be diffused by projections and depressions on a surface so as to reduce the glare can be performed.

Note that this embodiment can be combined with any of the other embodiments in this specification as appropriate.

Embodiment 5

In this embodiment, a structure example of the source driver IC 64 mentioned in the above embodiment is described with reference to FIGS. 29A and 29B.

Figure 29A:
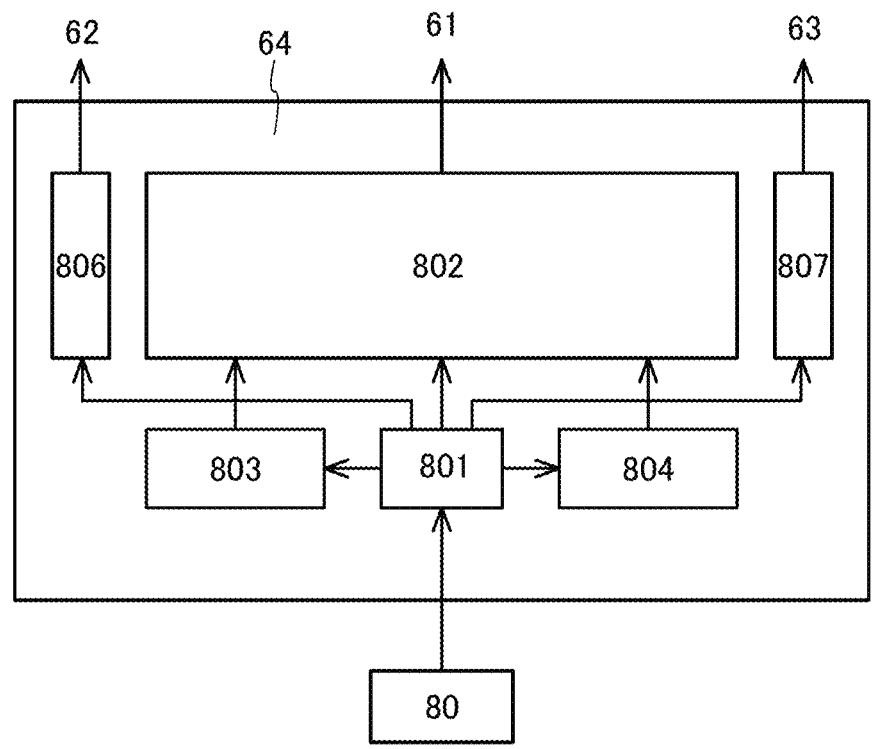
FIGS. 29A and 29B are block diagrams each illustrating a structure example of a source driver.
Figure 29B:
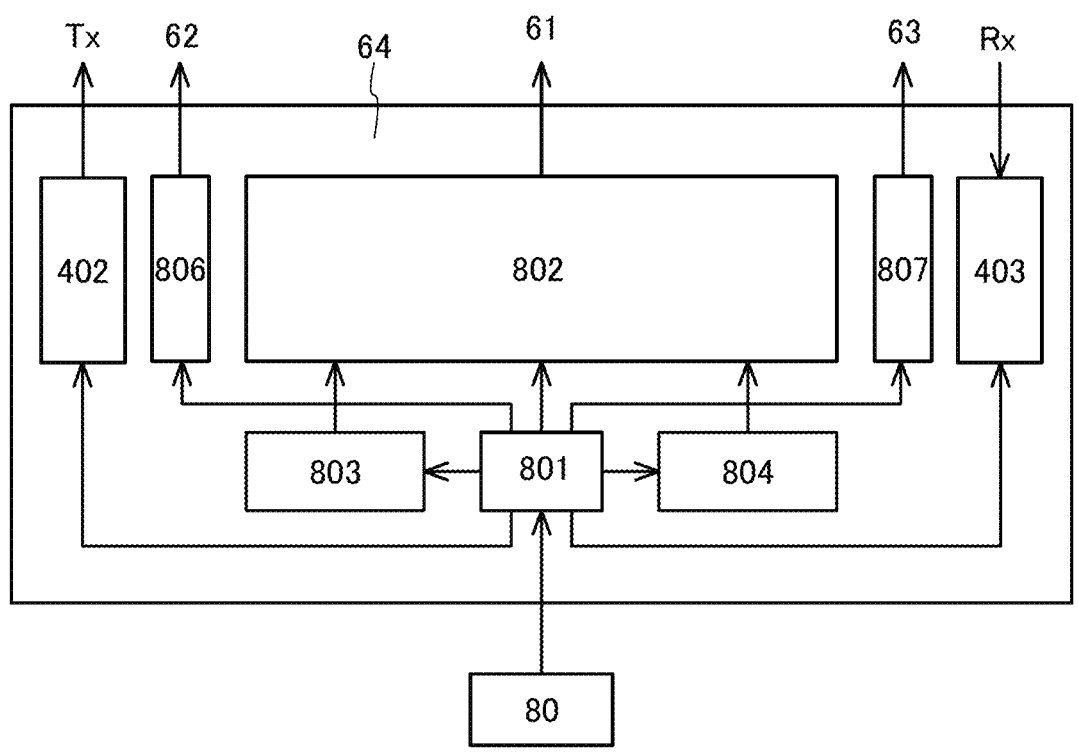

FIGS. 29A and 29B are block diagrams of the source driver IC 64 in the case where a hybrid element including a reflective element and a light-emitting element is used for the pixel 10.

The source driver IC 64 illustrated in FIG. 29A includes a control circuit 801, a driver 802, a frame memory 803, a frame memory 804, a gate driver signal generation circuit 806, and a gate driver signal generation circuit 807.

The control circuit 801 has a function of receiving a signal from the application processor 80 and transmitting the signal to each circuit included in the source driver IC 64. Examples of interface standards of the signal transmitted from the application processor 80 to the control circuit 801 include a mobile industry processor interface (MIPI) and a serial peripheral interface (SPI).

The driver 802 has a function of supplying an image signal to the pixel array 61.

The frame memory 803 has a function of storing the image signal temporarily.

The gate driver signal generation circuit 806 and the gate driver signal generation circuit 807 have a function of supplying a signal to the gate driver 62 and the gate driver 63, respectively.

One of the gate driver signal generation circuit 806 and the gate driver signal generation circuit 807 has a function of generating a signal for driving the reflective element of the pixel 10 and the other of the gate driver signal generation circuit 806 and the gate driver signal generation circuit 807 has a function of generating a signal for driving the light-emitting element of the pixel 10.

The source driver IC 64 may also function as the touch sensor IC 72 illustrated in FIG. 1. FIG. 29B shows a block diagram in that case.

In the source driver IC 64 illustrated in FIG. 29B, the driver circuit 402 and the detection circuit 403 illustrated in FIG. 2 are added to the block diagram of FIG. 29A. When the touch sensor IC 72 is included in the source driver IC 64 in this manner, manufacturing costs of the display device can be reduced.

In the case where the driver circuit 402 and the detection circuit 403 are included in one IC, those two circuits are preferably apart from each other. When the driver circuit 402 is near the detection circuit 403, the detection sensitivity of the detection circuit 403 deteriorates by the influence of noise generated by the driver circuit 402 and detection of a touch becomes difficult in some cases. Therefore, the driver circuit 402 and the detection circuit 403 are preferably positioned with a circuit such as the gate driver signal generation circuit 806 or 807 or the driver 802 provided therebetween.

Here, it is assumed that the gate driver 62 and the gate driver 63 drive the liquid crystal element and the light-emitting element, respectively. That is, it is assumed that the gate driver signal generation circuit 806 generates a signal for driving the liquid crystal element and the gate driver signal generation circuit 807 generates a signal for driving the light-emitting element. At this time, the driver circuit 402 and the detection circuit 403 are preferably near the gate driver signal generation circuit 806 and the gate driver signal generation circuit 807, respectively.

The drive voltage of a light-emitting element is generally lower than that of a liquid crystal element. Thus, the amplitude of a voltage output from the gate driver signal generation circuit 807 is lower than that of a voltage output from the gate driver signal generation circuit 806. It can be said that noise generated by the gate driver signal generation circuit 807 is smaller than that generated by the gate driver signal generation circuit 806. Therefore, the detection circuit 403 is preferably provided at a position that is closer to the gate driver signal generation circuit 807 than to the gate driver signal generation circuit 806.

Note that this embodiment can be combined with any of the other embodiments in this specification as appropriate.

Embodiment 6

In this embodiment, a display unit 700 that can be used as the display unit 60 described in the above embodiment is described with reference to FIGS. 30A to 30D, FIGS. 31A and 31B, FIGS. 32A to 32C, FIGS. 33A to 33C, FIG. 34, FIGS. 35A and 35B, FIG. 36, FIGS. 37A to 37C, and FIGS. 38A and 38B.

Figure 30A:
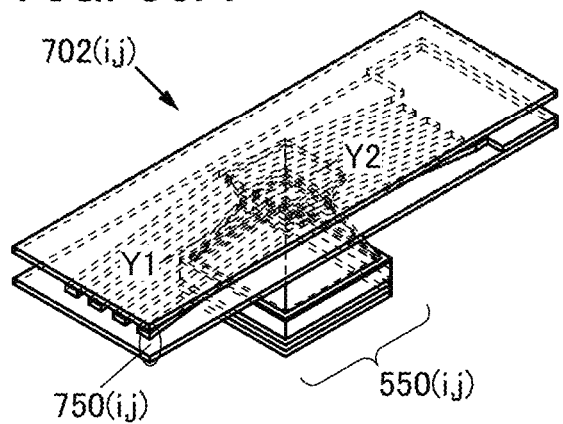
FIGS. 30A to 30D are schematic views illustrating a structure of a pixel of a display unit.
Figure 30B:
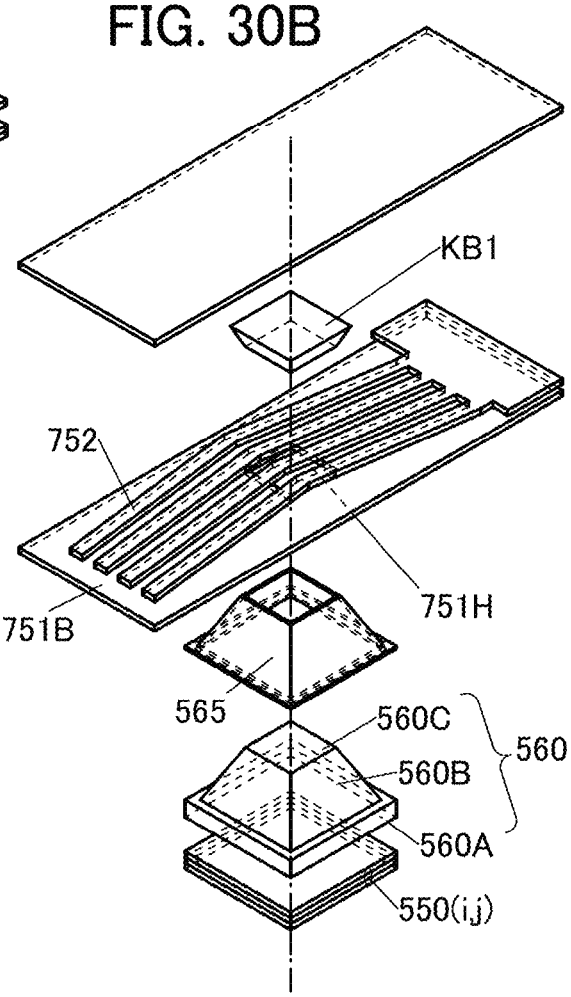
Figure 30C:
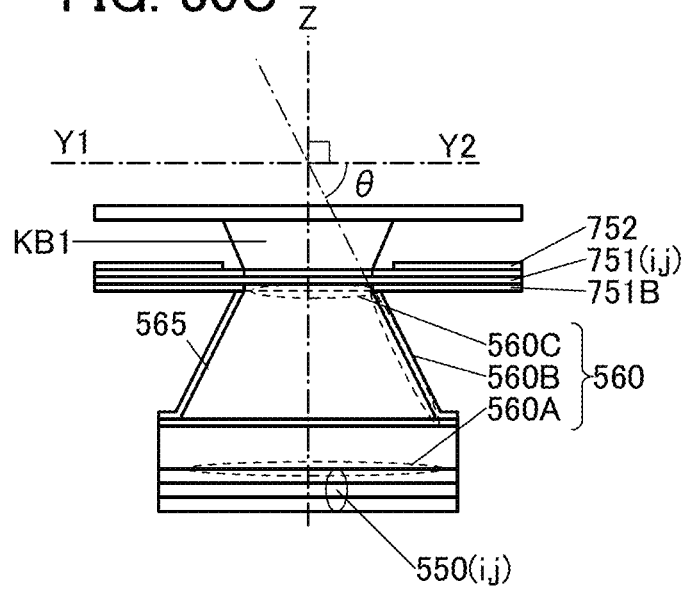
Figure 30D:
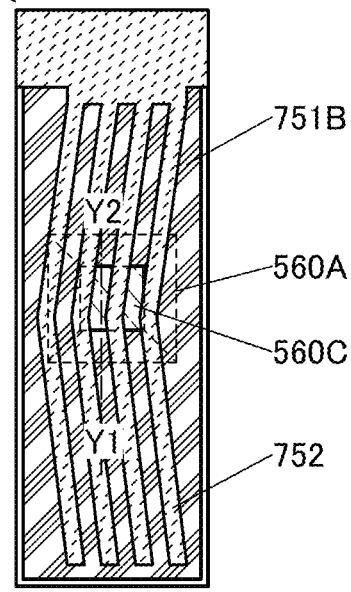

FIGS. 30A to 30D illustrate the structure of the display unit 700. FIG. 30A is a projection view of a pixel, and FIG. 30B is an exploded view illustrating part of the structure of the pixel in FIG. 30A. FIG. 30C is a cross-sectional view that is taken along line Y1-Y2 in FIG. 30A and illustrates part of the structure of the pixel. FIG. 30D is a top view of the pixel in FIG. 30A.

Figure 31A:
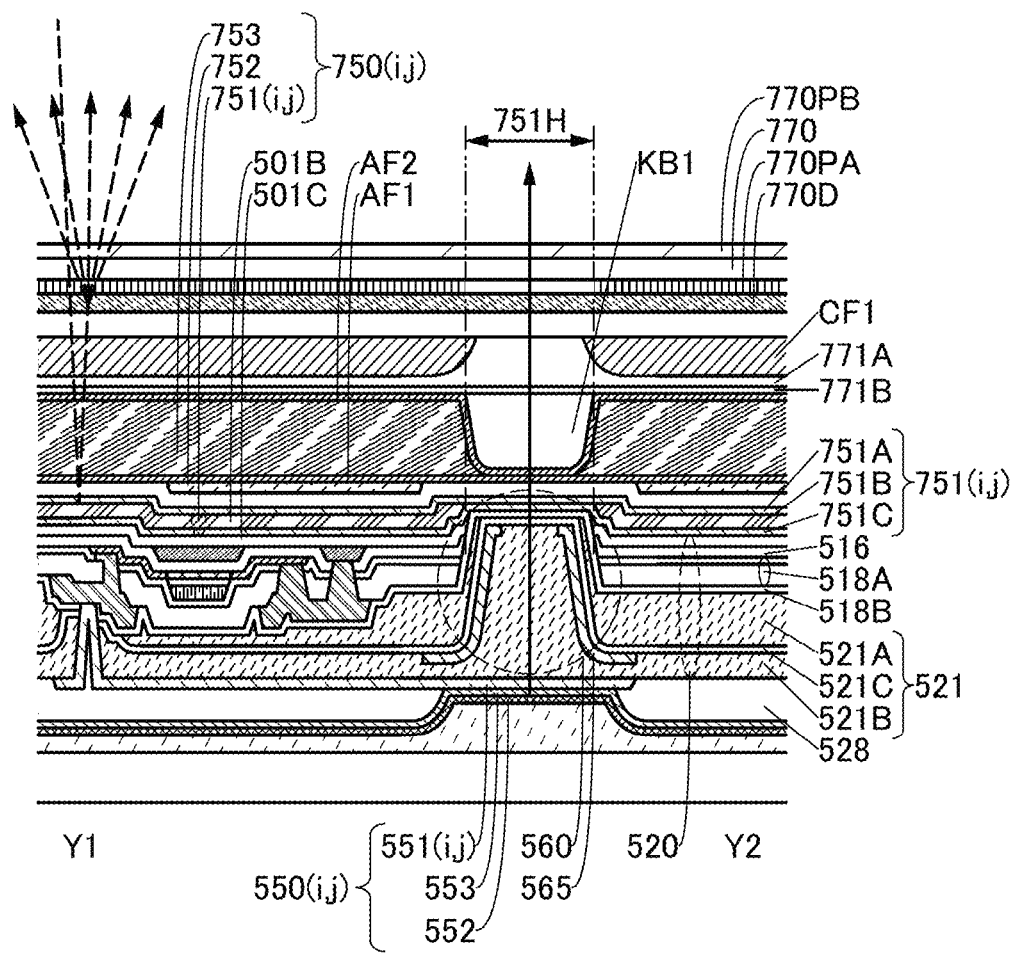
FIGS. 31A and 31B are cross-sectional views illustrating a structure of a pixel of a display unit.
Figure 31B:
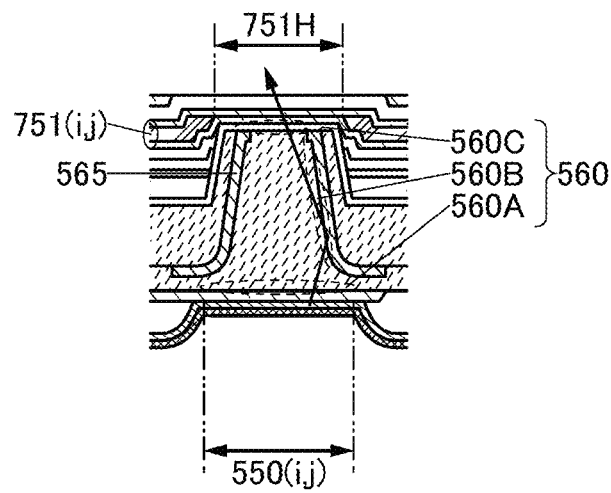

FIGS. 31A and 31B illustrate the structure of the display unit 700. FIG. 31A is a cross-sectional view of the pixel taken along line Y1-Y2 in FIG. 30A. FIG. 31B is a cross-sectional view illustrating part of the structure of the pixel in FIG. 31A.

Figure 32A:
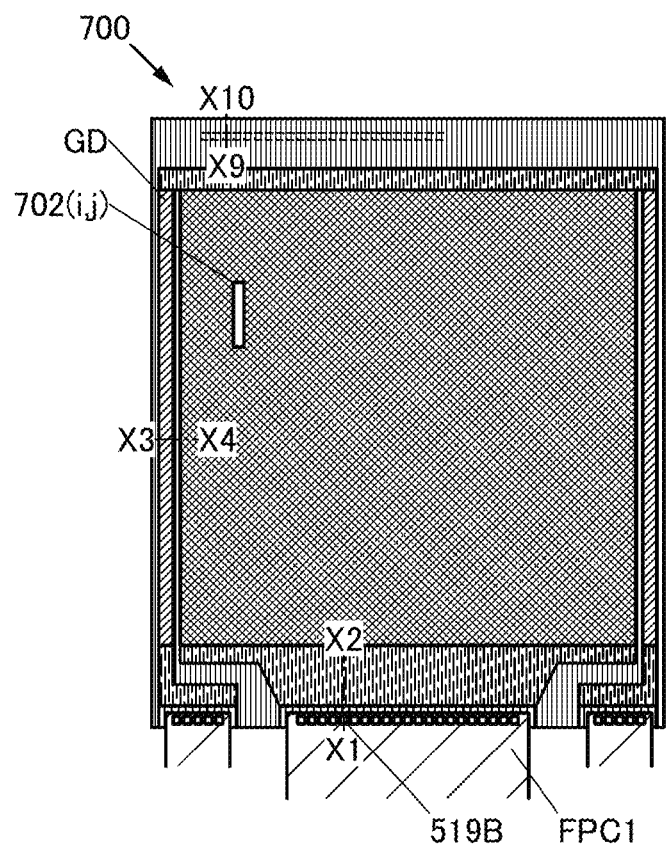
FIGS. 32A to 32C are top views and a cross-sectional view illustrating a structure of a display unit.
Figure 32B:
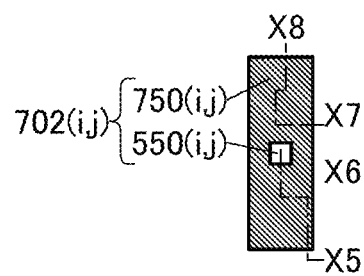
Figure 32C:
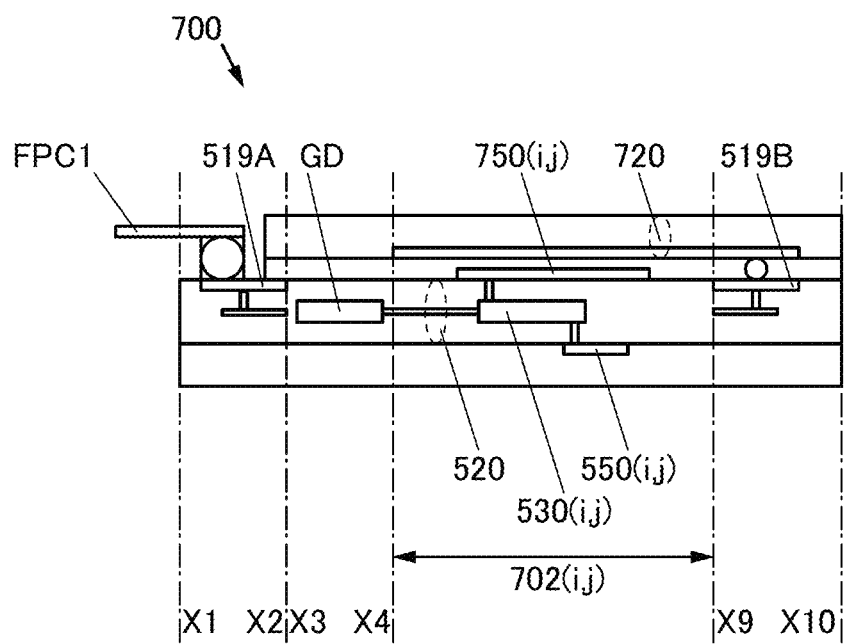

FIGS. 32A to 32C illustrate the structure of the display unit 700. FIG. 32A is a top view of the display unit 700. FIG. 32B is a top view illustrating part of the pixel of the display unit 700 in FIG. 32A. FIG. 32C is a schematic view illustrating a cross-sectional structure of the display unit 700 in FIG. 32A.

Figure 33A:
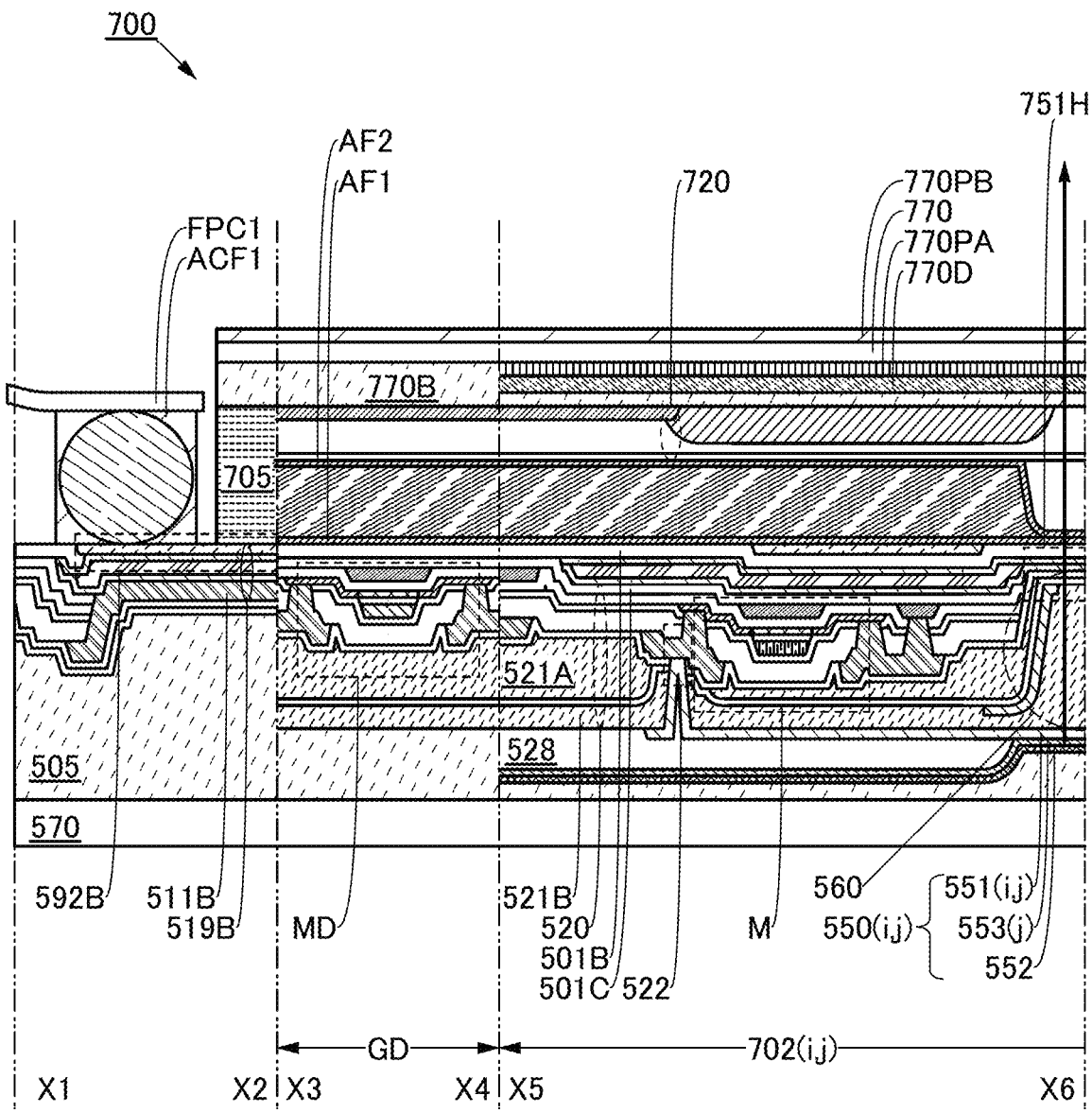
FIGS. 33A to 33C are cross-sectional views illustrating a structure of a display unit.
Figure 33B:
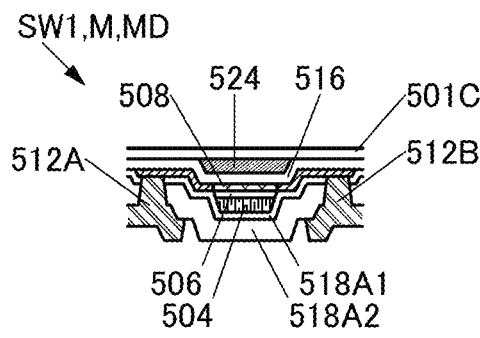
Figure 33C:
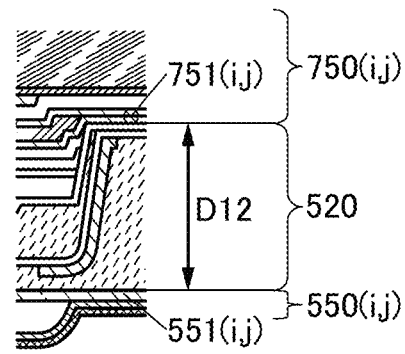

FIGS. 33A to 33C and FIG. 34 are cross-sectional views illustrating the structure of the display unit 700. FIG. 33A is a cross-sectional view taken along line X1-X2 and line X3-X4 in FIG. 32A, and line X5-X6 in FIG. 32B. FIGS. 33B and 33C each illustrate part of FIG. 33A.

Figure 34:
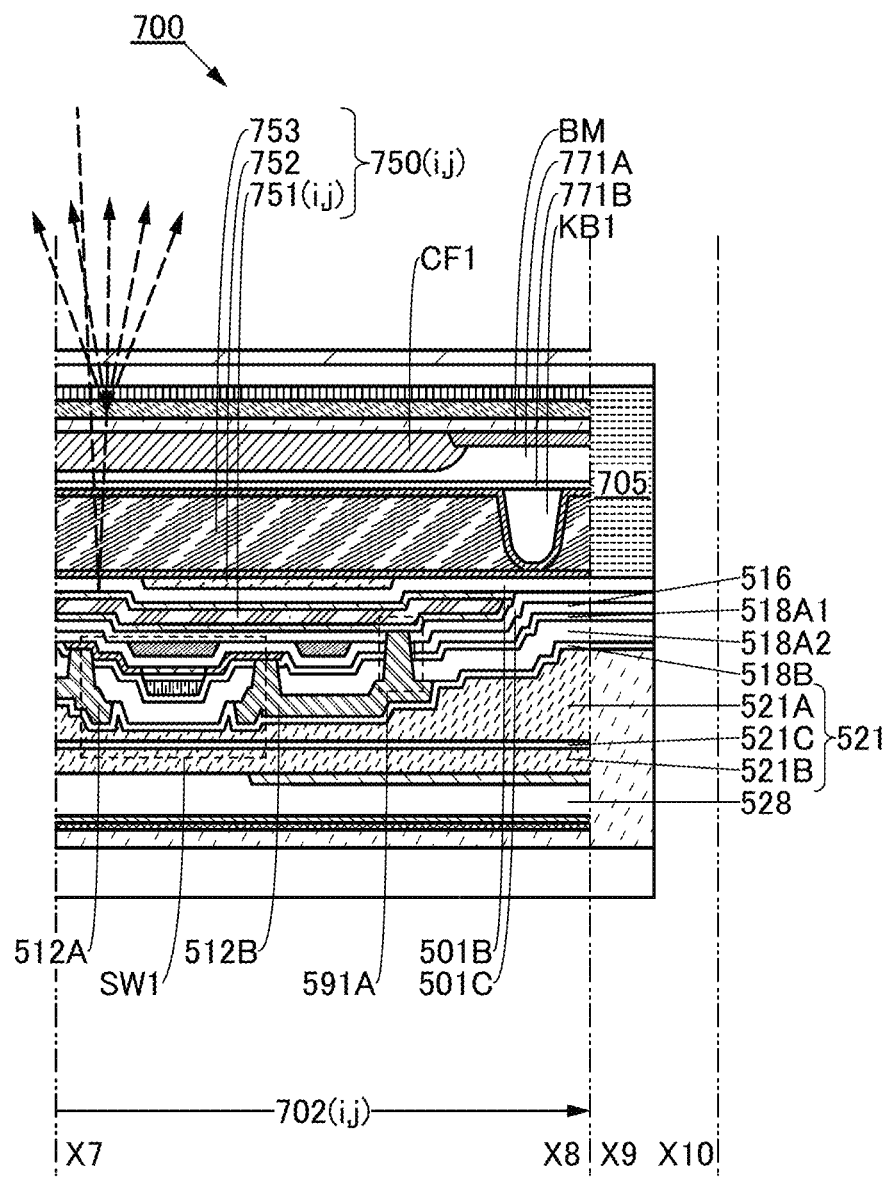
FIG. 34 is a cross-sectional view illustrating a structure of a display unit.

FIG. 34 is a cross-sectional view taken along line X7-X8 in FIG. 32B and line X9-X10 in FIG. 32A.

Figure 35A:
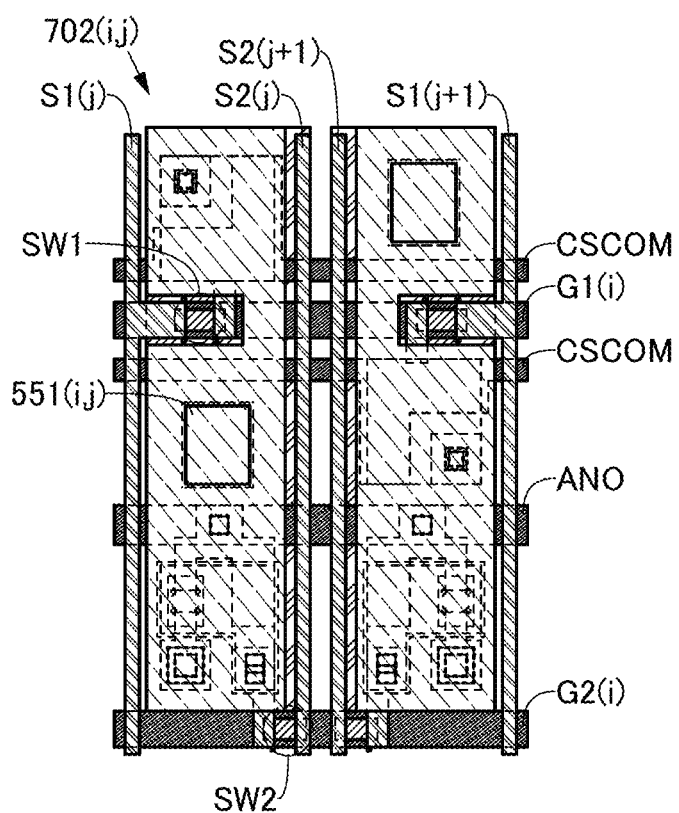
FIGS. 35A and 35B are bottom views illustrating a structure of a pixel of a display unit.
Figure 35B:
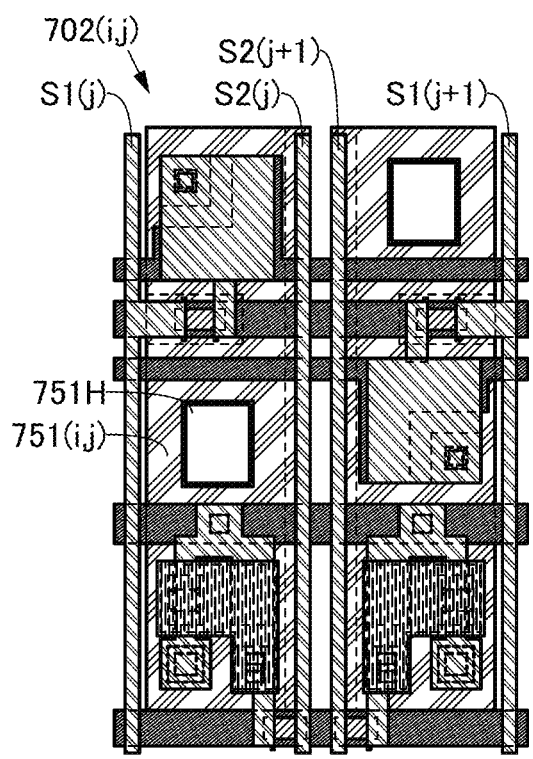

FIGS. 35A and 35B are bottom views each illustrating part of a pixel that can be used for the display unit 700 illustrated in FIG. 32A.

Figure 36:
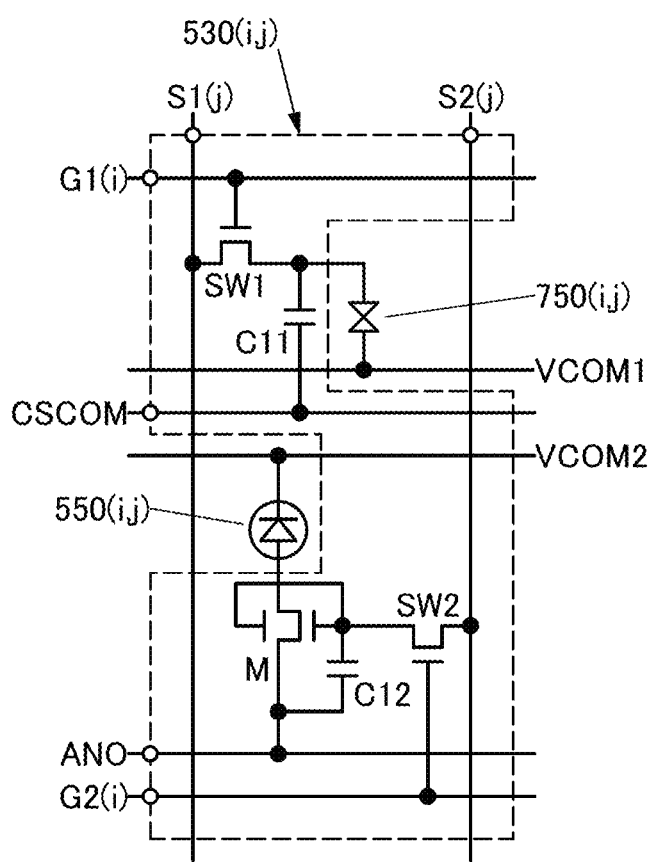
FIG. 36 is a circuit diagram illustrating a pixel circuit of a display unit.

FIG. 36 is a circuit diagram illustrating the configuration of a pixel circuit included in the display unit 700.

Figure 37A:
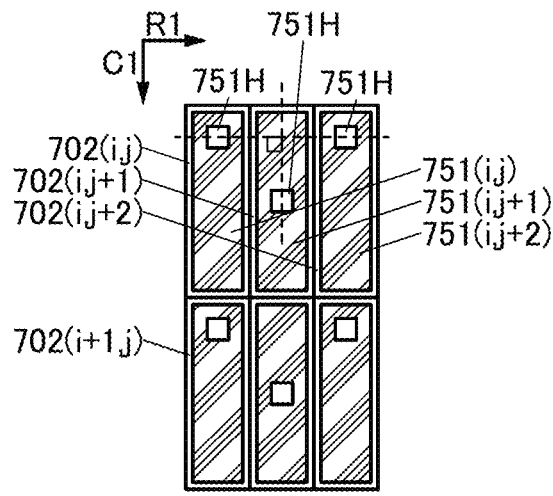
FIGS. 37A to 37C are top views each illustrating a structure of a reflective film of a display unit.
Figure 37B:
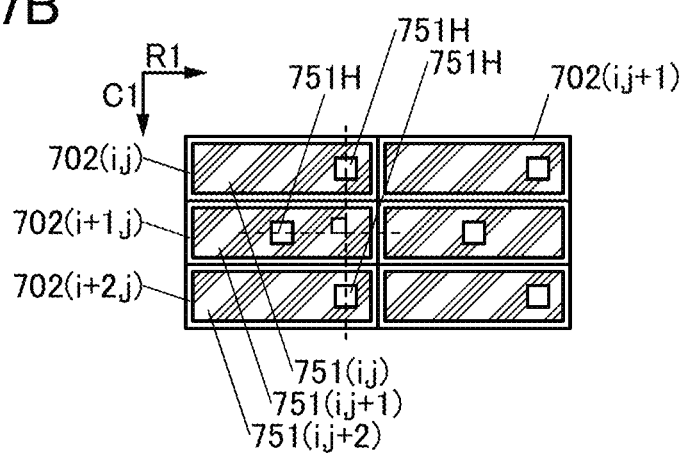
Figure 37C:
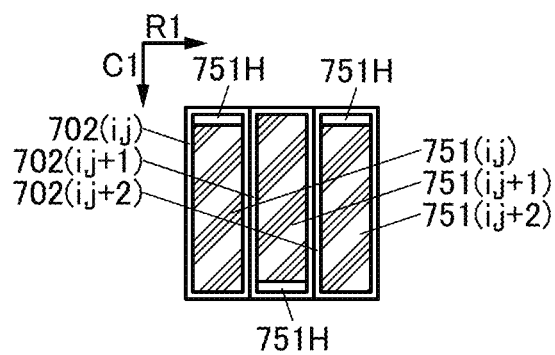

FIGS. 37A to 37C are top views each illustrating the structure of a reflective film of the display unit 700.

Structure Example 1 of Display Panel

The display unit 700 described in this embodiment includes a pixel 702(i,j) (see FIG. 32A).

Structure Example 1 of Pixel

The pixel 702h(i,j) includes a functional layer 520, a first display element 750(i,j), and a second display element 550(i,j) (see FIG. 32C).

The functional layer 520 includes a pixel circuit 530(i,j). The functional layer 520 includes a region positioned between the first display element 750(i,j) and the second display element 550(i,j).

The pixel circuit 530(i,j) is electrically connected to the first display element 750(i,j) and the second display element 550(i,j).

Structure Example 1 of First Display Element 750(i,j)

The first display element 750(i,j) includes a first electrode 751(i,j), a second electrode 752, a layer 753 containing a liquid crystal material, and a reflective film 751B (see FIG. 30B and FIG. 31A). The first display element 750(i,j) has a function of controlling the light reflected by the reflective film 751B.

The second electrode 752 is provided such that an electric field in the direction intersecting the thickness direction of the layer 753 containing a liquid crystal material is formed between the second electrode 752 and the first electrode 751(i,j) (see FIG. 30B and FIG. 31A). For example, the second electrode 752 can have a comb-like shape. In this manner, an electric field in the direction intersecting the thickness direction of the layer 753 containing a liquid crystal material can be formed between the second electrode 752 and the first electrode 751(i,j). Alternatively, a display element operating in a vertical alignment in-plane-switching (VA-IPS) mode can be used as the first display element.

Figure 38A:
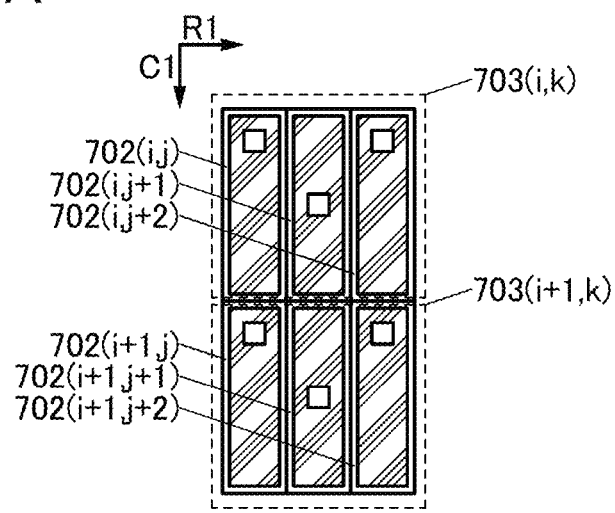
FIGS. 38A and 38B are top views illustrating pixels and subpixels of a display unit and an external view of a conductive film.
Figure 38B:
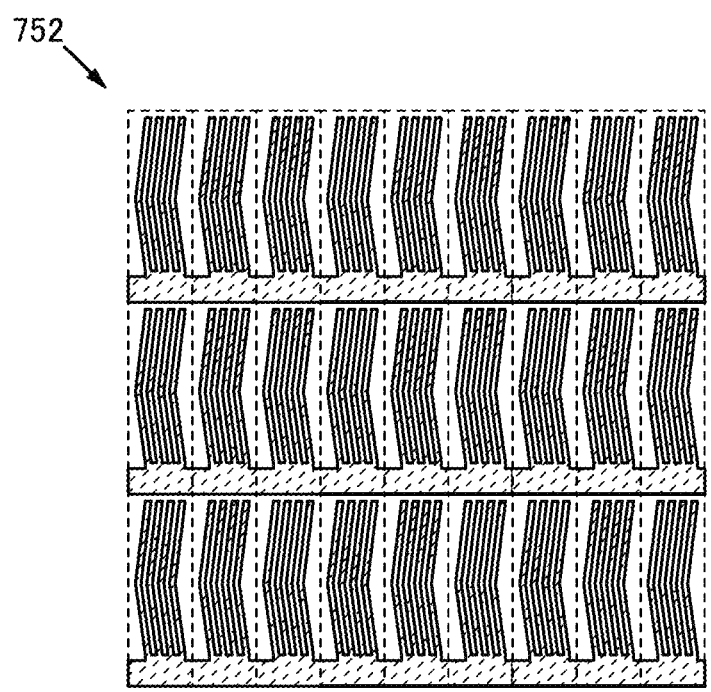

FIG. 38B is an external view of a matrix of the second electrodes 752 with a comb-like shape.

The reflective film 751B has a shape that does not block light emitted from the second display element 550(i,j) (see FIG. 31A). For example, the reflective film 751B can have a shape including a region 751H where light is not blocked. Note that the reflective film 751B has unevenness in the thickness direction. The unevenness in the thickness direction can be formed with the use of unevenness formed along the shape of the second electrode 752, for example. By the reflective film 751B with such unevenness, incident light can be reflected in various directions. In other words, incident light can be reflected diffusely. Furthermore, a viewing angle of the first display element 750(i,j) can be increased.

Structure Example 1 of Second Display Element 550(i,j)

The second display element 550(i,j) has a function of emitting light and is provided such that display using the second display element can be seen from part of a region where display using the first display element 750(i,j) can be seen (see FIG. 31A).

With such a structure, display can be performed by controlling the intensity of light reflected by the reflective film with the use of the first display element. Furthermore, display using the first display element can be complemented using the second display element. Consequently, a novel display panel with high convenience or high reliability can be provided.

Structure Example 2 of Pixel

In the display unit 700 described in this embodiment, the pixel 702(i,j) includes an optical element 560 and a covering film 565.

Structure Example 1 of Optical Element

The optical element 560 has a light-transmitting property and includes a first region 560A, a second region 560B, and a third region 560C (see FIGS. 30B and 30C and FIG. 31B).

The first region 560A includes a region to which light is supplied. For example, the first region 560A receives light from the second display element 550(i,j).

The second region 560B includes a region in contact with the covering film 565.

The third region 560C has a function of allowing part of light to be extracted and has an area smaller than or equal to the area of the region of the first region 560A to which light is supplied.

Structure Example of Covering Film

The covering film 565 has light reflectivity and has a function of reflecting part of light and supplying it to the third region 560C. For example, the covering film 565 can reflect light emitted from the second display element 550(i,j) toward the third region 560C. Specifically, part of light incident on the optical element 560 through the first region 560A can be reflected by the covering film 565 in contact with the second region 560B and extracted from the third region 560C, as shown by a solid arrow (see FIG. 31B).

Structure Example 2 of First Display Element 750(i,j)

The reflective film 751B has a shape that does not block light extracted from the third region 560C.

With such a structure, display can be performed by controlling the intensity of light reflected by the reflective film with the use of the first display element. Alternatively, display using the first display element can be complemented using the second display element. Alternatively, the light supplied to the first region can be efficiently emitted from the third region. Alternatively, the light supplied to the first region can be gathered and emitted from the third region. For example, when a light-emitting element is used as the second display element, the area of the light-emitting element can be larger than that of the third region. Alternatively, light supplied from the light-emitting element having an area larger than the area of the third region can be gathered in the third region. Alternatively, the density of a current flowing through the light-emitting element can be decreased while the intensity of light emitted from the third region is maintained. Alternatively, the reliability of the light-emitting element can be increased. For example, an organic EL element or a light-emitting diode can be used as the light-emitting element. Consequently, a novel display panel with high convenience or high reliability can be provided.

Structure Example 3 of Pixel

The pixel 702(i,j) includes part of the functional layer 520, the first display element 750(i,j), and the second display element 550(i,j) (see FIG. 32C).

<<Functional Layer 520>>

The functional layer 520 includes a first conductive film, a second conductive film, an insulating film 501C, and the pixel circuit 530(i,j). The functional layer 520 includes the optical element 560 and the covering film 565 (see FIG. 33A). The pixel circuit 530(i,j) includes a transistor M, for example.

The functional layer 520 includes a region positioned between the first display element 750(i,j) and the second display element 550(i,j) (see FIG. 33C). The region positioned between the first display element 750(i,j) and the second display element 550(i,j) has a thickness of less than 30 μm, preferably less than 10 μm, further preferably less than 5 μm.

In this manner, the second display element 550(i,j) can be close to the first display element 750(i,j). Parallax between display using the first display element 750(i,j) and display using the second display element 550(i,j) can be reduced. Display using an adjacent pixel (e.g., a pixel 702(i,j+1)) can be inhibited from being disturbed by display using the second display element 550(i,j). The color of display using an adjacent pixel (e.g., the pixel 702(i,j+1)) and the color of display using the second display element 550(i,j) can be inhibited from being mixed. The attenuation of light emitted by the second display element 550(i,j) can be inhibited. The weight of the display panel can be reduced. The thickness of the display panel can be reduced. The display panel is easily bendable.

The functional layer 520 includes an insulating film 528, an insulating film 521A, an insulating film 521B, an insulating film 518, and an insulating film 516.

<<Pixel Circuit>>

The pixel circuit 530(i,j) has a function of driving the first display element 750(i,j) and the second display element 550(i,j) (see FIG. 36).

Thus, the first display element and the second display element that displays an image by a method different from that of the first display element can be driven using pixel circuits that can be formed in the same process. Specifically, a reflective display element is used as the first display element, whereby power consumption can be reduced. An image with high contrast can be favorably displayed in an environment with bright external light. An image can be favorably displayed in a dark environment with the use of the second display element which emits light. With the insulating film, impurity diffusion between the first display element and the second display element or between the first display element and the pixel circuit can be inhibited. Consequently, a novel display device with high convenience or high reliability can be provided.

A switch, a transistor, a diode, a resistor, an inductor, a capacitor, or the like can be used in the pixel circuit 530(i,j).

For example, one or a plurality of transistors can be used as a switch. Alternatively, a plurality of transistors connected in parallel, in series, or in combination of parallel connection and series connection can be used as a switch.

For example, the pixel circuit 530(i,j) is electrically connected to a signal line S1(j), a signal line S2(j), a scan line G1(i), a scan line G2(i), a wiring CSCOM, and a conductive film ANO (see FIG. 36). A conductive film 512A is electrically connected to the signal line S1(j) (see FIG. 34 and FIG. 36).

The pixel circuit 530(i,j) includes a switch SW1 and a capacitor C11 (see FIG. 36).

The pixel circuit 530(i,j) includes a switch SW2, the transistor M, and a capacitor C12.

For example, a transistor including a gate electrode electrically connected to the scan line G1(i) and a first electrode electrically connected to the signal line S1(j) can be used as the switch SW1.

The capacitor C11 includes a first electrode electrically connected to a second electrode of the transistor used as the switch SW1, and a second electrode electrically connected to the wiring CSCOM.

For example, a transistor including a gate electrode electrically connected to the scan line G2(i) and a first electrode electrically connected to the signal line S2(j) can be used as the switch SW2.

The transistor M includes a gate electrode electrically connected to the second electrode of the transistor used as the switch SW2 and includes a first electrode electrically connected to the conductive film ANO.

Note that a transistor including a conductive film provided such that a semiconductor film is interposed between a gate electrode and the conductive film can be used as the transistor M. For example, as the conductive film, a conductive film electrically connected to a wiring that can supply the same potential as that of the gate electrode of the transistor M can be used.

The capacitor C12 includes a first electrode electrically connected to a second electrode of the transistor used as the switch SW2 and a second electrode electrically connected to the first electrode of the transistor M.

Note that the first electrode of the first display element 750(i,j) is electrically connected to the second electrode of the transistor used as the switch SW1. The second electrode 752 of the first display element 750(i,j) is electrically connected to a wiring VCOM1. This enables the first display element 750 to be driven.

An electrode 551(i,j) and an electrode 552 of the second display element 550(i,j) are electrically connected to a second electrode of the transistor M and a conductive film VCOM2, respectively. This enables the second display element 550(i,j) to be driven.

<<Insulating Film 501C>>

The insulating film 501C includes a region positioned between the first conductive film and the second conductive film and has an opening 591A (see FIG. 34).

<<First Conductive Film>>

The first conductive film is electrically connected to the first display element 750(i,j). Specifically, the first conductive film is electrically connected to the electrode 751(i,j) of the first display element 750(i,j). The electrode 751(i,j) can be used as the first conductive film <<Second Conductive Film>>

The second conductive film includes a region overlapping with the first conductive film. The second conductive film is electrically connected to the first conductive film through the opening 591A. For example, a conductive film 512B can be used as the second conductive film.

Note that the first conductive film electrically connected to the second conductive film in the opening 591A formed in the insulating film 501C can be referred to as a through electrode.

The second conductive film is electrically connected to the pixel circuit 530(i,j). For example, a conductive film that functions as a source electrode or a drain electrode of a transistor used as the switch SW1 of the pixel circuit 530(i,j) can be used as the second conductive film.

Structure Example 2 of Second Display Element 550(i,j)

The second display element 550(i,j) is electrically connected to the pixel circuit 530(i,j) (see FIG. 33A and FIG. 36). The second display element 550(i,j) has a function of emitting light toward the functional layer 520. The second display element 550(i,j) has a function of emitting light toward the insulating film 501C, for example.

The second display element 550(i,j) is provided such that display using the second display element 550(i,j) can be seen from part of a region where display using the first display element 750(i,j) can be seen. For example, dashed arrows shown in FIG. 34 denote the directions in which external light is incident on and reflected by the first display element 750(i,j) that displays image data by controlling the intensity of external light reflection. In addition, a solid arrow shown in FIG. 33A denotes the direction in which the second display element 550($i,j$) emits light to part of the region where display using the first display element 750($i,j$) can be seen.

Accordingly, display using the second display element can be seen from part of the region where display using the first display element can be seen. Alternatively, users can see display without changing the attitude or the like of the display panel. Alternatively, an object color expressed by light reflected by the first display element and a light source color expressed by light emitted from the second display element can be mixed. Alternatively, an object color and a light source color can be used to display an image like a painting. Thus, a novel display panel with high convenience or high reliability can be provided.

For example, the second display element 550($i,j$) includes the electrode 551($i,j$), the electrode 552, and a layer 553($j$) containing a light-emitting material (see FIG. 33A).

The electrode 552 includes a region overlapping with the electrode 551($i,j$).

The layer 553($j$) containing a light-emitting material includes a region positioned between the electrode 551($i,j$) and the electrode 552.

The electrode 551($i,j$) is electrically connected to the pixel circuit 530($i,j$) at a connection portion 522. The electrode 552 is electrically connected to the conductive film VCOM2 (see FIG. 36).

<<Insulating Films 521, 528, 518, and 516>>

An insulating film 521 includes a region positioned between the pixel circuit 530($i,j$) and the second display element 550($i,j$) (see FIG. 33A).

For example, a laminated film can be used as the insulating film 521. For example, a stack including the insulating film 521A, the insulating film 521B, and an insulating film 521C can be used as the insulating film 521.

The insulating film 528 includes a region positioned between the insulating film 521 and the substrate 570 and has an opening in a region overlapping with the second display element 550($i,j$). The insulating film 528 that is along the edge of the electrode 551($i,j$) can avoid a short circuit between the electrode 551($i,j$) and the electrode 552.

Note that a single-layer film or a laminated film can be used as the insulating film 518. For example, an insulating film 518A and an insulating film 518B can be used for the insulating film 518. Alternatively, for example, an insulating film 518A1 and an insulating film 518A2 can be used for the insulating film 518.

The insulating film 518 includes a region positioned between the insulating film 521 and the pixel circuit 530($i,j$).

The insulating film 516 includes a region positioned between the insulating film 518 and the pixel circuit 530($i,j$).

Furthermore, the display unit 700 can include an insulating film 501B. The insulating film 501B has an opening 592B (see FIG. 33A).

The opening 592B includes a region overlapping with a conductive film 511B.

Structure Example 2 of Display Panel

The display unit 700 described in this embodiment can include a plurality of pixels having functions of representing colors with different hues. Furthermore, colors with hues that cannot be represented by the plurality of pixels capable of representing colors with different hues can be represented by additive color mixing with the use of the pixels.

Note that when a plurality of pixels capable of representing colors with different hues are used for color mixture, each of the pixels can be referred to as a subpixel. In addition, a set of subpixels can be referred to as a pixel. Specifically, the pixel 702($i,j$) can be referred to as a subpixel, and the pixel 702($i,j$), the pixel 702($i,j$+1), and a pixel 702($i,j$+2) can be collectively referred to as a pixel 703($i,k$) (see FIG. 38A).

For example, a subpixel that represents blue, a subpixel that represents green, and a subpixel that represents red can be collectively used as the pixel 703($i,k$).

Alternatively, for example, a subpixel that represents cyan, a subpixel that represents magenta, and a subpixel that represents yellow can be collectively used as the pixel 703($i,k$).

Alternatively, for example, the above set to which a subpixel that represents white is added can be used as the pixel.

Alternatively, for example, a set of the following subpixels can be used as the pixel 703($i,k$): a subpixel including the first display element 750($i,j$) that represents cyan and the second display element 550($i,j$) that represents blue; a subpixel including a first display element 750($i,j$+1) that represents yellow and a second display element 550($i,j$+1) that represents green; and a subpixel including a first display element 750($i,j$+2) that represents magenta and a second display element 550($i,j$+2) that represents red. This allows bright display using the first display elements 750($i,j$) to 750($i,j$+2) or clear display using the second display elements 550($i,j$) to 550($i,j$+2).

Structure Example 3 of Display Panel

Moreover, the display unit 700 described in this embodiment includes a functional layer 720, a terminal 519B, the substrate 570, a substrate 770, a bonding layer 505, a sealing material 705, a structure body KB1, a functional film 770P, a functional film 770D, and the like (see FIG. 33A or FIG. 34).

<<Functional Layer 720>>

The display panel described in this embodiment includes the functional layer 720. The functional layer 720 includes a region positioned between the substrate 770 and the insulating film 501C. The functional layer 720 includes a light-blocking film BM, an insulating film 771, and a coloring film CF1 (see FIG. 33A or FIG. 34).

The light-blocking film BM has an opening in a region overlapping with the first display element 750($i,j$).

The coloring film CF1 includes a region positioned between the substrate 770 and the first display element 750($i,j$). Note that a bonding layer 770B can be provided between the functional layer 720 and the substrate 770. The bonding layer 770B has a function of bonding the functional layer 720 and the substrate 770.

The insulating film 771 includes a region between the coloring film CF1 and the layer 753 containing a liquid crystal material or a region between the light-blocking film BM and the layer 753 containing a liquid crystal material. The insulating film 771 can reduce unevenness due to the thickness of the coloring film CF1. Alternatively, impurities can be prevented from being diffused from the light-blocking film BM, the coloring film CF1, or the like to the layer 753 containing a liquid crystal material.

Note that a single-layer film or a laminated film can be used for the insulating film 771. For example, an insulating film 771A and an insulating film 771B can be used for the insulating film 771.

<<Terminal 519B>>

The display panel described in this embodiment includes the terminal 519B (see FIG. 33A).

The terminal 519B includes the conductive film 511B. The terminal 519B is electrically connected to the signal line S1(j), for example.

<<Substrate 570 and Substrate 770>>

In addition, the display panel described in this embodiment includes the substrate 570 and the substrate 770.

The substrate 770 includes a region overlapping with the substrate 570. The substrate 770 includes a region positioned such that the functional layer 520 is sandwiched between the substrate 770 and the substrate 570.

The substrate 770 includes a region overlapping with the first display element 750(i,j). For example, a material with low birefringence can be used for the region.

<<Bonding Layer 505, Sealing Material 705, and Structure Body KB1>>

The display panel described in this embodiment includes the bonding layer 505, the sealing material 705, and the structure body KB1.

The bonding layer 505 includes a region positioned between the functional layer 520 and the substrate 570, and has a function of bonding the functional layer 520 and the substrate 570 to each other.

The sealing material 705 includes a region positioned between the functional layer 520 and the substrate 770, and has a function of bonding the functional layer 520 and the substrate 770 to each other.

The structure body KB1 has a function of providing a certain space between the functional layer 520 and the substrate 770.

<<Functional Films 770PA, 770PB, and 770D>>

The display panel described in this embodiment includes a functional film 770PA, a functional film 770PB, and the functional film 770D.

The functional films 770PA and 770PB each include a region overlapping with the first display element 750(i,j).

The functional film 770D includes a region overlapping with the first display element 750(i,j). The functional film 770D is provided such that the substrate 770 lies between the functional film 770D and the first display element 750(i,j). Thus, for example, light reflected by the first display element 750(i,j) can be diffused.

Example of Components

Components of the display unit 700 are described below.
<<Substrate 570>>

The substrate 570 or the like can be formed using a material having heat resistance high enough to withstand heat treatment in the manufacturing process. For example, a material with a thickness greater than or equal to 0.1 mm and less than or equal to 0.7 mm can be used for the substrate 570. Specifically, a material polished to a thickness of approximately 0.1 mm can be used.

For example, a large-sized glass substrate having any of the following sizes can be used as the substrate 570 or the like: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 570 or the like, an organic material, an inorganic material, a composite material of an organic material and an inorganic material, or the like can be used.

For example, an inorganic material such as glass, ceramic, or a metal can be used for the substrate 570 or the like.

Specifically, non-alkali glass, soda-lime glass, potash glass, crystal glass, aluminosilicate glass, tempered glass, chemically tempered glass, quartz, sapphire, or the like can be used for the substrate 570 or the like. Specifically, an inorganic oxide film, an inorganic nitride film, an inorganic oxynitride film, or the like can be used for the substrate 570 or the like. For example, a silicon oxide film, a silicon nitride film, a silicon oxynitride film, an aluminum oxide film, or the like can be used for the substrate 570 or the like. Stainless steel, aluminum, or the like can be used for the substrate 570 or the like.

For example, a single crystal semiconductor substrate or a polycrystalline semiconductor substrate of silicon or silicon carbide, a compound semiconductor substrate of silicon germanium or the like, or an SOI substrate can be used for the substrate 570 or the like. Thus, a semiconductor element can be provided over the substrate 570 or the like.

For example, an organic material such as a resin, a resin film, or plastic can be used for the substrate 570 or the like. Specifically, a resin film or a resin plate of polyester, polyolefin, polyamide, polyimide, polycarbonate, an acrylic resin, or the like can be used for the substrate 570 or the like.

For example, a composite material formed by attaching a metal plate, a thin glass plate, or a film of an inorganic material to a resin film or the like can be used for the substrate 570 or the like. For example, a composite material formed by dispersing a fibrous or particulate metal, glass, inorganic material, or the like into a resin film can be used for the substrate 570 or the like. For example, a composite material formed by dispersing a fibrous or particulate resin, organic material, or the like into an inorganic material can be used for the substrate 570 or the like.

A single-layer material or a material obtained by stacking a plurality of layers can be used for the substrate 570 or the like. For example, a layered material in which a base, an insulating film that prevents diffusion of impurities contained in the base, and the like are stacked can be used for the substrate 570 or the like. Specifically, a material obtained by stacking glass and one or a plurality of films that are selected from a silicon oxide layer, a silicon nitride layer, a silicon oxynitride layer, and the like and that prevent diffusion of impurities contained in the glass can be used for the substrate 570 or the like. Alternatively, a material obtained by stacking a resin and a film that prevents diffusion of impurities that penetrate the resin, such as a silicon oxide film, a silicon nitride film, or a silicon oxynitride film, can be used for the substrate 570 or the like.

Specifically, a resin film, a resin plate, a layered material, or the like of polyester, polyolefin, polyamide, polyimide, polycarbonate, an acrylic resin, or the like can be used for the substrate 570 or the like.

Specifically, a material including polyester, polyolefin, polyamide (e.g., nylon or aramid), polyimide, polycarbonate, polyurethane, an acrylic resin, an epoxy resin, or a resin having a siloxane bond, such as silicone can be used for the substrate 570 or the like.

Specifically, polyethylene terephthalate (PET), polyethylene naphthalate (PEN), polyethersulfone (PES), an acrylic resin, or the like can be used for the substrate 570 or the like. Alternatively, a cycloolefin polymer (COP), a cycloolefin copolymer (COC), or the like can be used.

Alternatively, paper, wood, or the like can be used for the substrate 570 or the like.

For example, a flexible substrate can be used for the substrate 570 or the like.

Note that a transistor, a capacitor, or the like can be directly formed on the substrate. Alternatively, a transistor, a capacitor, or the like can be formed over a substrate which is for use in the manufacturing process and can withstand heat applied in the manufacturing process, and then the transistor, the capacitor, or the like can be transferred to the substrate 570 or the like. Thus, a transistor, a capacitor, or the like can be formed over a flexible substrate, for example <<Substrate 770>>

For example, a material that can be used for the substrate 570 can be used for the substrate 770. For example, a light-transmitting material that can be used for the substrate 570 can be used for the substrate 770. Alternatively, a material having a surface provided with an antireflective film with a thickness of 1 μm or less can be used for the substrate 770. Specifically, a stack including three or more, preferably five or more, more preferably 15 or more dielectrics can be used for the substrate 770. This allows reflectivity to be as low as 0.5% or less, preferably 0.08% or less. Alternatively, a material with low birefringence that can be used for the substrate 570 can be used for the substrate 770.

For example, aluminosilicate glass, tempered glass, chemically tempered glass, sapphire, or the like can be favorably used for the substrate 770 that is on the side closer to a user of the display panel. This can prevent breakage or damage of the display panel caused by the use.

For example, a resin film of a cycloolefin polymer (COP), a cycloolefin copolymer (COC), or triacetyl cellulose (TAC) can be favorably used for the substrate 770. As a result, the weight can be reduced. Alternatively, for example, the display panel can be made less likely to suffer from damage by dropping or the like.

A material with a thickness greater than or equal to 0.1 mm and less than or equal to 0.7 mm can be used for the substrate 770, for example Specifically, a substrate polished to be reduced in the thickness can be used. In that case, the functional film 770D can be close to the first display element 750$(i,j)$. As a result, image blur can be reduced, and an image can be displayed clearly.

<<Structure Body KB1>>

The structure body KB1 or the like can be formed using an organic material, an inorganic material, or a composite material of an organic material and an inorganic material, for example. Accordingly, a predetermined space can be provided between components between which the structure body KB1 and the like are provided.

Specifically, for the structure body KB1, polyester, polyolefin, polyamide, polyimide, polycarbonate, polysiloxane, an acrylic resin, or the like, or a composite material of a plurality of resins selected from these can be used. Alternatively, a photosensitive material may be used.

<<Sealing Material 705>>

For the sealing material 705 or the like, an inorganic material, an organic material, a composite material of an inorganic material and an organic material, or the like can be used.

For example, an organic material such as a thermally fusible resin or a curable resin can be used for the sealing material 705 or the like.

For example, an organic material such as a reactive curable adhesive, a light curable adhesive, a thermosetting adhesive, and/or an anaerobic adhesive can be used for the sealing material 705 or the like.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin, or the like can be used for the sealing material 705 or the like.

<<Bonding Layers 505 and 770B>>

For example, any of the materials that can be used for the sealing material 705 can be used for the bonding layer 505 or the bonding layer 770B.

<<Insulating Film 521>>

For example, an insulating inorganic material, an insulating organic material, an insulating composite material containing an inorganic material and an organic material can be used for the insulating film 521 or the like.

Specifically, for example, an inorganic oxide film, an inorganic nitride film, an inorganic oxynitride film, or a material obtained by stacking any of these films can be used as the insulating film 521 or the like. For example, a film including any of a silicon oxide film, a silicon nitride film, a silicon oxynitride film, and an aluminum oxide film, or a film including a layered material obtained by stacking any of these films can be used as the insulating film 521 or the like.

Specifically, for the insulating film 521 or the like, polyester, polyolefin, polyamide, polyimide, polycarbonate, polysiloxane, an acrylic resin, or the like, or a laminated or composite material of a plurality of kinds of resins selected from these can be used. Alternatively, a photosensitive material may be used. Note that polyimide is excellent in the following properties: thermal stability, an insulating property, toughness, a low dielectric constant, a low coefficient of thermal expansion, and a low hygroscopic property, for example. Accordingly, in particular, polyimide can be suitably used for the insulating film 521 or the like.

Thus, steps due to various components overlapping with the insulating film 521, for example, can be reduced.

<<Optical Element 560>>

The optical element 560 has an optical axis Z (see FIG. 30C). The optical axis Z passes through the center of the region of the first region 560A to which visible light is supplied and the center of the third region 560C. The second region 560B includes an inclined portion with an inclination B of 45° or more, preferably 75° or more and 85° or less, with respect to a plane orthogonal to the optical axis Z. For example, the second region 560B illustrated in the drawing entirely has an inclination of approximately 60° with respect to the plane orthogonal to the optical axis Z.

The inclined portion of the second region 560B is provided within greater than or equal to 0.05 μm and less than or equal to 0.2 μm of the end of the region of the first region 560A to which visible light is supplied. Note that in the case where the second display element 550$(i,j)$ is in contact with the first region 560A, the region of the first region 560A to which visible light is supplied has the same area as the region of the second display element 550$(i,j)$ that can supply visible light. For example, the inclined portion of the second region 560B illustrated in the drawing is positioned at a distance d from the end of the region of the first region to which visible light is supplied.

The region of the first region 560A to which visible light is supplied has an area larger than 10% of the area of the pixel 702$(i,j)$ (see FIG. 30D).

The third region 560C has an area smaller than or equal to 10% of the area of the pixel 702$(i,j)$.

The reflective film 751B has an area larger than or equal to 70% of the area of the pixel 702$(i,j)$.

The sum of the area of the region of the first region 560A to which visible light is supplied and the area of the reflective film 751B is larger than the area of the pixel 702$(i,j)$.

For example, a rectangular pixel 27 μm wide and 81 μm long has an area of 2187 μm². In the case of such a pixel, the region of the first region 560A to which visible light is supplied has an area of 324 μm². The third region 560C has an area of 81 μm², and the reflective film 751B has an area of 1894 μm².

In this structure, the area of a region of the first region 560A to which visible light is supplied is approximately 14.8% of the area of the pixel.

The area of the reflective film 751B is approximately 86.6% of the area of the pixel.

The sum of the area of the region of the first region 560A to which visible light is supplied and the area of the reflective film 751B is 2218 μm².

Thus, in the second region, light incident through the first region at various angles can be gathered. Consequently, a novel display panel with high convenience or high reliability can be provided.

Note that a plurality of materials can be used for the optical element 560. For example, a plurality of materials selected such that a difference between their refractive indices is 0.2 or less can be used for the optical element 560. Thus, reflection or scattering of light in the optical element or loss of light can be inhibited.

The optical element 560 can have any of various shapes. For example, the shape of a section orthogonal to the optical axis of the optical element 560 can be a circle or a polygon. The second region 560B of the optical element 560 can have a flat surface or a curved surface.

<<Covering Film 565>>

A single-layer film or a laminated film can be used as the covering film 565. For example, a stack including a light-transmitting film and a reflective film can be used for the covering film 565.

For example, an inorganic material such as an oxide film, a fluoride film, or a sulfide film can be used for the light-transmitting film.

For example, a metal can be used for the reflective film. Specifically, a material containing silver can be used for the covering film 565. For example, a material containing silver, palladium, and the like or a material containing silver, copper, and the like can be used for the reflective film. Alternatively, a multilayer film of dielectrics can be used for the reflective film <<Insulating Film 528>>

For example, any of the materials that can be used for the insulating film 521 can be used for the insulating film 528 or the like. Specifically, a 1-μm-thick polyimide-containing film can be used as the insulating film 528.

<<Insulating Film 501B>>

For example, a material that can be used for the insulating film 521 can be used for the insulating film 501B. For example, a material having a function of supplying hydrogen can be used for the insulating film 501B.

Specifically, a material obtained by stacking a material containing silicon and oxygen and a material containing silicon and nitrogen can be used for the insulating film 501B. For example, a material having a function of releasing hydrogen by heating or the like to supply the hydrogen to another component can be used for the insulating film 501B. Specifically, a material having a function of releasing hydrogen taken in the manufacturing process, by heating or the like, to supply the hydrogen to another component can be used for the insulating film 501B.

For example, a film containing silicon and oxygen that is formed by a chemical vapor deposition method using silane or the like as a source gas can be used as the insulating film 501B.

Specifically, a material obtained by stacking a material containing silicon and oxygen and having a thickness greater than or equal to 200 nm and less than or equal to 600 nm and a material containing silicon and nitrogen and having a thickness of approximately 200 nm can be used for the insulating film 501B.

<<Insulating Film 501C>>

For example, any of the materials that can be used for the insulating film 521 can be used for the insulating film 501C. Specifically, a material containing silicon and oxygen can be used for the insulating film 501C. Thus, diffusion of impurities into the pixel circuit, the second display element, or the like can be inhibited.

For example, a 200-nm-thick film containing silicon, oxygen, and nitrogen can be used as the insulating film 501C.

<<Wiring, Terminal, and Conductive Film>>

A conductive material can be used for the wiring or the like. Specifically, the conductive material can be used for the signal line S1(j), the signal line S2(j), the scan line G1(i), the scan line G2(i), the wiring CSCOM, the conductive film ANO, the terminal 519B, the conductive film 511B, or the like.

For example, an inorganic conductive material, an organic conductive material, a metal, conductive ceramics, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese can be used for the wiring or the like. Alternatively, an alloy containing any of the above-described metal elements, or the like can be used for the wiring or the like. In particular, an alloy of copper and manganese is suitably used in microfabrication using a wet etching method.

Specifically, any of the following structures can be used for the wiring or the like: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like.

Specifically, a conductive oxide, such as indium oxide, indium tin oxide, indium zinc oxide, zinc oxide, or zinc oxide to which gallium is added, can be used for the wiring or the like.

Specifically, a film containing graphene or graphite can be used for the wiring or the like.

For example, a film containing graphene oxide is formed and subjected to reduction, whereby a film containing graphene can be formed. As a reducing method, a method with application of heat, a method using a reducing agent, or the like can be employed.

A film containing a metal nanowire can be used for the wiring or the like, for example. Specifically, a nanowire containing silver can be used.

Specifically, a conducting polymer can be used for the wiring or the like.

Note that the terminal 519B can be electrically connected to a flexible printed circuit FPC1 with the use of a conductive material ACF1, for example.

<<First Conductive Film and Second Conductive Film>>

For example, any of the materials that can be used for the wiring or the like can be used for the first conductive film or the second conductive film.

The electrode 751(i,j), the wiring, or the like can be used for the first conductive film.

The conductive film 512B functioning as the source electrode or the drain electrode of the transistor that can be used for the switch SW1, the wiring, or the like can be used for the second conductive film.

<<First Display Element 750(i,j)>>

For example, a display element having a function of controlling transmission or reflection of light can be used as the first display element 750(i,j). For example, a combined structure of a liquid crystal element and a polarizing plate, a MEMS shutter display element, a MEMS optical coherence display element, or the like can be used. The use of a reflective display element can reduce the power consumption of the display panel. For example, a display element using a microcapsule method, an electrophoretic method, an electrowetting method, or the like can be used as the first display element 750(i,j). Specifically, a reflective liquid crystal display element can be used as the first display element 750(i,j).

For example, a liquid crystal element driven in any of the following driving modes can be used: an in-plane switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

Alternatively, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

The first display element 750(i,j) includes the first electrode, the second electrode, and the layer containing a liquid crystal material. The layer containing a liquid crystal material contains a liquid crystal material whose alignment can be controlled by voltage applied between the first electrode and the second electrode. For example, the alignment of the liquid crystal material can be controlled by an electric field in the thickness direction (also referred to as the vertical direction) or an electric field in the direction that intersects the vertical direction (also referred to as the horizontal direction or the diagonal direction) of the layer containing a liquid crystal material.

<<Layer 753 Containing Liquid Crystal Material>>

For example, thermotropic liquid crystal, low-molecular liquid crystal, high-molecular liquid crystal, polymer dispersed liquid crystal, ferroelectric liquid crystal, anti-ferroelectric liquid crystal, or the like can be used for the layer containing a liquid crystal material. Alternatively, a liquid crystal material which exhibits a cholesteric phase, a smectic phase, a cubic phase, a chiral nematic phase, an isotropic phase, or the like can be used. Alternatively, a liquid crystal material which exhibits a blue phase can be used.

For example, a negative liquid crystal material can be used for the layer containing a liquid crystal material.

For example, a liquid crystal material having a resistivity of greater than or equal to $1.0\times10^{13}$ Ω·cm, preferably greater than or equal to $1.0\times10^{14}$ Ω·cm, further preferably greater than or equal to $1.0\times10^{15}$ Ω·cm, is preferably used for the layer 753 containing a liquid crystal material. This can suppress a variation in the transmittance of the first display element 750(i,j). Alternatively, flickering of the first display element 750(i,j) can be suppressed. Alternatively, the rewriting frequency of the first display element 750(i,j) can be reduced.

<<Electrode 751(i,j)>>

For example, the material that is used for the wiring or the like can be used for the electrode 751(i,j). Specifically, a reflective film can be used for the electrode 751(i,j). For example, a material in which a light-transmitting conductive film and a reflective film having an opening are stacked can be used for the electrode 751(i,j).

<<Reflective Film>>

For example, a material that reflects visible light can be used for the reflective film Specifically, a material containing silver can be used for the reflective film. For example, a material containing silver, palladium, and the like or a material containing silver, copper, and the like can be used for the reflective film.

The reflective film reflects light that passes through the layer 753 containing a liquid crystal material, for example. This allows the first display element 750 to serve as a reflective liquid crystal element. Alternatively, for example, a material with unevenness on its surface can be used for the reflective film In that case, incident light can be reflected in various directions so that a white image can be displayed.

The reflective film has a shape including the region 751H where light emitted from the second display element 550(i,j) is not blocked (see FIGS. 37A to 37C).

For example, the reflective film can have one or more openings. Specifically, the region 751H may have a polygonal shape, a quadrangular shape, an elliptical shape, a circular shape, a cross-like shape, or the like. The region 751H may alternatively have a stripe shape, a slit-like shape, or a checkered pattern.

If the ratio of the total area of the region 751H to the total area of the reflective film is too large, an image displayed using the first display element 750(i,j) is dark.

If the ratio of the total area of the region 751H to the total area of the reflective film is too small, an image displayed using the second display element 550(i,j) is dark. The reliability of the second display element 550(i,j) may be degraded.

For example, the region 751H provided in the pixel 702(i,j+1) is not provided on a line that extends in the row direction (the direction indicated by the arrow R1 in the drawing) through the region 751H provided in the pixel 702(i,j) (see FIG. 37A). Alternatively, for example, the region 751H provided in a pixel 702(i+1,j) is not provided on a line that extends in the column direction (the direction indicated by the arrow C1 in the drawing) through the region 751H provided in the pixel 702(i,j) (see FIG. 37B).

For example, the region 751H provided in the pixel 702(i,j+2) is provided on a line that extends in the row direction through the region 751H provided in the pixel 702(i,j) (see FIG. 37A). In addition, the region 751H provided in the pixel 702(i,j+1) is provided on a line that is perpendicular to the above line between the region 751H provided in the pixel 702(i,j) and the region 751H provided in the pixel 702(i,j+2).

Alternatively, for example, the region 751H provided in a pixel 702(i+2,j) is provided on a line that extends in the column direction through the region 751H provided in the pixel 702(i,j) (see FIG. 37B). In addition, for example, the region 751H provided in the pixel 702(*i*+1,j) is provided on a line that is perpendicular to the above line between the region 751H provided in the pixel 702(*i,j*) and the region 751H provided in the pixel 702(*i*+2,j).

When the second display elements are provided in the above manner to overlap with the regions where light is not blocked, the second display element of one pixel adjacent to another pixel can be apart from a second display element of the another pixel. A display element that displays color different from that displayed from the second display element of one pixel can be provided as the second display element of another pixel adjacent to the one pixel. The difficulty in arranging a plurality of display elements that represent different colors adjacent to each other can be lowered. Thus, a novel display panel with high convenience or high reliability can be provided.

The reflective film can have a shape in which an end portion is cut off so as to form the region 751H (see FIG. 37C). Specifically, the reflective film can have a shape in which an end portion is cut off so as to be shorter in the column direction (the direction indicated by the arrow C1 in the drawing).

<<Electrode 752>>

For example, a material that can be used for the wiring or the like can be used for the electrode 752. For example, a material that has a light-transmitting property selected from materials that can be used for the wiring or the like can be used for the electrode 752.

For example, a conductive oxide, a metal film thin enough to transmit light, a metal nanowire, or the like can be used for the electrode 752.

Specifically, a conductive oxide containing indium can be used for the electrode 752. Alternatively, a metal thin film with a thickness greater than or equal to 1 nm and less than or equal to 10 nm can be used for the electrode 752. Alternatively, a metal nanowire containing silver can be used for the electrode 752.

Specifically, indium oxide, indium tin oxide, indium zinc oxide, zinc oxide, zinc oxide to which gallium is added, zinc oxide to which aluminum is added, or the like can be used for the electrode 752.

<<Alignment Films AF1 and AF2>>

Alignment films AF1 and AF2 can be formed using a material containing polyimide or the like, for example. Specifically, a material formed by rubbing treatment or an optical alignment technique such that a liquid crystal material has alignment in a predetermined direction can be used.

For example, a film containing soluble polyimide can be used for the alignment film AF1 or AF2. In that case, the temperature required in forming the alignment film AF1 or AF2 can be low. As a result, damage to other components caused when the alignment film AF1 or AF2 is formed can be reduced.

<<Coloring Film CF1>>

The coloring film CF1 can be formed using a material transmitting light of a certain color and can thus be used for a color filter or the like.

For example, a material that transmits blue light, green light, or red light can be used for the coloring film CF1. In that case, the spectral width of light that is transmitted through the coloring film CF1 can be narrowed, so that clear display can be provided.

Furthermore, for example, a material that absorbs blue light, green light, or red light can be used for the coloring film CF1. Specifically, a material transmitting yellow light, magenta light, or cyan light can be used for the coloring film CF1. In that case, the spectral width of light that is absorbed by the coloring film CF1 can be narrowed, so that bright display can be provided.

<<Light-Blocking Film BM>>

The light-blocking film BM can be formed with a material that prevents light transmission and can thus be used as a black matrix, for example.

Specifically, a resin containing a pigment or dye can be used for the light-blocking film BM. For example, a resin in which carbon black is dispersed can be used for the light-blocking film.

Alternatively, an inorganic compound, an inorganic oxide, a composite oxide containing a solid solution of a plurality of inorganic oxides, or the like can be used for the light-blocking film BM. Specifically, a black chromium film, a film containing cupric oxide, or a film containing copper chloride or tellurium chloride can be used for the light-blocking film BM.

<<Insulating Film 771>>

For example, a material that can be used for the insulating film 521 can be used for the insulating film 771. The insulating film 771 can be formed of polyimide, an epoxy resin, an acrylic resin, or the like. Alternatively, a film including any of a silicon oxide film, a silicon nitride film, a silicon oxynitride film, and an aluminum oxide film, and the like, or a film including a material obtained by stacking any of these films can be used for the insulating film 771.

<<Functional Films 770P and 770D>>

An antireflective film, a polarizing film, a retardation film, a light diffusion film, a condensing film, or the like can be used for the functional film 770P or the functional film 770D, for example.

Specifically, a film containing a dichroic dye can be used for the functional film 770P or the functional film 770D. Alternatively, a material with a columnar structure having an axis along the direction intersecting a surface of a base can be used for the functional film 770P or the functional film 770D. In that case, light can be easily transmitted in the direction along the axis and easily scattered in other directions.

Alternatively, an antistatic film preventing the attachment of a foreign substance, a water repellent film suppressing the attachment of stain, a hard coat film suppressing a scratch in use, or the like can be used as the functional film 770P.

Specifically, a circularly polarizing film can be used for the functional film 770P. Furthermore, a light diffusion film can be used for the functional film 770D.

<<Second Display Element 550(*i,j*)>>

For example, a display element having a function of emitting light can be used as the second display element 550(*i,j*). Specifically, an organic electroluminescent element, an inorganic electroluminescent element, a light-emitting diode, a quantum-dot LED (QDLED), or the like can be used as the second display element 550(*i,j*).

For example, a light-emitting organic compound can be used for the layer 553(*j*) containing a light-emitting material.

For example, quantum dots can be used for the layer 553(*j*) containing a light-emitting material. Accordingly, the half width becomes narrow, and light of a bright color can be emitted.

A layered material for emitting blue light, green light, or red light can be used for the layer 553(*j*) containing a light-emitting material, for example.

For example, a belt-like layered material that extends in the column direction along the signal line S2(*j*) can be used for the layer 553(*j*) containing a light-emitting material.

Alternatively, a layered material for emitting white light can be used for the layer 553(j) containing a light-emitting material. Specifically, a layered material in which a layer containing a light-emitting material including a fluorescent material that emits blue light, and a layer containing materials that are other than a fluorescent material and that emit green light and red light or a layer containing a material that is other than a fluorescent material and that emits yellow light are stacked can be used for the layer 553(j) containing a light-emitting material.

A material that can be used for the wiring or the like can be used for the electrode 551(i,j), for example.

For example, a material that transmits visible light among the materials that can be used for the wiring or the like can be used for the electrode 551(i,j).

Specifically, conductive oxide, indium-containing conductive oxide, indium oxide, indium tin oxide, indium zinc oxide, zinc oxide, zinc oxide to which gallium is added, or the like can be used for the electrode 551(i,j). Alternatively, a metal film that is thin enough to transmit light can be used as the electrode 551(i,j). Further alternatively, a metal film that transmits part of light and reflects another part of light can be used for the electrode 551(i,j). Accordingly, the second display element 550(i,j) can have a microcavity structure. As a result, light of a predetermined wavelength can be extracted more efficiently than light of other wavelengths.

For example, a material that can be used for the wiring or the like can be used for the electrode 552. Specifically, a material that reflects visible light can be used for the electrode 552.

<<Driver Circuit GD>>

Any of a variety of sequential circuits, such as a shift register, can be used as a driver circuit GD. For example, a transistor MD, a capacitor, and the like can be used in the driver circuit GD. Specifically, a transistor including a semiconductor film that can be formed in the same process as the semiconductor film of the transistor M or the transistor that can be used as the switch SW1 can be used.

As the transistor MD, a transistor having a structure different from that of the transistor that can be used as the switch SW1 can be used, for example.

Note that the transistor MD can have the same structure as the transistor M.

<<Transistor>>

For example, semiconductor films formed in the same process can be used for transistors in the driver circuit and the pixel circuit.

As the transistor in the driver circuit or the pixel circuit, a bottom-gate transistor or a top-gate transistor can be used, for example.

For example, a transistor using an oxide semiconductor for a semiconductor film can be used. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used. Specifically, a transistor that uses an oxide semiconductor in a semiconductor film can be used.

Thus, a pixel circuit can hold an image signal for a longer time than a pixel circuit including a transistor that uses amorphous silicon for a semiconductor film Specifically, the selection signal can be supplied at a frequency of lower than 30 Hz, preferably lower than 1 Hz, more preferably less than once per minute while flickering is suppressed. Consequently, eyestrain on a user of a data processing device that includes the above pixel circuit can be reduced, and power consumption for driving can be reduced.

A manufacturing line for a bottom-gate transistor including amorphous silicon as a semiconductor can be easily remodeled into a manufacturing line for a bottom-gate transistor including an oxide semiconductor as a semiconductor, for example. Furthermore, for example, a manufacturing line for a top-gate transistor including polysilicon as a semiconductor can be easily remodeled into a manufacturing line for a top-gate transistor including an oxide semiconductor as a semiconductor. In any reconstruction, a conventional manufacturing line can be effectively used.

For example, a transistor including a semiconductor film 508, a conductive film 504, the conductive film 512A, and the conductive film 512B can be used as the switch SW1 (see FIG. 33A). The insulating film 506 includes a region positioned between the semiconductor film 508 and the conductive film 504.

The conductive film 504 includes a region overlapping with the semiconductor film 508. The conductive film 504 functions as a gate electrode. The insulating film 506 functions as a gate insulating film.

The conductive films 512A and 512B are electrically connected to the semiconductor film 508. The conductive film 512A has one of a function of a source electrode and a function of a drain electrode, and the conductive film 512B has the other.

A transistor including the conductive film 524 can be used as the transistor in the driver circuit or the pixel circuit (see FIG. 33B). The semiconductor film 508 is positioned between the conductive film 504 and a region included in the conductive film 524. The insulating film 516 includes a region positioned between the conductive film 524 and the semiconductor film 508. For example, the conductive film 524 can be electrically connected to a wiring supplying the same potential as that supplied to the conductive film 504.

A conductive film in which a 10-nm-thick film containing tantalum and nitrogen and a 300-nm-thick film containing copper are stacked can be used as the conductive film 504, for example. A film containing copper includes a region provided such that a film containing tantalum and nitrogen is positioned between the film containing copper and the insulating film 506.

A material in which a 400-nm-thick film containing silicon and nitrogen and a 200-nm-thick film containing silicon, oxygen, and nitrogen are stacked can be used for the insulating film 506, for example Note that the film containing silicon and nitrogen includes a region provided such that the film containing silicon, oxygen, and nitrogen is positioned between the film containing silicon and nitrogen and the semiconductor film 508.

For example, a 25-nm-thick film containing indium, gallium, and zinc can be used as the semiconductor film 508.

For example, a conductive film in which a 50-nm-thick film containing tungsten, a 400-nm-thick film containing aluminum, and a 100-nm-thick film containing titanium are stacked can be used as the conductive film 512A or 512B. Note that the film containing tungsten includes a region in contact with the semiconductor film 508.

Structure Example 4 of Display Panel

A structure of a display panel of one embodiment of the present invention is described with reference to FIGS. 39A and 39B.

Figure 39A:
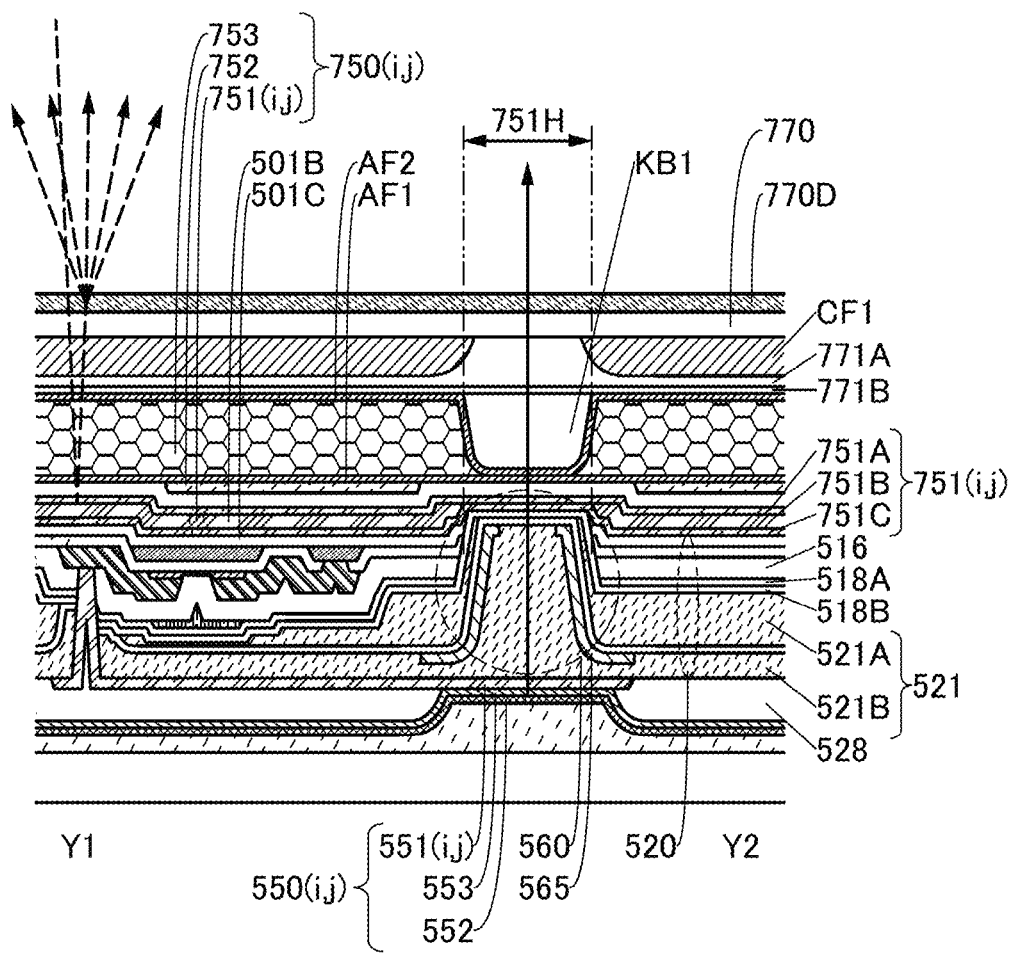
FIGS. 39A and 39B are cross-sectional views illustrating a structure of a pixel of a display unit.
Figure 39B:
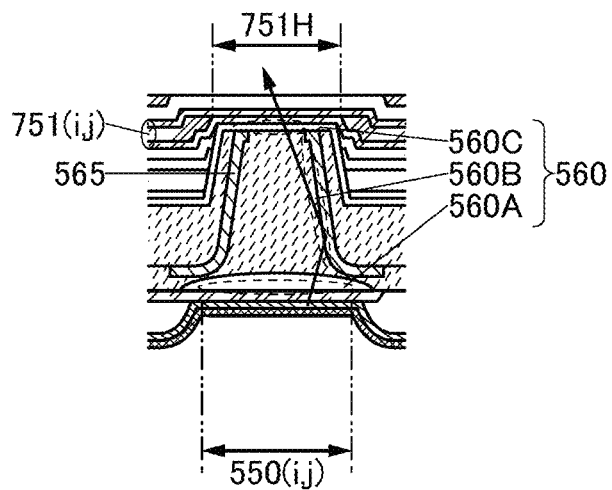

FIGS. 39A and 39B illustrate the structure of the display panel of one embodiment of the present invention. FIG. 39A is a cross-sectional view of a pixel, which corresponds to the cross-sectional view taken along line Y1-Y2 in FIG. 30A. FIG. 39B is a cross-sectional view illustrating part of the structure of the pixel in FIG. 39A.

The structure of the display panel described in this structure example is the same as that of the display panel described with reference to FIGS. 31A and 31B except that a liquid crystal element that can operate in a guest-host liquid crystal mode is used as the first display element 750($i,j$) and a bottom-gate transistor is used. Different portions will be described in detail below, and the above description is referred to for the similar portions.

The display panel described in this embodiment includes a liquid crystal element that can operate in a guest-host liquid crystal mode as the first display element 750($i,j$). Thus, a reflective display panel can be obtained without a polarizing plate. Furthermore, an image displayed by the display panel can be made bright.

<<Layer 753 Containing Liquid Crystal Material>>

For example, nematic liquid crystal, thermotropic liquid crystal, low-molecular liquid crystal, high-molecular liquid crystal, polymer dispersed liquid crystal, or the like can be used for the layer containing a liquid crystal material. Alternatively, a liquid crystal material which exhibits a cholesteric phase or the like can be used. Alternatively, a liquid crystal material which exhibits a blue phase can be used.

Furthermore, a dichroic dye can be used for the layer 753 containing a liquid crystal material. Note that a liquid crystal material containing a dichroic dye is called a guest-host liquid crystal.

Specifically, a material that has high absorbance in the major axis direction of molecules and low absorbance in the minor-axis direction orthogonal to the major axis direction can be used for the dichroic dye. It is preferable to use a material with a dichroic ratio of 10 or higher, further preferably 20 or higher for the dichroic dye.

An azo dye, an anthraquinone dye, a dioxazine dye, or the like can be used as the dichroic dye, for example.

Two liquid crystal layers including dichroic dyes having homogeneous alignment that are stacked such that their alignment directions are orthogonal to each other can be used as the layer containing a liquid crystal material. With the structure, light can be easily absorbed in all directions. Contrast can be increased.

A phase transition guest-host liquid crystal or a structure in which a droplet containing a guest-host liquid crystal is dispersed in a polymer can be used for the layer 753 containing a liquid crystal material.

Note that this embodiment can be combined with any of the other embodiments in this specification as appropriate.

Embodiment 7

In this embodiment, a data processing device to which the display device described in the above embodiment can be applied is described with reference to FIGS. 40A to 40E and FIGS. 41A to 41E.

Figure 40A:
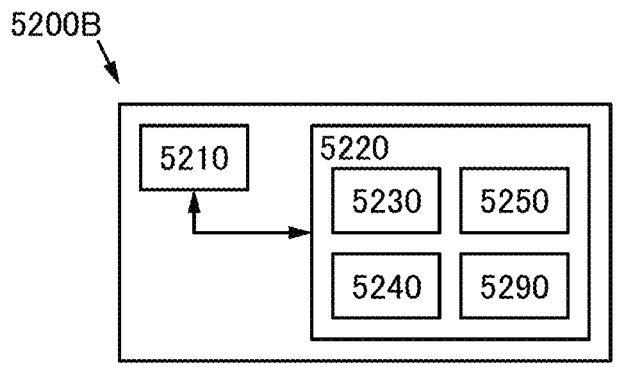
FIGS. 40A to 40E each illustrate a structure of a data processing device.

FIGS. 40A to 40E and FIGS. 41A to 41E illustrate the structures of the data processing device of one embodiment of the present invention. FIG. 40A is a block diagram of the data processing device, and FIGS. 40B to 40E are perspective views illustrating the structures of the data processing device. FIGS. 41A to 41E are perspective views illustrating the structures of the data processing device.

<Data Processing Device>

A data processing device 5200B described in this embodiment includes an arithmetic device 5210 and an input/output device 5220 (see FIG. 40A).

The arithmetic device 5210 has a function of receiving operation data and a function of supplying image data on the basis of the operation data.

The input/output device 5220 includes a display portion 5230, an input portion 5240, a sensor portion 5250, and a communication portion 5290 and has a function of supplying operation data and a function of receiving image data. The input/output device 5220 also has a function of supplying sensing data, a function of supplying communication data, and a function of receiving communication data.

The input portion 5240 has a function of supplying operation data. For example, the input portion 5240 supplies operation data on the basis of operation by the user of the data processing device 5200B.

Specifically, a keyboard, a hardware button, a pointing device, a touch sensor, an audio input device, a viewpoint input device, or the like can be used as the input portion 5240.

The display portion 5230 includes a display panel and has a function of displaying image data. For example, the display device 50 described in the above embodiment can be used for the display portion 5230.

The sensor portion 5250 has a function of supplying sensing data. For example, the sensor portion 5250 has a function of sensing a surrounding environment where the data processing device is used and supplying sensing data.

Specifically, an illuminance sensor, an imaging device, an attitude determination device, a pressure sensor, a human motion sensor, or the like can be used as the sensor portion 5250.

The communication portion 5290 has a function of receiving and supplying communication data. For example, the communication portion 5290 has a function of being connected to another electronic device or a communication network by wireless communication or wired communication. Specifically, the communication portion 5290 has a function of local area wireless communication, telephone communication, or near field wireless communication, for example.

Structural Example 1 of Data Processing Device

Figure 40B:
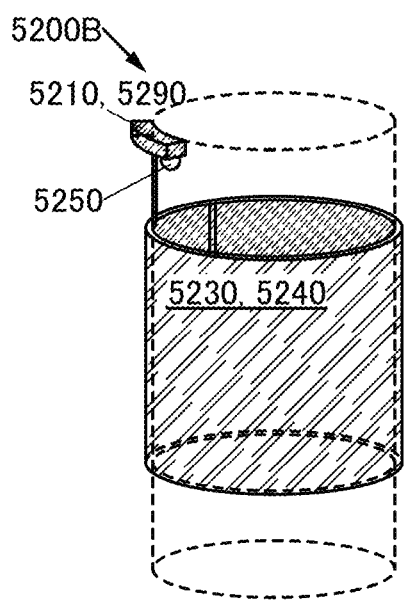

For example, the display portion 5230 can have an outer shape along a cylindrical column or the like (see FIG. 40B). Furthermore, the display portion 5230 has a function of changing a displaying method in accordance with the illuminance of a usage environment and a function of changing displayed contents when sensing the existence of a person. Thus, the data processing device can be mounted on a column of a building, for example. Alternatively, the data processing device can display advertisement, information, or the like. The data processing device can be used for a digital signage or the like.

Structural Example 2 of Data Processing Device

Figure 40C:
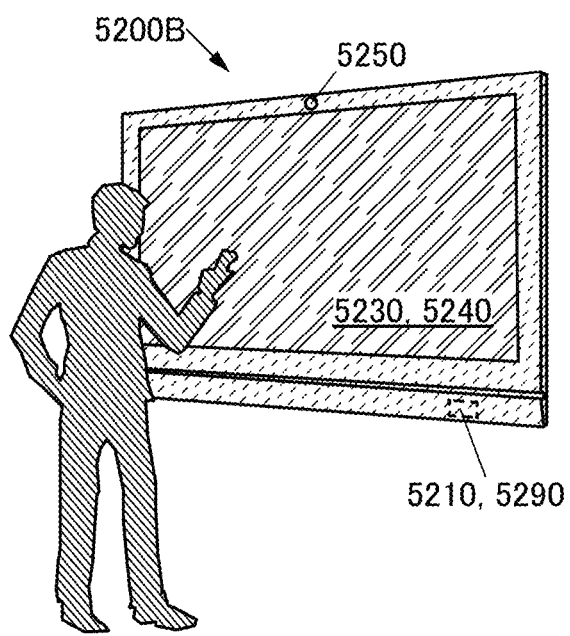

For example, the data processing device has a function of generating image data on the basis of the path of a pointer used by a user (see FIG. 40C). Specifically, it is possible to use a display panel with a diagonal of 20 inches or more, preferably 40 inches or more, further preferably 55 inches or more. Alternatively, display panels can be arranged in one display region. Alternatively, display panels can be arranged to be used as a multiscreen. In this case, the data processing device can be used for an electronic blackboard, an electronic bulletin board, a digital signage, or the like.

Structural Example 3 of Data Processing Device

Figure 40D:
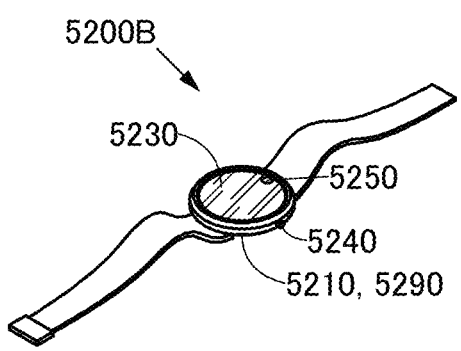

For example, the data processing device has a function of changing a displaying method in accordance with the illuminance of a usage environment (see FIG. 40D). Thus, it is possible to obtain a smartwatch with reduced power consumption, for example. Alternatively, it is possible to obtain a smartwatch that can display an image such that the smartwatch is favorably used even in an environment with intense external light, e.g., in the open air under fine weather.

Structural Example 4 of Data Processing Device

Figure 40E:
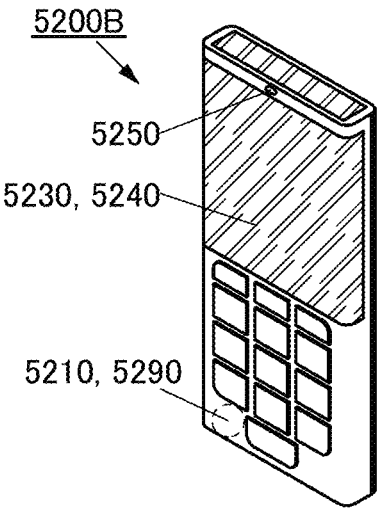

The display portion 5230 has a surface gently curved along a side surface of a housing (see FIG. 40E). The display portion 5230 includes a display panel that has, for example, a function of performing display on a front surface, side surfaces, and a top surface. Thus, it is possible to obtain a mobile phone that can display image data on not only its front surface but also its side surfaces and top surface.

Structural Example 5 of Data Processing Device

For example, the data processing device has a function of changing a displaying method in accordance with the illuminance of a usage environment (see FIG. 41A). Thus, it is possible to obtain a smartphone with reduced power consumption. Alternatively, it is possible to obtain a smartphone that can display an image such that the smartphone is favorably used even in an environment with intense external light, e.g., in the open air under fine weather.

Structural Example 6 of Data Processing Device

For example, the data processing device has a function of changing a displaying method in accordance with the illuminance of a usage environment (see FIG. 41B). Thus, it is possible to obtain a television system that can display an image such that the television system is favorably used even when exposed to intense external light poured into a room in a sunny day.

Structural Example 7 of Data Processing Device

For example, the data processing device has a function of changing a displaying method in accordance with the illuminance of a usage environment (see FIG. 41C). Thus, it is possible to obtain a tablet computer that can display an image such that the tablet computer is favorably used even in an environment with intense external light, e.g., in the open air under fine weather.

Structural Example 8 of Data Processing Device

For example, the data processing device has a function of changing a displaying method in accordance with the illuminance of a usage environment (see FIG. 41D). Thus, it is possible to obtain a digital camera that can display a subject such that an image is favorably viewed even in an environment with intense external light, e.g., in the open air under fine weather.

Structural Example 9 of Data Processing Device

For example, the data processing device has a function of changing a displaying method in accordance with the illuminance of a usage environment (see FIG. 41E). Thus, it is possible to obtain a personal computer that can display an image such that the personal computer is favorably used even in an environment with intense external light, e.g., in the open air under fine weather.

Note that this embodiment can be combined with any of the other embodiments in this specification as appropriate.

For example, in this specification and the like, an explicit description "X and Y are connected" means that X and Y are electrically connected, X and Y are functionally connected, and X and Y are directly connected. Accordingly, another element may be provided between elements having a connection relation illustrated in drawings and texts, without being limited to a predetermined connection relation, for example, the connection relation illustrated in the drawings and the texts.

Here, X and Y each denote an object (e.g., a device, an element, a circuit, a wiring, an electrode, a terminal, a conductive film, and a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is provided between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 8

<Composition of CAC-OS>

The composition of a CAC-OS that can be used for a transistor disclosed in one embodiment of the present invention is described below.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to the element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \le x0 \le 1$; m0 is a given number).

The above crystalline compounds have a single crystal structure, a polycrystalline structure, or a c-axis-aligned crystalline oxide semiconductor or c-axis aligned and a-b-plane anchored crystalline oxide semiconductor (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments and the other examples described in this specification as appropriate.

Example

In this example, the display unit 60 described in Embodiment 1 was fabricated and its power consumption was measured.

Figure 42:
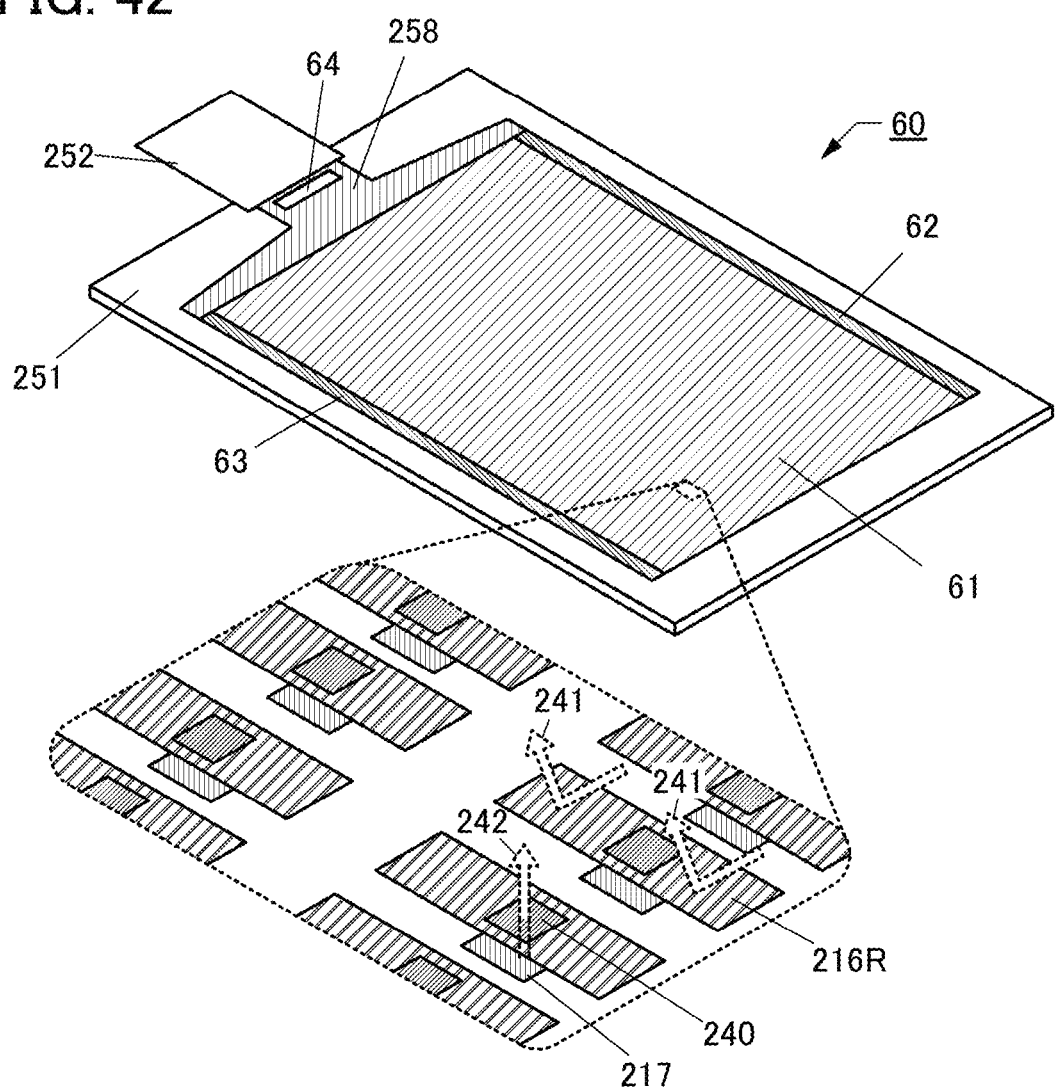
FIG. 42 is a schematic view illustrating an example of a display unit.

In this example, the display unit 60 including a reflective element and a light-emitting element in the pixel 10 was fabricated. FIG. 42 is a schematic view of the fabricated display unit.

The display unit 60 illustrated in FIG. 42 includes a substrate 251, the pixel array 61, the gate driver 62, the gate driver 63, the source driver IC 64, a wiring 258, and an FPC 252.

FIG. 42 illustrates an enlarged view of part of the pixel array 61. In the pixel array 61, electrodes 216R are arranged in matrix. The electrode 216R has a function of reflecting visible light 241, and serves as a reflective electrode of a reflective element.

As illustrated in FIG. 42, the electrode 216R includes an opening 240. In addition, the display unit 60 includes a light-emitting element 217 that is positioned closer to the substrate 251 than the electrode 216R. Light 242 emitted from the light-emitting element 217 is extracted out through the opening 240.

The display unit 60 has three display modes: a mode in which an image is display only by the reflective element (a reflective mode), a mode in which an image is displayed only by the light-emitting element (a light-emitting mode), and a mode in which an image is displayed by a combination of the reflective element and the light-emitting element (a hybrid mode).

Hybrid mode is a method for displaying a letter or an image using reflected light and self-emitted light together in one panel that complement the color tone or light intensity of each other. Alternatively, a hybrid mode is a method for displaying a letter and/or an image using light from the reflective element and the light-emitting element in one pixel or one subpixel. Note that when a hybrid display performing hybrid display is locally observed, a pixel or a subpixel performing display using one of the reflective element and the light-emitting element and a pixel or a subpixel performing display using both of the reflective element and the light-emitting element are included in some cases.

Note that in this specification and the like, hybrid display satisfies any one or a plurality of the above-described descriptions.

Furthermore, a hybrid display includes a plurality of display elements in one pixel or one subpixel. Note that as an example of the plurality of display elements, a reflective element that reflects light and a light-emitting element that emits light can be given. Note that the reflective element and the light-emitting element can be controlled independently. A hybrid display has a function of displaying a letter and/or an image using one or both of reflected light and self-emitted light in a display portion.

In this example, a reflective liquid crystal element (hereinafter, referred to as a liquid crystal element) was used as the reflective element, and an organic EL element (hereinafter, referred to as an EL element) was used as the light-emitting element 217.

FIGS. 43A to 43F are photographs showing the appearance of the fabricated display unit.

Figure 43A:
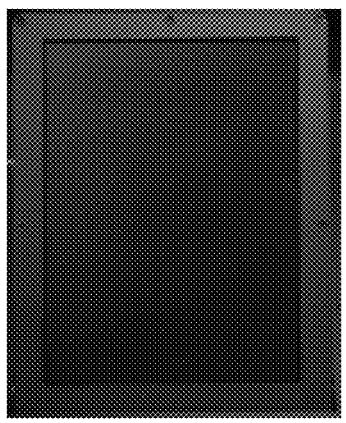
FIGS. 43A to 43F are photographs showing the appearance of a fabricated display unit.
Figure 43B:
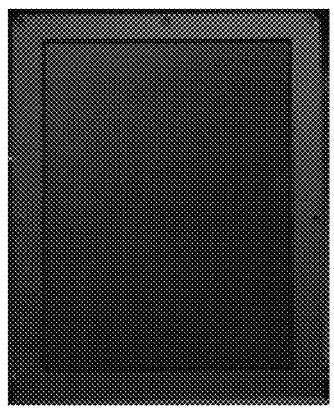
Figure 43C:
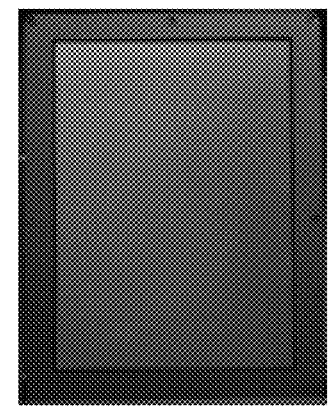
Figure 43D:
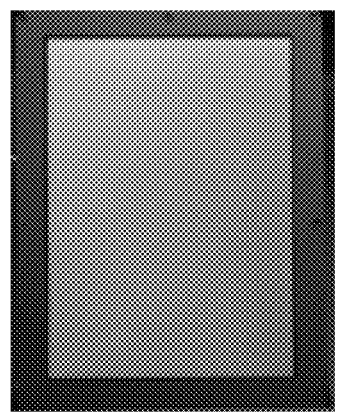
Figure 43E:
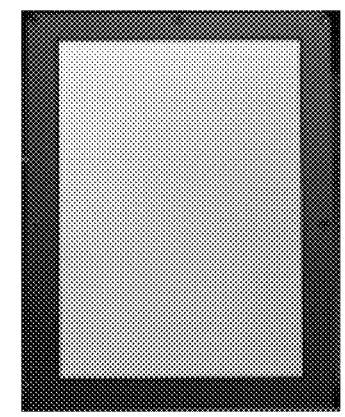
Figure 43F:
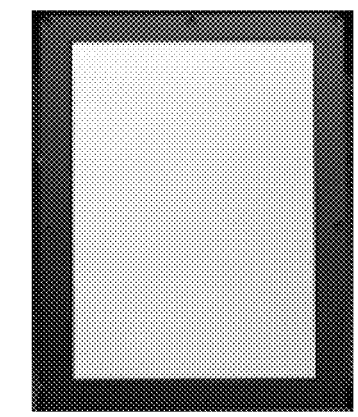

FIG. 43A shows the case where all the liquid crystal elements and all the EL elements included in a pixel array display black. In other words, all the EL elements stop light emission.

FIGS. 43B to 43F each show the case where all the EL elements display white and all the liquid crystal elements display black. The emission intensity of the EL elements is gradually changed from FIG. 43B to FIG. 43F.

FIGS. 43B, 43C, 43D, 43E and 43F are photographs showing the case where the luminance is 1.3 cd/m$^2$, 10.5 cd/m$^2$, 28.2 cd/m$^2$, 56.3 cd/m$^2$, and 92.4 cd/m$^2$, respectively.

Figure 44A:
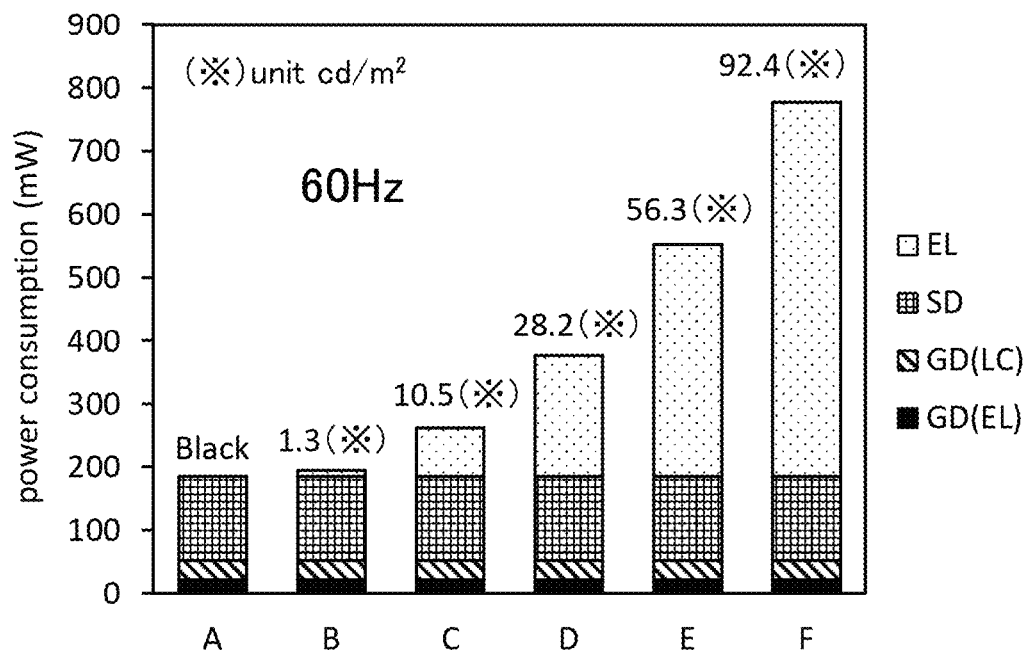
FIGS. 44A and 44B are graphs showing power consumption of a fabricated display unit.
Figure 44B:
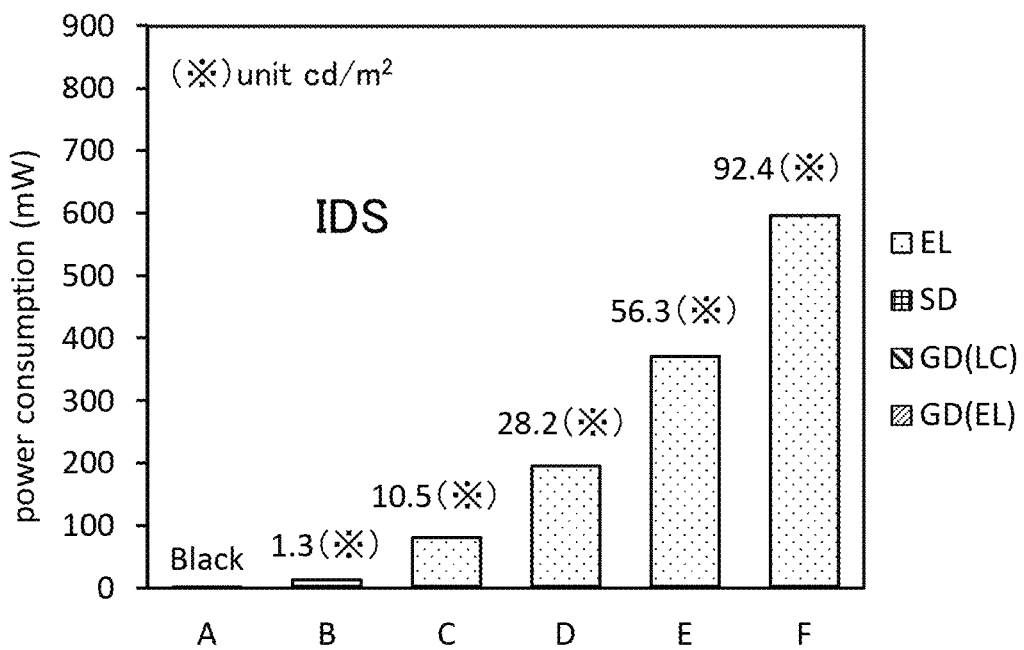

Measurement results of power consumption of the display unit in each of FIGS. 43A to 43F are shown in FIGS. 44A and 44B.

A to F in graphs of FIGS. 44A and 44B correspond to the power consumption in FIGS. 43A to 43F, respectively. Each bar graph of the figures shows power consumption of the EL element (EL), power consumption of a source driver (SD), power consumption of a gate driver driving the liquid crystal element (GD(LC)), and power consumption of a gate driver driving the EL element (GD(EL)).

FIG. 44A shows power consumption in the case where the display unit was driven at 60 Hz and FIG. 44B shows power consumption in the case where both of the liquid crystal element and the EL element performed the IDS driving.

As the luminance of the display unit became higher (the emission intensity of the EL element became higher), power consumption was also increased in both FIGS. 44A and 44B.

Comparison between FIGS. 44A and 44B indicates that the power consumption of the source driver, the gate driver driving the liquid crystal element, and the gate driver driving the EL element can be significantly reduced by performing the IDS driving.

FIGS. 45A to 45E are photographs showing the appearance of the fabricated display unit.

Figure 45A:
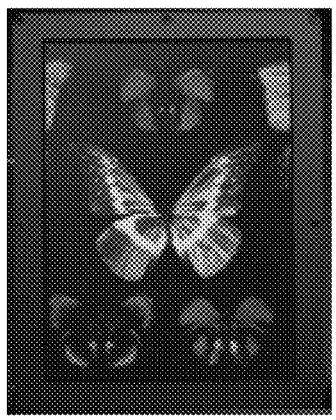
FIGS. 45A to 45E are photographs showing the appearance of a fabricated display unit.

FIG. 45A shows the case where a color image of a butterfly is displayed in the above-described hybrid mode.

Figure 45B:

FIG. 45B shows the case where a color image of a flower is displayed in the above-described hybrid mode.

Figure 45C:
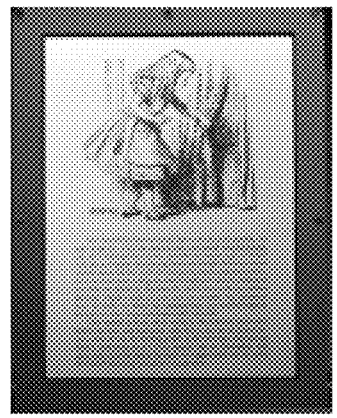

FIG. 45C shows the case where text (letters) and a picture are displayed in the above-described reflective mode. The image in FIG. 45C is displayed with two colors (black and white).

Figure 45D:
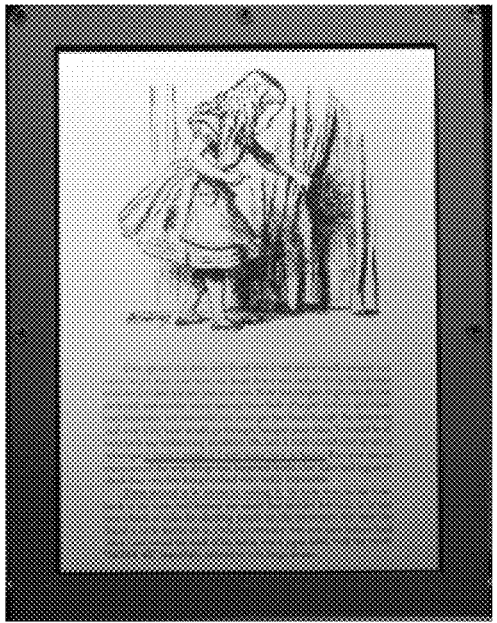

FIG. 45D shows the case where a highlight emphasizing the text is added to the image in FIG. 45C. A highlight (color) displayed by the EL element is added to the image (black and white) displayed by the liquid crystal element.

Figure 45E:
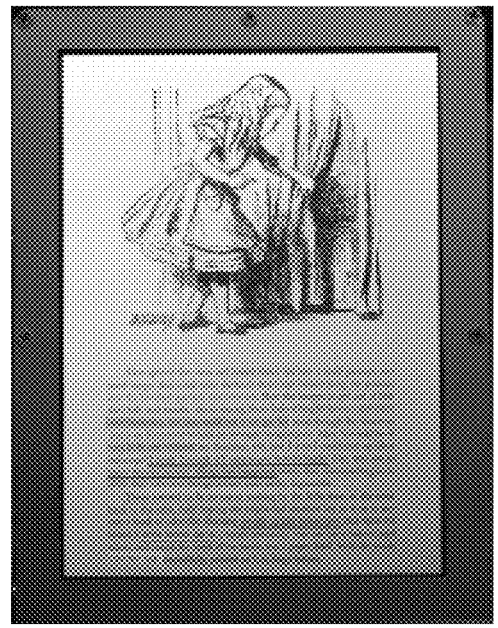

FIG. 45E shows the case where a highlight emphasizing the text is added to the image in FIG. 45C. A highlight (color) displayed by the EL element is added to the image (black and white) displayed by the liquid crystal element. FIG. 45E is different from FIG. 45D in that the number of the highlights is larger than that in FIG. 45D, that is, the number of the EL elements emitting light is larger than that in FIG. 45D.

Figure 46A:
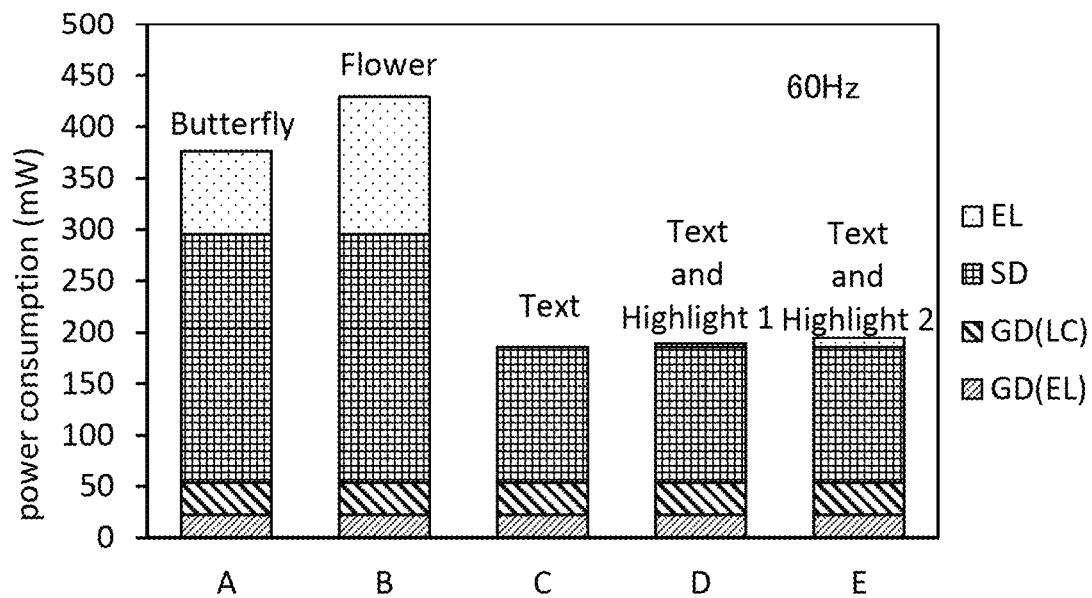
FIGS. 46A and 46B are graphs showing power consumption of a fabricated display unit.
Figure 46B:
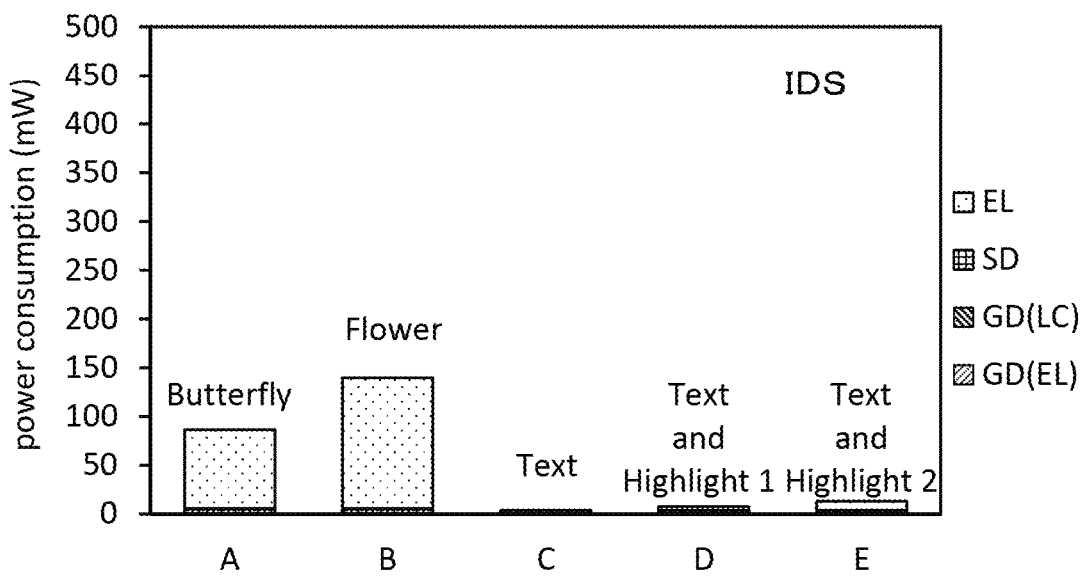

Measurement results of power consumption of the display unit in each of FIGS. 45A to 45E are shown in FIGS. 46A and 46B.

A to E of graphs of FIGS. 46A and 46B correspond to the power consumption in FIGS. 45A to 45E, respectively. As in FIGS. 44A and 44B, each bar graph of the figures shows power consumption of the EL element (EL), power consumption of a source driver (SD), power consumption of a gate driver driving the liquid crystal element (GD(LC)), and power consumption of a gate driver driving the EL element (GD(EL)).

FIG. 46A shows power consumption in the case where the display unit was driven at 60 Hz and FIG. 46B shows power consumption in the case where both of the liquid crystal element and the EL element performed the IDS driving.

Comparison between FIGS. 46A and 46B indicates that the power consumption of the source driver, the gate driver driving the liquid crystal element, and the gate driver driving the EL element can be significantly reduced by performing the IDS driving. In particular, in the case where the text is displayed by the liquid crystal element (FIGS. 45C to 45E), power consumption of the entire display unit including the liquid crystal element and the EL element can be reduced to 50 mW or smaller.

It is found from this example that the power consumption of the entire display unit can be significantly reduced when both of the EL element and the liquid crystal element perform the IDS driving.

REFERENCE NUMERALS

10: pixel, 10a: pixel, 10b: pixel, 10c: pixel, 50: display device, 60: display unit, 61: pixel array, 62: gate driver, 63: gate driver, 64: source driver IC, 64a: source driver IC, 64d: source driver IC, 70: touch sensor unit, 71: sensor array, 72: touch sensor IC, 80: application processor, 90: tablet information terminal, 91: display region, 92: illustration, 93: frame, 94: frame, 95: stylus, 100: circuit, 101: transistor, 109: transistor, 110: circuit, 111: transistor, 113: transistor, 120: circuit, 121: transistor, 123: transistor, 216R: electrode, 217: light-emitting element, 240: opening, 241: visible light, 242: light, 251: substrate, 252: FPC, 258: wiring, 301: transistor, 302: node, 303: capacitor, 304: liquid crystal element, 310: capacitor, 311: transistor, 312: transistor, 313: transistor, 314: light-emitting element, 315: node, 402: driving circuit, 403: detection circuit, 404: capacitor, 411: substrate, 412: substrate, 413: FPC, 414: wiring, 420: liquid crystal element, 421: electrode, 421a: electrode, 421b: electrode, 422: electrode, 422a: electrode, 422b: electrode, 423: liquid crystal, 424: insulating film, 431: coloring film, 441: electrode, 441a: electrode, 441b: electrode, 443: FPC, 463: EL element, 464: electrode, 465: EL layer, 466: electrode, 475: sensing element, 501B: insulating film, 501C: insulating film, 504: conductive film, 505: bonding layer, 506: insulating film, 508: semiconductor film, 511B: conductive film, 512A: conductive film, 512B: conductive film, 516: insulating film, 518: insulating film, 518A: insulating film, 518A1: insulating film, 518A2: insulating film, 518B: insulating film, 519B: terminal, 520: functional layer, 521: insulating film, 521A: insulating film, 521B: insulating film, 521C: insulating film, 522: connection portion, 524: conductive film, 528: insulating film, 530: pixel circuit, 550: display element, 551: electrode, 552: electrode, 553: layer, 560: optical element, 560A: region, 560B: region, 560C: region, 565: covering film, 570: substrate, 591A: opening, 592B: opening, 601: transistor, 602: transistor, 610: electrode, 611: electrode, 612: semiconductor layer, 616: electrode, 617: electrode, 621: insulating layer, 622: insulating layer, 624: insulating layer, 625: electrode, 626: anisotropic conductive layer, 627: sealant, 628: filler, 629: insulating layer, 630: light-blocking film, 631: alignment film, 632: alignment film, 633: spacer, 634: wiring, 654: anisotropic conductive layer, 661: partition wall, 662: wiring, 663: insulating layer, 700: display unit, 702: pixel, 703: pixel, 705: sealant, 720: functional layer, 750: display element, 751: electrode, 751B: reflective film, 751H: region, 752: electrode, 753: layer, 770: substrate, 770B: bonding layer, 770D: functional film, 770P: functional film, 770PA: functional film, 770PB: functional film, 771: insulating film, 771A: insulating film, 771B: insulating film, 801: control circuit, 802: driver, 803: frame memory, 804: frame memory, 806: gate driver signal generation circuit, 807: gate driver signal generation circuit, 810: timing controller, 5200B: data processing device, 5210: arithmetic device, 5220: input/output device, 5230: display portion, 5240: input portion, 5250: sensor portion, and 5290: communication portion.

This application is based on Japanese Patent Application Serial No. 2016-207318 filed with Japan Patent Office on Oct. 21, 2016, Japanese Patent Application Serial No. 2016-207335 filed with Japan Patent Office on Oct. 21, 2016, and Japanese Patent Application

The invention claimed is:

1. A method for driving a display device comprising a display region comprising a plurality of gate signal lines electrically connected to pixels, the method comprising the steps of:
   detecting proximity or contact of an object to the display region by performing a detection operation during a frame period while displaying an image; and
   supplying pulses to a part of the plurality of gate signal lines in a period during the frame period;
   wherein the detection operation is performed while no pulses are supplied to the plurality of gate signal lines during the frame period,
   wherein the detection operation is not performed throughout the step of supplying the pulses to the part of the plurality of gate signal lines during the frame period,
   wherein the period during the frame period is configured to change, and
   wherein the detection period during the frame period is configured to change.

2. The method for driving the display device according to claim 1, further comprising the step of supplying no pulses to the plurality of gate signal lines for a time longer than the frame period before the frame period while displaying the image.

3. The method for driving the display device according to claim 1,
   wherein the pixels each comprise a transistor comprising a metal oxide in a channel formation region.

4. A method for driving a display device comprising a display region and a sensor array, wherein the display region comprises a pixel array comprising a plurality of gate signal lines electrically connected to pixels, the method comprising the steps of:
   detecting proximity or contact of an object to the display region by performing a detection operation during a frame period while displaying an image; and
   supplying pulses to a part of the plurality of gate signal lines in a period during the frame period;
   wherein the detection operation is performed on an entirety of the sensor array while no pulses are supplied to the plurality of gate signal lines during the frame period,
   wherein the detection operation is not performed on the entirety of the sensor array throughout the step of supplying the pulses to the part of the plurality of gate signal lines during the frame period,
   wherein the period during the frame period is configured to change, and
   wherein the detection period during the frame period is configured to change.

5. The method for driving the display device according to claim 4, further comprising the step of supplying no pulses to the plurality of gate signal lines for a time longer than the frame period before the frame period while displaying the image.

6. The method for driving the display device according to claim 4,
   wherein the pixel array and the sensor array overlap each other.

7. The method for driving the display device according to claim 4,
   wherein a display unit comprises the pixel array, and
   wherein a sensor unit comprises the sensor array.

8. The method for driving the display device according to claim 4,
wherein the pixels each comprise a transistor comprising a metal oxide in a channel formation region.

9. A method for driving a display device comprising a display region and a sensor array, wherein the display region comprises a pixel array comprising a plurality of gate signal lines electrically connected to pixels, the method comprising the steps of:
detecting proximity or contact of an object to the display region by performing a detection operation during a frame period while displaying an image; and
supplying pulses to a part of the plurality of gate signal lines in a period during the frame period;
wherein the detection operation is performed on an entirety of the sensor array both before and after the step of supplying the pulses to the part of the plurality of gate signal lines during the frame period,
wherein the detection operation is not performed on the entirety of the sensor array throughout the step of supplying the pulses to the part of the plurality of gate signal lines during the frame period,
wherein the period during the frame period is configured to change, and
wherein the detection period during the frame period is configured to change.

10. The method for driving the display device according to claim 9, further comprising the step of supplying no pulses to the plurality of gate signal lines for a time longer than the frame period before the frame period while displaying the image.

11. The method for driving the display device according to claim 9,
wherein the pixel array and the sensor array overlap each other.

12. The method for driving the display device according to claim 9,
wherein a display unit comprises the pixel array, and
wherein a sensor unit comprises the sensor array.

13. The method for driving the display device according to claim 9,
wherein the pixels each comprise a transistor comprising a metal oxide in a channel formation region.

* * * * *